US011696485B2

(12) United States Patent
Pyon et al.

(10) Patent No.: US 11,696,485 B2
(45) Date of Patent: *Jul. 4, 2023

(54) DISPLAY DEVICE WITH DRIVING VOLTAGE LINE OVERLAPPING GATE ELECTRODE TO FORM STORAGE CAPACITOR

(71) Applicant: Samsung Display Co., Ltd., Yongin-si (KR)

(72) Inventors: Chang Soo Pyon, Seongnam-si (KR); Ok-Kyung Park, Hwaseong-si (KR); Se-Ho Kim, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 346 days.

This patent is subject to a terminal disclaimer.

(21) Appl. No.: 17/036,056

(22) Filed: Sep. 29, 2020

(65) Prior Publication Data
US 2021/0013456 A1     Jan. 14, 2021

Related U.S. Application Data

(63) Continuation of application No. 16/685,089, filed on Nov. 15, 2019, now Pat. No. 10,818,880, which is a
(Continued)

(30) Foreign Application Priority Data

Sep. 1, 2014   (KR) .................. 10-2014-0115653
Aug. 25, 2015  (KR) .................. 10-2015-0119646

(51) Int. Cl.
*H10K 71/00*   (2023.01)
*H10K 50/11*   (2023.01)
(Continued)

(52) U.S. Cl.
CPC ............. *H10K 71/00* (2023.02); *H10K 50/11* (2023.02); *H10K 50/81* (2023.02); *H10K 50/82* (2023.02);
(Continued)

(58) Field of Classification Search
CPC .... H10K 71/00; H10K 59/131; H10K 59/124; H10K 59/1216; H10K 59/123;
(Continued)

(56) References Cited

U.S. PATENT DOCUMENTS 5,929,464 A    7/1999  Yamazaki et al.
6,781,320 B2   8/2004  Park et al.
(Continued)

FOREIGN PATENT DOCUMENTS

CN    1574385      2/2005
CN    101013557    8/2007
(Continued)

OTHER PUBLICATIONS

Extended European Search Report dated Feb. 2, 2016 in corresponding European Patent Application or Patent No. 15183288.8.
(Continued)

*Primary Examiner* — Lex H Malsawma
(74) *Attorney, Agent, or Firm* — Kile Park Reed & Houtteman PLLC

(57) ABSTRACT

A display device includes a substrate, a semiconductor layer on the substrate, the semiconductor layer comprising a first semiconductor portion, a first insulating layer on the semiconductor layer, a first gate electrode on the first insulating layer and overlapping the first semiconductor portion, a scan line disposed on the first insulating layer and extending in a first direction, a second insulating layer on the first gate electrode and the scan line, a data line on the second insulating layer, and a first driving voltage line on the second
(Continued)

insulating layer. The first driving voltage line may include a first portion extending in a second direction crossing the first direction, and a second portion expanding from the first portion in the first direction. The first portion may overlap the scan line, and the second portion may overlap the first gate electrode in a plan view to form a storage capacitor.

18 Claims, 28 Drawing Sheets

Related U.S. Application Data continuation of application No. 16/274,728, filed on Feb. 13, 2019, now Pat. No. 10,505,157, which is a continuation of application No. 15/944,930, filed on Apr. 4, 2018, now Pat. No. 10,230,074, which is a continuation of application No. 14/840,686, filed on Aug. 31, 2015, now Pat. No. 9,941,489.

(51) Int. Cl.
   *H10K 50/81* (2023.01)
   *H10K 50/82* (2023.01)
   *H10K 59/123* (2023.01)
   *H10K 59/124* (2023.01)
   *H10K 59/131* (2023.01)
   *H10K 59/121* (2023.01)
   *H10K 59/12* (2023.01)

(52) U.S. Cl.
   CPC ......... *H10K 59/123* (2023.02); *H10K 59/124* (2023.02); *H10K 59/1216* (2023.02); *H10K 59/131* (2023.02); *H10K 59/121* (2023.02); *H10K 59/1201* (2023.02)

(58) Field of Classification Search
   CPC .. H10K 59/1201; H10K 59/121; H10K 50/81; H10K 50/11; H10K 50/82
   See application file for complete search history.

(56) References Cited

U.S. PATENT DOCUMENTS

| | | | |
|---|---|---|---|
| 6,909,240 B2 | 6/2005 | Osame et al. | |
| 7,445,946 B2 | 11/2008 | Yamazaki et al. | |
| 8,816,362 B2 | 8/2014 | Choi | |
| 8,928,010 B2 | 1/2015 | Yamazaki et al. | |
| 8,933,459 B2 | 1/2015 | Yoon | |
| 8,994,619 B2 | 3/2015 | Jeong | |
| 9,231,000 B2 | 1/2016 | Ko et al. | |
| 9,941,489 B2 | 4/2018 | Pyon et al. | |
| 10,230,074 B2* | 3/2019 | Pyon | H01L 27/3276 |
| 10,505,157 B2 | 12/2019 | Pyon et al. | |
| 2003/0222589 A1 | 12/2003 | Osame et al. | |
| 2008/0246026 A1 | 10/2008 | Kim | |
| 2013/0257839 A1 | 10/2013 | Hyeon et al. | |
| 2014/0027728 A1 | 1/2014 | Yoon et al. | |
| 2014/0034923 A1 | 2/2014 | Kim et al. | |
| 2014/0070184 A1 | 3/2014 | Shin | |
| 2014/0098078 A1 | 4/2014 | Jeon et al. | |
| 2014/0118232 A1 | 5/2014 | Kim | |

FOREIGN PATENT DOCUMENTS

| | | |
|---|---|---|
| CN | 103390606 | 11/2013 |
| CN | 103578426 | 2/2014 |
| EP | 1 973 162 | 9/2008 |
| EP | 2 463 849 | 6/2012 |
| GB | 2 396 735 | 6/2004 |
| JP | 2-208943 | 8/1990 |
| JP | 2001-100654 | 4/2001 |
| JP | 2003-295793 | 10/2003 |
| JP | 2004-38176 | 2/2004 |
| JP | 2005-331919 | 12/2005 |
| JP | 2006-163384 | 6/2006 |
| JP | 2007-148215 | 6/2007 |
| JP | 2007-318110 | 12/2007 |
| JP | 2008-10427 | 1/2008 |
| JP | 2013-137484 | 7/2013 |
| JP | 2014-10168 | 1/2014 |
| JP | 2014-32379 | 2/2014 |
| KR | 2001-0014476 | 2/2001 |
| KR | 2001-0014501 | 2/2001 |
| KR | 10-0297868 | 10/2001 |
| KR | 10-0642491 | 11/2006 |
| KR | 10-2006-0125634 | 12/2006 |
| KR | 10-0867926 | 11/2008 |
| KR | 10-2010-0049385 | 5/2010 |
| KR | 10-1223725 | 1/2013 |
| KR | 10-2014-0018623 | 2/2014 |
| KR | 10-2014-0057728 | 5/2014 |
| KR | 10-2014-0079093 | 6/2014 |

OTHER PUBLICATIONS

European Office Action for European Patent Application No. 15 183 288.8 dated Jun. 4, 2020.

\* cited by examiner

DISPLAY DEVICE WITH DRIVING VOLTAGE LINE OVERLAPPING GATE ELECTRODE TO FORM STORAGE CAPACITOR

CROSS-REFERENCE TO RELATED APPLICATION(S)

This is a continuation application based on U.S. patent application Ser. No. 16/685,089, filed Nov. 15, 2019, now U.S. Pat. No. 10,818,880, issued Oct. 27, 2020, the disclosure of which is incorporated herein by reference in its entirety. U.S. patent application Ser. No. 16/685,089 is a continuation application of U.S. patent application Ser. No. 16/274,728, filed Feb. 13, 2019, now U.S. Pat. No. 10,505,157, issued Dec. 10, 2019, the disclosure of which is incorporated herein by reference in its entirety. U.S. patent application Ser. No. 16/274,728 is a continuation application of U.S. patent application Ser. No. 15/944,930, filed Apr. 4, 2018, now U.S. Pat. No. 10,230,074, issued Mar. 12, 2019, the disclosure of which is incorporated herein by reference in its entirety. U.S. patent application Ser. No. 15/944,930 is a continuation application of U.S. patent application Ser. No. 14/840,686, filed Aug. 31, 2015, now U.S. Pat. No. 9,941,489, issued Apr. 10, 2018, the disclosure of which is herein incorporated by reference in its entirety. U.S. Pat. No. 9,941,489 claims priority benefit, under 35 U.S.C. § 119, of Korean Patent Application No. 10-2014-0115653, filed on Sep. 1, 2014 and Korean Patent Application No. 10-2015-0119646, filed on Aug. 25, 2015, in the Korean Intellectual Property Office, the disclosures of which are incorporated herein by reference for all purposes.

BACKGROUND

1. Field

One or more embodiments described herein relate to an organic light emitting diode display device and a manufacturing method of an organic light emitting diode display device.

2. Description of the Related Art

An organic light emitting display generates images using a plurality of pixels. Each pixel includes an organic light emitting diode, and each diode is formed from an organic emission layer between two electrodes. Electron from one electrode and holes from the other electrode are coupled in the organic emission layer to generate excitons. Light is emitted when the excitons change state.

Each pixel uses thin film transistors and capacitors to drive the organic light emitting diode. The transistors include a switching transistor and a driving transistor. In order to form the transistors and capacitors and the organic light emitting layer in each pixel, a plurality of masks are used. The cost of each mask is very expensive.

SUMMARY

In accordance with one or more embodiments, an organic light emitting diode display device, comprising a substrate, a semiconductor of a switching thin film transistor on the substrate; a semiconductor of a driving thin film transistor on the substrate and having one or more bent portions; a gate insulating layer covering the semiconductor of the switching thin film transistor and the semiconductor of the driving thin film transistor; a gate electrode of the switching thin film transistor on the gate insulating layer and overlapping the semiconductor of the switching thin film transistor; a gate electrode of the driving thin film transistor on the gate insulating layer and overlapping the semiconductor of the driving thin film transistor; an interlayer insulating layer covering the gate electrode of the switching thin film transistor and the gate electrode of the driving thin film transistor; a data line on the interlayer insulating layer and electrically connected to the semiconductor of the switching thin film transistor; and a first driving voltage line on the interlayer insulating layer, wherein the first driving voltage line includes a first portion extending in a first direction and a second portion having a larger width than the first portion in a second direction perpendicular to the first direction, and wherein the second portion overlaps the gate electrode of the driving thin film transistor with the interlayer insulating layer interposed between the second portion and the second gate electrode.

The display device may include a second driving voltage line in a different layer from the first driving voltage line and electrically connected to the first driving voltage line, wherein the second driving voltage line includes a portion substantially extending in the second direction. The second driving voltage line may be in a different layer from the data line. The second driving voltage line may be electrically connects two or more adjacent ones of the first driving voltage line to each other. The second driving voltage line may include a portion extending substantially in a direction crossing the first direction. The second driving voltage line may be in a same layer as the gate electrode of the driving thin film transistor, and may include a same material as the gate electrode of the driving thin film transistor.

The gate electrode of the driving thin film transistor may have a portion not overlapping the second portion of the first driving voltage line, and the interlayer insulating layer may include a contact hole disposed on the portion of the gate electrode of the driving thin film transistor not overlapping the second portion. The second driving voltage line may be in a same layer as a semiconductor of the driving thin film transistor and may include a same material as the semiconductor of the driving thin film transistor.

The second driving voltage line may include an expansion covering at least one of two adjacent ones of the data line and extending along the data line. Two adjacent ones of the second portion of the first driving voltage line may be connected to each other. The display device may include an insulating layer on the interlayer insulating layer, the data line, and the first driving voltage line.

The display device may include a pixel electrode on the insulating layer; an organic emission layer on the pixel electrode; and a common electrode on the organic emission layer, wherein the second driving voltage line is in a same layer as the pixel electrode and includes a same material as the pixel electrode. The semiconductor of the switching thin film transistor may be integrally formed with the semiconductor of the driving thin film transistor. The display device may include a scan line connected to the gate electrode of the switching thin film transistor, wherein the scan line is in a same layer as the gate electrode of the driving thin film transistor.

Only the interlayer insulating layer may be interposed between the second portion of the first driving voltage line and the gate electrode of the driving thin film transistor. Any other conductive layer may not be interposed between the second portion of the first driving voltage line and the gate electrode of the driving thin film transistor.

In accordance with one or more other embodiments, an organic light emitting diode display device comprises a substrate; a scan line, on the substrate, to transfer a scan signal; a data line to transfer a data voltage and a first driving voltage line to transfer a driving voltage, the first driving voltage line including a first portion extending in a direction crossing the scan line which extends in a first direction, and a second portion connected to the first portion; a switching thin film transistor including a first gate electrode connected to the scan line, a first source electrode connected to the data line, and a first drain electrode facing the first source electrode; a driving thin film transistor including a second source electrode connected to the first drain electrode, a second drain electrode facing the second source electrode, a second gate electrode, and a semiconductor; a storage capacitor including the second gate electrode of the driving thin film transistor as a first storage terminal and including the second portion of the first driving voltage line as a second storage terminal; and an organic light emitting diode electrically connected to the second drain electrode of the driving thin film transistor.

The second portion of the first driving voltage line may have a larger width than the first portion in a second direction perpendicular to the first direction. The display device may include a second driving voltage line positioned in a different layer from the first driving voltage line and electrically connected to the first driving voltage line, wherein the second driving voltage line includes a portion extending substantially in a direction crossing the first direction.

The second driving voltage line may be between the first driving voltage line and the substrate. The second driving voltage line may be in a same layer as the scan line. The second driving voltage line may be in a same layer as the semiconductor of the driving thin film transistor and may includes a same material as the semiconductor of the driving thin film transistor. The second driving voltage line may include an expansion covering at least one of two adjacent ones of the data line and extending along the data line.

The display device may include a planarization layer covering the switching thin film transistor, the driving thin film transistor, the storage capacitor, and the first driving voltage line. The organic light emitting diode may include a pixel electrode, an organic emission layer, and a common electrode disposed on the planarization layer, and the second driving voltage line is to transfer the driving voltage through a contact hole in the planarization layer. The second driving voltage line may be between the first driving voltage line and the organic emission layer. The second driving voltage line may be in a same layer as the pixel electrode with a same material. The second driving voltage line may electrically connect two or more adjacent ones of the first driving voltage line with each other. Two adjacent ones of the second portion of the first driving voltage line may be connected to each other.

In accordance with one or more other embodiments, a method for manufacturing an organic light emitting diode display device includes forming a driving semiconductor and a switching semiconductor on a substrate; forming a gate insulating layer on the driving semiconductor and the switching semiconductor; forming a driving gate electrode and a switching gate electrode on the gate insulating layer and corresponding to a channel region of the driving semiconductor and a channel region of the switching semiconductor, respectively; forming an interlayer insulating layer covering the driving gate electrode and the switching gate electrode; and forming a data line and a first driving voltage line including a first portion substantially extending in a first direction and a second portion which is wider than the first portion in a second direction perpendicular to the first direction, on the interlayer insulating layer, forming a second driving voltage line in a different layer from the first driving voltage line and electrically connected the first driving voltage line, the second driving voltage line including a portion substantially extending in the second direction, wherein the second portion of the first driving voltage line overlaps the driving gate electrode.

Forming the switching gate electrode may include forming a scan line connected to the switching gate electrode, the scan line to transfer a scan signal. The driving semiconductor layer may include a plurality of bent portions. Forming the second driving voltage line and forming the scan line may be simultaneously performed. Forming the second driving voltage line and forming the driving semiconductor may be simultaneously performed.

The method may include forming a planarization layer covering the interlayer insulating layer and the first driving voltage line; forming a pixel electrode on the planarization layer; forming an organic emission layer on the pixel electrode; and forming a common electrode on the organic emission layer, wherein forming the second driving voltage line and forming the pixel electrode are simultaneously performed. The second driving voltage line may electrically connect two or more adjacent ones of the first driving voltage line with each other.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
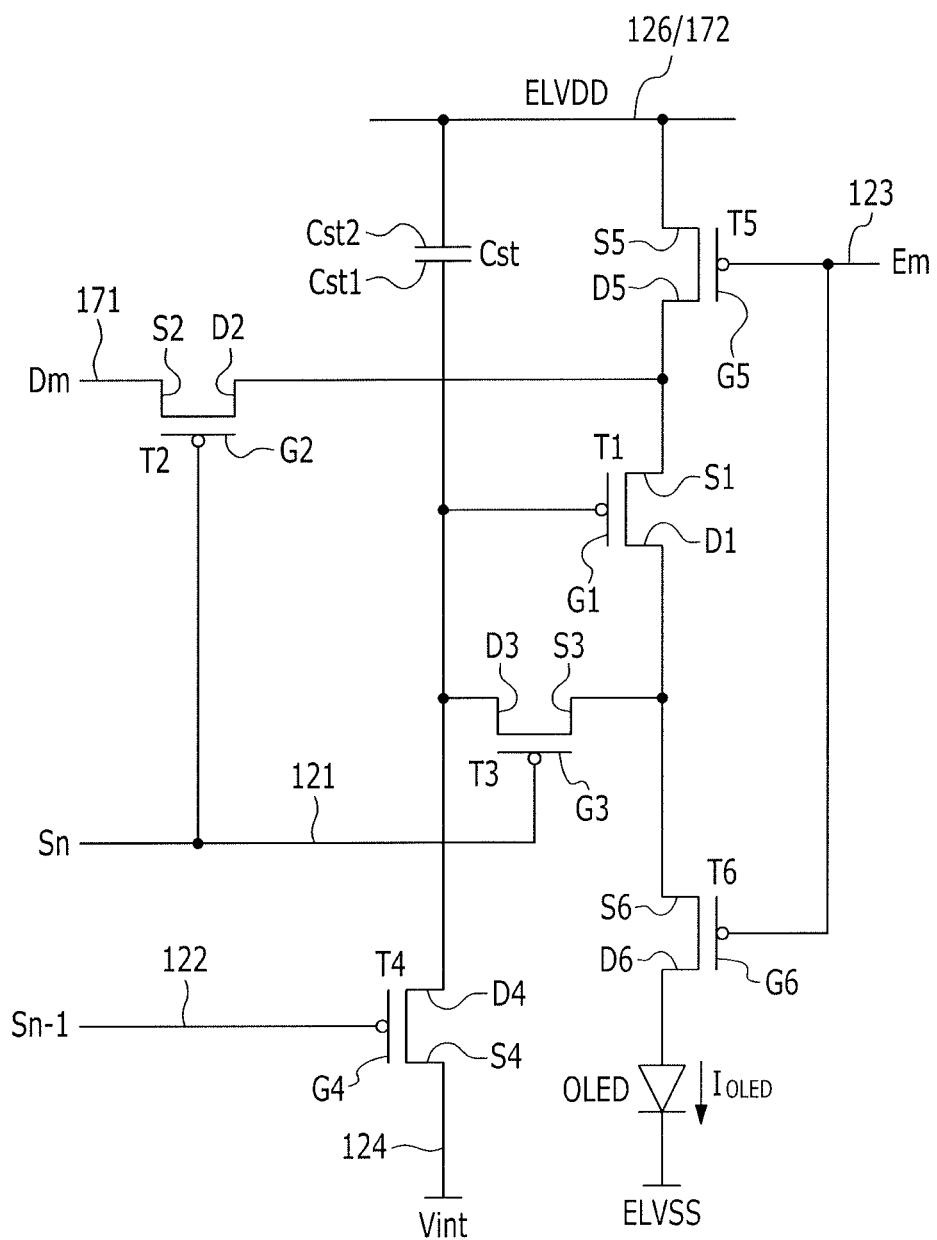
FIG. 1 illustrates an embodiment of a pixel.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
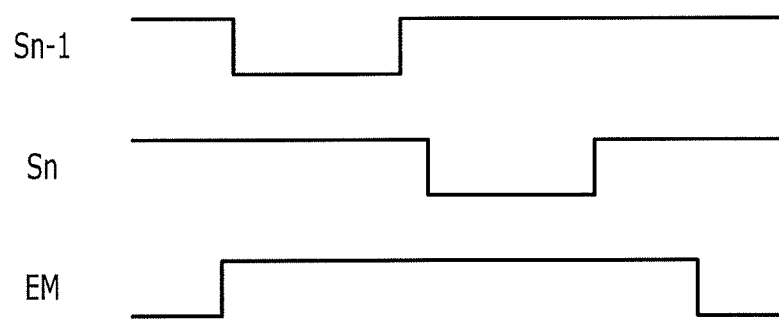
FIG. 2 illustrates an example of control signals for the pixel.

FIG. 1 illustrates an embodiment of a pixel of an organic light emitting diode display device, and FIG. 2 is a timing diagram illustrating an example of control signals for the pixel.

As illustrated in FIG. 1, the pixel includes a plurality of signal lines, a plurality of thin film transistors connected to the signal lines, a storage capacitor Cst, and an organic light emitting diode OLED. The thin film transistors include a driving thin film transistor T1, a switching thin film transistor T2, a compensation thin film transistor T3, an initialization thin film transistor T4, an operation control thin film transistor T5, and an emission control thin film transistor T6.

The signal lines include a scan line 121 transferring a scan signal Sn, a previous scan line 122 transferring a previous scan signal Sn-1 to the initialization thin film transistor T4, an emission control line 123 transferring an emission control signal Em to the operation control thin film transistor T5 and the emission control thin film transistor T6, a data line 171 crossing the scan line 121 and transferring a data signal Dm, driving voltage lines 126/172 transferring a driving voltage ELVDD, and an initialization voltage line 124 transferring an initialization voltage Vint initializing the driving thin film transistor T1. The driving voltage lines 126/172 include a first driving voltage line 126 parallel with the scan line 121 and a second driving voltage line 172 parallel with the data line 171, and the first driving voltage line 126 and the second driving voltage line 172 are electrically connected to each other.

A gate electrode G1 of the driving thin film transistor T1 is connected with one end Cst1 of the storage capacitor Cst, a source electrode S1 of the driving thin film transistor T1 is connected with the driving voltage lines 126/172 via the operation control thin film transistor T5, a drain electrode D1 of the driving thin film transistor T1 is electrically connected with an anode of the organic light emitting diode OLED via the emission control thin film transistor T6. The driving thin film transistor T1 receives the data signal Dm according to a switching operation of the switching thin film transistor T2 to supply a driving current to the organic light emitting diode OLED.

A gate electrode G2 of the switching thin film transistor T2 is connected with the scan line 121, a source electrode S2 of the switching thin film transistor T2 is connected with the data line 171, and a drain electrode D2 of the switching thin film transistor T2 is connected with the source electrode S1 of the driving thin film transistor T1 and simultaneously, connected with the driving voltage lines 126/172 via the operation control thin film transistor T5. The switching thin film transistor T2 is turned on according to the scan signal Sn received through the scan line 121 to perform a switching operation transferring the data signal Dm transferred to the data line 171 to the source electrode of the driving thin film transistor T1.

A gate electrode G3 of the compensation thin film transistor T3 is connected with the scan line 121, a source electrode S3 of the compensation thin film transistor T3 is connected with the drain electrode D1 of the driving thin film transistor T1 and simultaneously, connected with an anode of the organic light emitting diode OLED via the emission control thin film transistor T6, and a drain electrode D3 of the compensation thin film transistor T3 is connected with one end Cst1 of the storage capacitor Cst, the drain electrode D4 of the initialization thin film transistor T4, and the gate electrode G1 of the driving thin film transistor T1 together. The compensation thin film transistor T3 is turned on according to the scan signal Sn received through the scan line 121 to connect the gate electrode G1 and the drain electrode D1 of the driving thin film transistor T1 and diode-connect the driving thin film transistor T1.

A gate electrode G4 of the initialization thin film transistor T4 is connected with a previous scan line 122, a source electrode S4 of the initialization thin film transistor T4 is connected with the initialization voltage line 124, and a drain electrode D4 of the initialization thin film transistor T4 is simultaneously connected with one end Cst1 of the storage capacitor Cst, the drain electrode D3 of the compensation thin film transistor T3, and the gate electrode G1 of the driving thin film transistor T1. The initialization thin film transistor T4 is turned on according to the previous scan signal Sn-1 received through the previous scan line 122 to transfer the initialization voltage Vint to the gate electrode G1 of the driving thin film transistor T1 and then an initialization operation is performed to initialize the voltage of the gate electrode G1 of the driving thin film transistor T1.

A gate electrode G5 of the operation control thin film transistor T5 is connected with the emission control line 123, a source electrode S5 of the operation control thin film transistor T5 is connected with the driving voltage lines 126/172, and a drain electrode D5 of the operation control thin film transistor T5 is connected with the source electrode S1 of the driving thin film transistor T1 and the drain electrode D2 of the switching thin film transistor T2.

A gate electrode G6 of the emission control thin film transistor T6 is connected with the emission control line 123, a source electrode S6 of the emission control thin film transistor T6 is connected with the drain electrode D1 of the driving thin film transistor T1 and the source electrode S3 of the compensation thin film transistor T3, and a drain electrode D6 of the emission control thin film transistor T6 is electrically connected with an anode of the organic light emitting diode OLED. The operation control thin film transistor T5 and emission control thin film transistor T6 are simultaneously turned on according to the emission control signal Em received through the emission control line 123, and the driving voltage ELVDD is transferred to the organic light emitting diode OLED and thus a driving current flows in the organic light emitting diode OLED.

The other end Cst2 of the storage capacitor Cst is connected with the driving voltage lines 126/172, and a cathode of the organic light emitting diode OLED is connected with the common voltage ELVSS. As a result, the organic light emitting diode OLED receives the driving current from the driving thin film transistor T1 to emit light, thereby displaying an image.

Referring to FIG. 2, in an initializing period, the previous scan signal Sn-1 having a low level is supplied through the previous scan line 122. In this case, the emission control signal Em is already applied at a low level through the emission control line 123. Then, the initialization thin film transistor T4 is turned on based on the previous scan signal Sn−1 having the low level, the initialization voltage Vint is supplied from the initialization voltage line 124 connected to the gate electrode of the driving thin film transistor T1 through the initialization thin film transistor T4, and the driving thin film transistor T1 is initialized by the initialization voltage Vint.

Thereafter, in a data programming period, the scan signal Sn having the low level is supplied through the scan line 121. Then, the switching thin film transistor T2 and the compensation thin film transistors T3-1 and T3-2 are turned on based on the scan signal Sn having the low level. In this case, the driving thin film transistor T1 is diode-connected by the turned-on compensation thin film transistors T3-1 and T3-2, and biased in a forward direction.

Then, a compensation voltage Dm+Vth (Vth is a negative (−) value) reduced from the data signal Dm supplied from the data line 171 by a threshold voltage Vth of the driving thin film transistor T1 is applied to the gate electrode of the driving thin film transistor T1.

The driving voltage ELVDD and the compensation voltage Dm+Vth are applied to respective ends of the storage capacitor Cst, and a charge corresponding to a voltage difference between the ends is stored in the storage capacitor Cst.

Thereafter, in the emission period, the emission control signal Em supplied from the emission control line 123 is changed from the high level to the low level. Then, in the emission period, the operation control thin film transistor T5 and the emission control thin film transistor T6 are turned on by the emission control signal Em of the low level.

Then, a driving current is generated according to a voltage difference between the voltage of the gate electrode of the driving thin film transistor T1 and the driving voltage ELVDD, and a driving current IOLED is supplied to the organic light emitting diode OLED through the emission control thin film transistor T6. For the emission period, the gate-source electrode voltage Vgs of the driving thin film transistor T1 is maintained at '(Dm+Vth)−ELVDD' by the storage capacitor Cst, and according to a current-voltage relationship of the driving thin film transistor T1, the driving current 1$d$ is proportional to the square '(Dm−ELVDD)2' of a value obtained by subtracting the threshold voltage from the source-gate electrode voltage. Accordingly, the driving current IOLED is determined regardless of the threshold voltage Vth of the driving thin film transistor T1.

Figure 3:
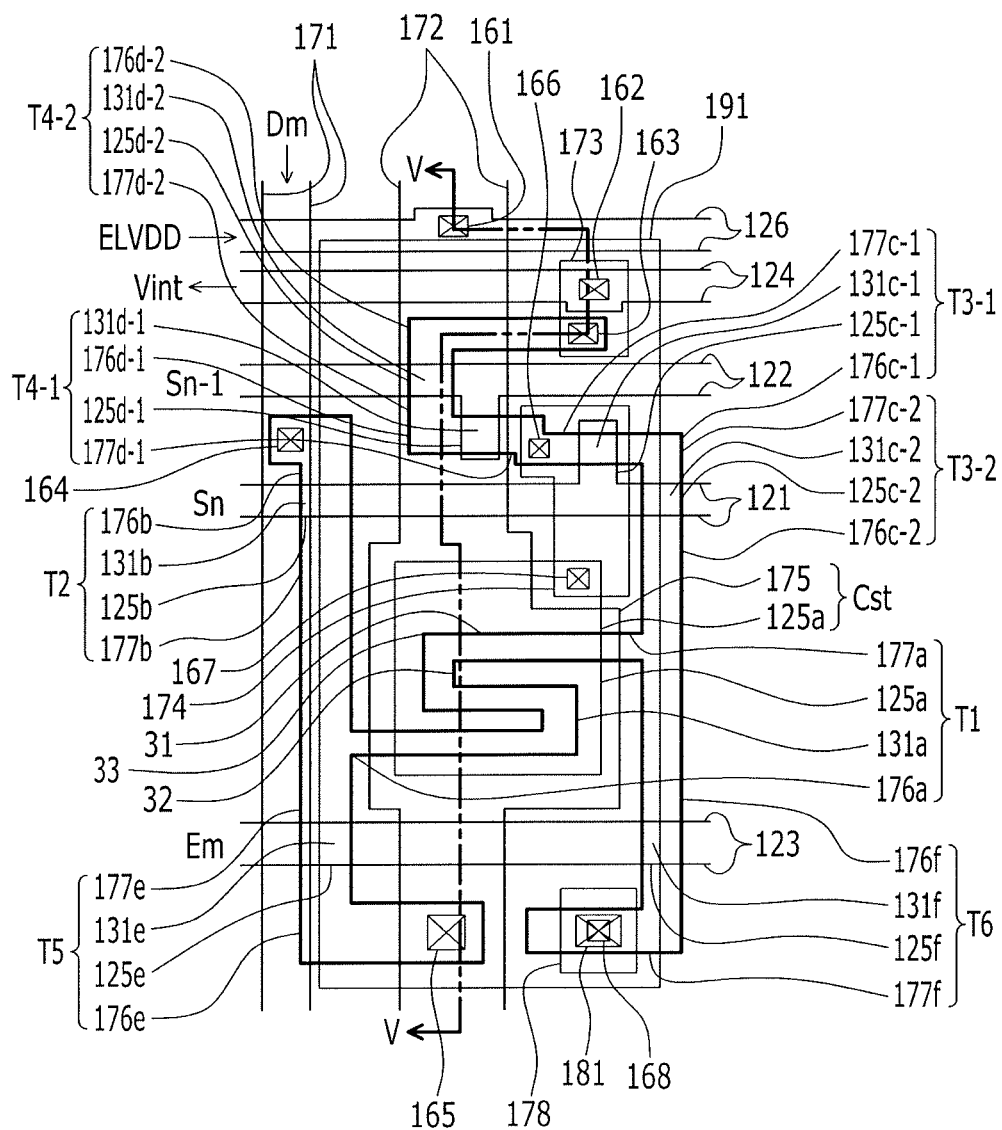
FIG. 3 illustrates a layout embodiment of the pixel.
Figure 4:
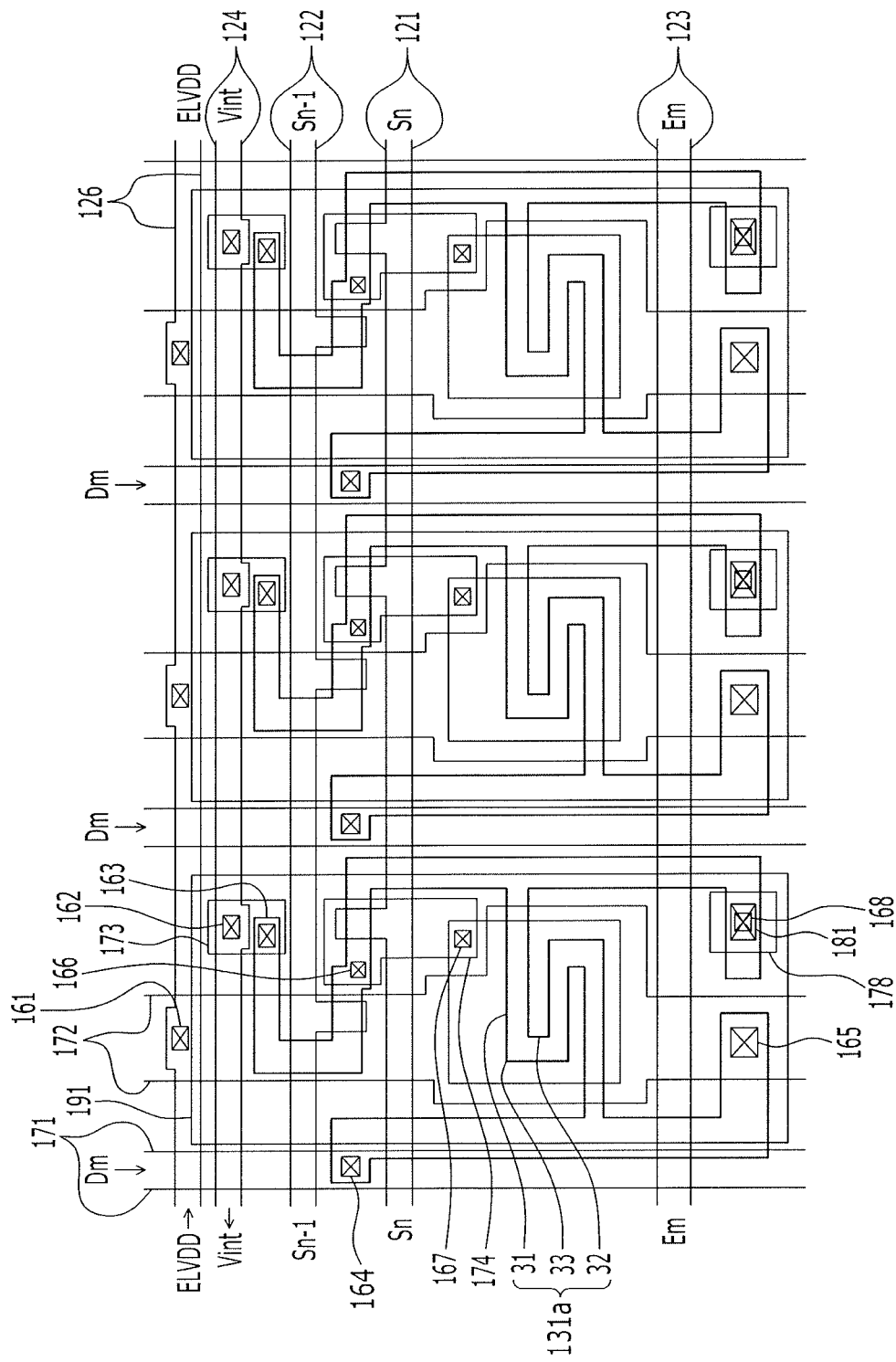
FIG. 4 illustrates a layout embodiment including three adjacent pixels.
Figure 5:
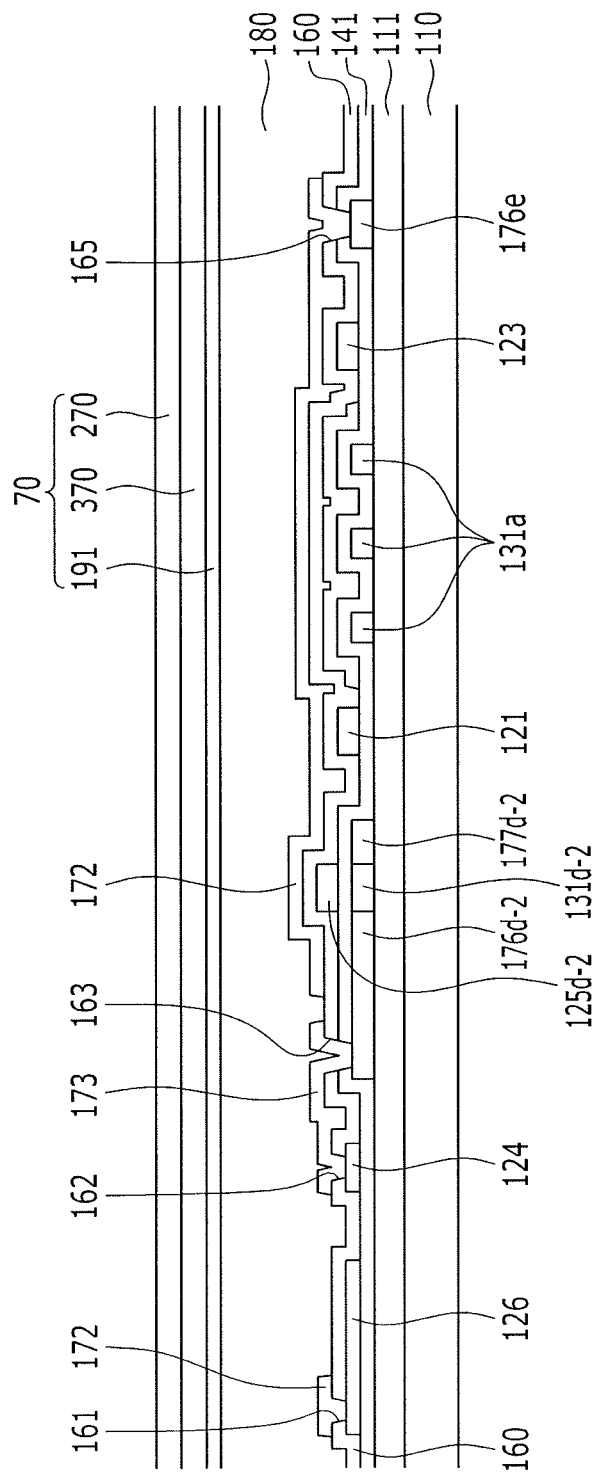
FIG. 5 illustrates a view along section line V-V in FIG. 3.
Figure 6:
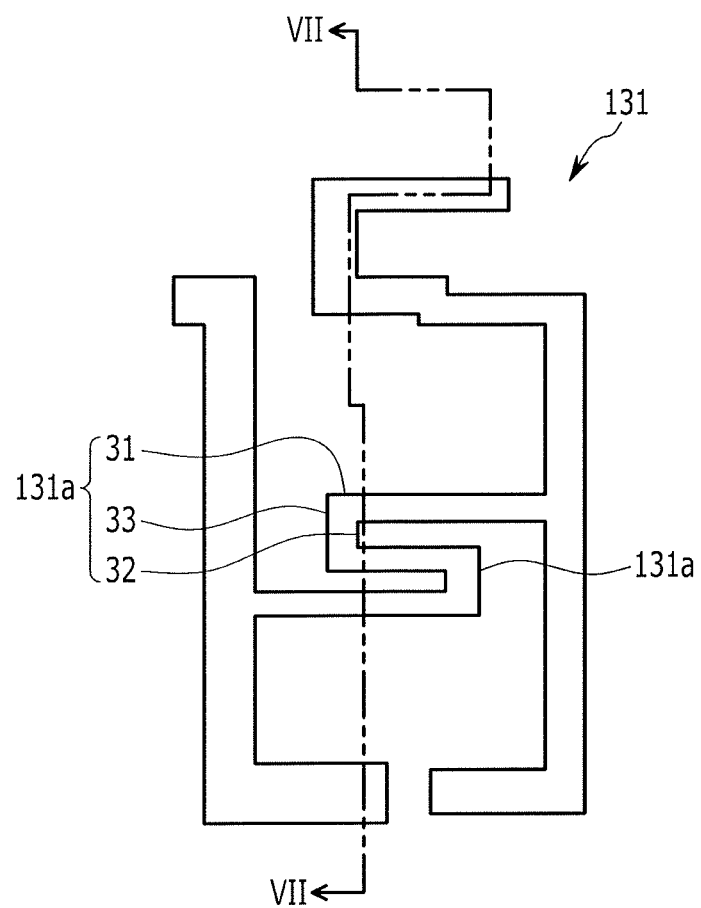
FIGS. 6 to 11 illustrate stages in one embodiment of manufacturing method.
Figure 7:
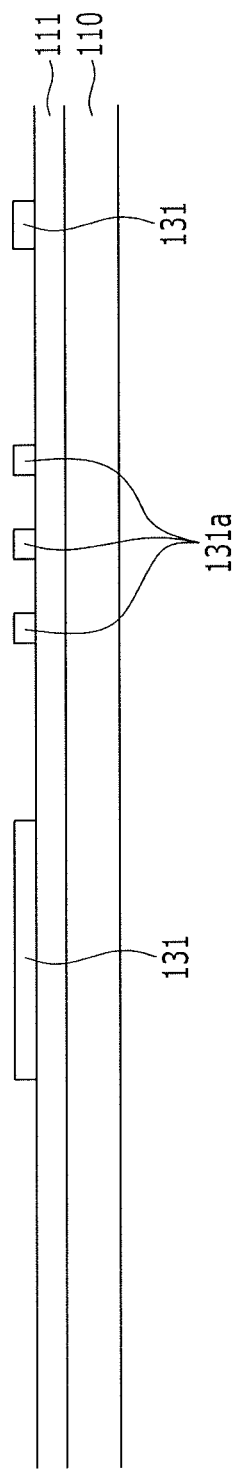

FIG. 3 illustrates a layout embodiment of the pixel, FIG. 4 illustrates a layout embodiment of three adjacent pixels, and FIG. 5 illustrates a cross-sectional view taken along section line V-V in FIG. 3.

As illustrated in FIG. 3, the pixel includes a scan line 121, a previous scan line 122, an emission control line 123, and an initialization voltage line 124 in a row direction and which respectively apply a scan signal Sn, a previous scan signal Sn−1, an emission control signal Em, and an initialization voltage Vint. The pixel also includes a data line 171 which crosses the scan line 121, the previous scan line 122, the emission control line 123, and the initialization voltage line 124 and which applies a data signal Dm to the pixel.

The pixel also includes driving voltage lines for applying the driving voltage ELVDD. The driving voltage lines include a first driving voltage line 126 parallel to the scan line 121 and a second driving voltage line 172 parallel to the data line 171. The first driving voltage line 126 and the second driving voltage line 172 are electrically connected with each other. The first driving voltage line 126 electrically connects two or more of the second driving voltage lines 172 adjacent to each other in a horizontal direction such that the driving voltage ELVDD is transmitted in the horizontal direction.

The pixel also includes a driving thin film transistor T1, a switching thin film transistor T2, compensation thin film transistors T3-1 and T3-2, initialization thin film transistors T4-1 and T4-2, an operation control thin film transistor T5, an emission control thin film transistor T6, a storage capacitor Cst, and an organic light emitting diode are formed. Referring to FIG. 3, the compensation thin film transistors T3-1 and T3-2 and the initialization thin film transistors T4-1 and T4-2 may have a dual gate structure, and hereinafter will be described as transistors connected to each other.

Channels of the driving thin film transistor T1, the switching thin film transistor T2, the compensation thin film transistors T3-1 and T3-2, the initialization thin film transistors T4-1 and T4-2, the operation control thin film transistor T5, and the emission control thin film transistor T6 are formed within one connected semiconductor 131, and the semiconductor 131 is formed to be bent in various shapes. The semiconductor 131 according to the exemplary embodiment of FIG. 3 includes vertical portions that extend in a vertical direction (a direction parallel with the data line 171) at left and right sides based on a semiconductor 131$a$ (referred to as a driving semiconductor) of the driving thin film transistor T1, and two ends of each vertical portion are bent. An additional extended portion which is bent, for example, in a '⊏' shape is included on the right vertical portion.

The semiconductor 131$a$ of the driving thin film transistor T1 has a reverse '⊐' shape (a shape in which the '⊐' shape is symmetrical based on a vertical line or a horizontal line passing through the center), most of the reverse '⊐' shape configures the semiconductor 131$a$ of the driving thin film transistor T1, and the source electrode 176$a$ and the drain electrode 177$a$ of the driving thin film transistor T1 are positioned at portions which are adjacent to the vertical portions positioned at the left and right sides, respectively. While the semiconductor 131$a$ of the driving thin film transistor T1 has the reverse '⊐' shape in the exemplary embodiment, the semiconductor 131$a$ may have a different shape in another embodiment and/or may have one or more bent portions.

Further, the semiconductor 131$a$ of the driving thin film transistor T1 includes a plurality of first extensions 31 in a first direction and a plurality of second extensions 32 in a second direction different from the first direction, and a bent portion 33 may have a structure connecting the first extensions 31 and the second extensions 32.

At the left vertical portion connected with the source electrode 176$a$ of the driving thin film transistor T1, a semiconductor 131$b$ (referred to as a switching semiconductor) of the switching thin film transistor T2 positioned above and a semiconductor 131$e$ of the operation control thin film transistor T5 positioned below are formed. Between the semiconductor 131$b$ of the switching thin film transistor T2 and the semiconductor 131$e$ of the operation control thin film transistor T5, the drain electrode 177$b$ of the switching thin film transistor T2 and the drain electrode 177$e$ of the operation control thin film transistor T5 are positioned to be connected with the source electrode 176$a$ of the driving thin film transistor T1.

The source electrode 176$b$ of the switching thin film transistor T2 is positioned above the semiconductor 131$b$ of the switching thin film transistor T2, and the source electrode 176e of the operation control thin film transistor T5 is positioned below the semiconductor 131e of the operation control thin film transistor T5.

At the right vertical portion connected with the drain electrode 177a of the driving thin film transistor T1, semiconductors 131c-1 and 131c-2 of the compensation thin film transistors T3-1 and T3-2 positioned above, and a semiconductor 131f of the emission control thin film transistor T6 positioned below are formed. Between the semiconductors 131c-1 and 131c-2 of the compensation thin film transistors T3-1 and T3-2 and the semiconductor 131f of the emission control thin film transistor T6, a source electrode 176c-2 of the second compensation thin film transistor T3-2 of the compensation thin film transistors T3-1 and T3-2 and a source electrode 176f of the emission control thin film transistor T6 are positioned to be connected with the drain electrode 177a of the driving thin film transistor T1. A structure of the compensation thin film transistors T3-1 and T3-2 will be described below in more detail.

The compensation thin film transistors T3-1 and T3-2 include a first compensation thin film transistor T3-1 and a second compensation thin film transistor T3-2, and the first compensation thin film transistor T3-1 is positioned based on a protrusion of the scan line 121, and the second compensation thin film transistor T3-2 is positioned based on a portion where the scan line 121 and the right vertical portion of the semiconductor 131 are overlapped with each other.

First, the source electrode 176c-2 of the second compensation thin film transistor T3-2 is connected with the source electrode 176f of the emission control thin film transistor T6 and the drain electrode 177a of the driving thin film transistor T1, a gate electrode 125c-2 is positioned at a portion of the scan line 121 with which the right vertical portion is overlapped, the semiconductor 131c-2 is positioned at a portion of the right vertical portion of the semiconductor 131 which overlaps the scan line 121, and a drain 177c-2 is positioned above the semiconductor 131c-2 of the right vertical portion of the semiconductor 131.

The source electrode 176c-1 of the first compensation thin film transistor T3-1 is connected with the drain 177c-2 of the second compensation thin film transistor T3-2, the gate electrode 125c-1 is positioned at the protrusion of the scan line 121, the semiconductor 131c-1 is positioned at a portion of the right vertical portion of the semiconductor 131 which overlaps the protrusion of the scan line 121, and the drain 177c-1 is positioned at an opposite side to the source electrode 176c-1 based on the semiconductor 131c-1. The first compensation thin film transistor T3-1 is positioned at a portion which is additionally extended in a '⊏' shape from the right vertical portion of the semiconductor 131.

The drain electrode 177f of the emission control thin film transistor T6 is positioned below the semiconductor 131f of the emission control thin film transistor T6. Semiconductors 131d-1 and 131d-2 of the initialization thin film transistors T4-1 and T4-2 are further formed at the '⊏'-shaped additional extension which is additionally extended above the semiconductor 131c-2 and the drain electrode 177c-1 of the second compensation thin film transistor T3-2. Between the semiconductor 131d-1 of the first initialization thin film transistor T4-1 and the drain electrode 177c-1 of the first compensation thin film transistor T3-1, the drain electrode 177d-1 of the first initialization thin film transistor T4-1 is positioned, and the source electrode 176d-2 of the second initialization thin film transistor T4-2 is positioned at an end of the '⊏'-shaped portion which is additionally extended. A structure of the initialization thin film transistors T4-1 and T4-2 will be described below in more detail.

The initialization thin film transistors T4-1 and T4-2 include a first initialization thin film transistor T4-1 and a second initialization thin film transistor T4-2, and the first initialization thin film transistor T4-1 is positioned based on a protrusion of the previous scan line 122, and the second initialization thin film transistor T4-2 is positioned based on a portion where the previous scan line 122 and the '⊏'-shaped portion of the semiconductor 131 are overlapped with each other.

First, the source electrode 176d-1 of the first initialization thin film transistor T4-1 is connected with the drain electrode 177c-1 of the first compensation thin film transistor T3-1, the gate electrode 125d-1 is positioned at the portion of the previous scan line 122 with which the '⊏'-shaped portion of the semiconductor 131 is overlapped, the semiconductor 131d-1 is positioned at a portion of the '⊏'-shaped portion of the semiconductor 131 which overlaps the protrusion of the previous scan line 122, and the drain 177d-1 is positioned at an opposite side to the source electrode 176d-1 based on the semiconductor 131d-1.

The source electrode 176d-2 of the second initialization thin film transistor T4-2 is connected with the drain 177d-1 of the first initialization thin film transistor T4-1, the gate electrode 125d-2 is positioned at the portion of the previous scan line 122 with which the '⊏'-shaped portion of the semiconductor 131 is overlapped, the semiconductor 131d-2 is positioned at a portion of the '⊏'-shaped portion of the semiconductor 131 which overlaps the previous scan line 122, and the drain 177d-2 is positioned at an end of the '⊏'-shaped portion of the semiconductor 131, as an opposite side to the source electrode 176d-2 based on the semiconductor 131d-2.

The semiconductor 131 may have a different structure in another embodiment. The semiconductor 131 may be formed, for example, to include a polycrystalline semiconductor material. The source electrode/drain electrodes in the semiconductor 131 may be formed by doping only the corresponding region. Further, in the semiconductor 131, a region between a source electrode and a drain electrode of different transistors is doped. Thus, the source electrode and the drain electrode may be electrically connected to each other.

The semiconductor 131 is formed on an insulation substrate 110, and a buffer layer 111 may be positioned between the insulation substrate 110 and the semiconductor 131. The buffer layer 111 may serve to improve a characteristic of the polycrystalline semiconductor by blocking impurities from the insulation substrate 110 during a crystallization process in order to form the polycrystalline semiconductor and to reduce stress applied to the insulation substrate 110.

A gate insulating layer 141 covering the semiconductor 131 is formed on the semiconductor 131. The gate insulating layer 141 may be formed by an inorganic insulating layer.

A scan line 121, a previous scan line 122, an emission control line 123, an initialization voltage line 124, a first driving voltage line 126, and a gate electrode 125a of the driving thin film transistor T1 which are formed in a row direction are formed on the gate insulating layer 141.

The scan line 121 and the previous scan line 122 have protrusions, respectively, and the protrusion of the scan line 121 protrudes toward the previous scan line 122, and the protrusion of the previous scan line 122 protrudes toward the scan line 121.

First, the protrusion of the scan line 121 protrudes in an upward direction of the scan line 121, overlaps the semiconductor 131c-1 of the first compensation thin film transistor T3-1, and configures the gate electrode 125c-1 of the first compensation thin film transistor T3-1. The source electrode 176c-1 and the drain electrode 177c-1 of the first compensation thin film transistor T3-1 are not overlapped with the gate electrode 125c-1 of the first compensation thin film transistor T3-1.

The protrusion of the previous scan line 122 protrudes in a downward direction of the previous scan line 122, overlaps the semiconductor 131d-1 of the first initialization thin film transistor T4-1, and configures the gate electrode 125d-1 of the initialization thin film transistor T4-1. The source electrode 176d-1 and the drain electrode 177d-1 of the first initialization thin film transistor T4-1 are not overlapped with the gate electrode 125d-1 of the first initialization thin film transistor T4-1.

The emission control line 123 is positioned below the scan line 121, and the emission control line 123 overlaps the left vertical portion and the right vertical portion, respectively. The emission control line 123 overlaps the semiconductor 131e of the operation control thin film transistor T5 of the left vertical portion of the semiconductor 131, but not overlapped with the source electrode 176e and the drain electrode 177e of the operation control thin film transistor T5. Further, the emission control line 123 overlaps the semiconductor 131f of the emission control thin film transistor T6 of the right vertical portion of the semiconductor 131, but not overlapped with the source electrode 176f and the drain electrode 177f of the emission control thin film transistor T6.

The initialization voltage line 124 is positioned above the previous scan line 122, and the initialization voltage line 124 has a partially expanded region. The expanded region of the initialization voltage line 124 is to be expanded in order to easily contact another wire.

The first driving voltage line 126 is positioned above the initialization voltage line 124, and the first driving voltage line 126 also has a partially expanded region to easily contact another wire.

The initialization voltage line 124 and the first driving voltage line 126 are not overlapped with the semiconductor 131.

The gate electrode 125a (also referred to as a driving gate electrode) of the driving thin film transistor T1 is formed in a quadrangular shape, and overlapped with the reverse '⊇'-shaped portion of the semiconductor 131, that is, the semiconductor 131a of the driving thin film transistor T1. The source electrode 176a and the drain electrode 177a of the driving thin film transistor T1 are not overlapped with the gate electrode 125a of the driving thin film transistor T1.

An interlayer insulating layer 160 is covered on the scan line 121, the previous scan line 122, the emission control line 123, the initialization voltage line 124, the first driving voltage line 126 (referred to as a horizontal driving voltage line), the gate electrode 125a of the driving thin film transistor T1, and the exposed gate insulating layer 141. The interlayer insulating layer 160 may be formed by an inorganic insulating layer.

A plurality of contact holes 161, 162, 163, 164, 165, 166, 167, and 168 is formed in the interlayer insulating layer 160. The first contact hole 161 exposes the expanded region of the first driving voltage line 126, the second contact hole 162 exposes the expanded region of the initialization voltage line 124, and the third contact hole 163 exposes the end (the source electrode 176d-2 of the second initialization thin film transistor T4-2) of the additionally extended '⊏'-shaped portion of the semiconductor 131. The fourth contact hole 164 exposes the upper end (the source electrode 176b of the switching thin film transistor T2) of the left vertical portion of the semiconductor 131, the fifth contact hole 165 exposes the lower end (the source electrode 176e of the operation control thin film transistor T5) of the left vertical portion of the semiconductor 131, the sixth contact hole 166 exposes the drain electrode 177c-1 of the first compensation thin film transistor T3-1 which is a part of the '⊏'-shaped portion which is additionally extended from the right vertical portion of the semiconductor 131. The seventh contact hole 167 exposes a partial region of the gate electrode 125a of the driving thin film transistor T1, and the eighth contact hole 168 exposes the lower end (the drain electrode 177f of the emission control thin film transistor T6) of the right vertical portion of the semiconductor 131.

A data line 171, a second driving voltage line 172 having an expanded region 175, a first connection part 173, a second connection part 174, and a third connection part 178 are formed on the interlayer insulating layer 160.

The data line 171 passes through the fourth contact hole 164 to be extended in a vertical direction, and is connected with the source electrode 176b of the switching thin film transistor T2 through the fourth contact hole 164. As a result, a data voltage flowing in the data line 171 is transferred to the source electrode 176b of the switching thin film transistor T2.

The second driving voltage line 172 (referred to as a vertical driving voltage line) is extended in the vertical direction, and connected with the first driving voltage line 126 through the first contact hole 161. The first driving voltage line 126 transfers the driving voltage ELVDD in a horizontal direction, and the second driving voltage line 172 transfers driving voltage ELVDD in a vertical direction. The second driving voltage line 172 has the expanded region 175, and one expanded region 175 is formed for each pixel. The expanded region 175 of the second driving voltage line 172 configures the second electrode 175 of the storage capacitor Cst. The driving voltage ELVDD is applied to the second electrode 175 of the storage capacitor Cst. The second electrode 175 of the storage capacitor Cst overlaps the gate electrode 125a of the driving thin film transistor T1 and the semiconductor 131a of the driving thin film transistor T1 having the reverse '⊇' shape. The storage capacitor Cst includes the gate electrode 125a of the driving thin film transistor T1, the second electrode 175 of the storage capacitor Cst, and the interlayer insulating layer 160 therebetween.

According to the above structure of the second driving voltage line 172, since the second driving voltage line 172 and the second electrode 175 of the storage capacitor Cst are simultaneously formed with the same material, the electrode of the storage capacitor Cst does not need to be formed on a separate layer, and as a result, the number of masks used during manufacturing is decreased. When a unit price of the mask is considered, manufacturing costs are reduced and the manufacturing time is shortened.

According to the present exemplary embodiment, only one type of interlayer insulating layer 160 may be provided between the expanded region 175 (also, referred to as the second electrode 175) of the second driving voltage line 172 and the gate electrode 125a of the driving thin film transistor T1, and no additional conductive layer may be provided between a layer where the expanded region 175 is located and a layer where the gate electrode 125a of the driving thin film transistor T1 is located.

The first connection part 173 connects the initialization voltage line 124 and the source electrode 176d-2 of the second initialization thin film transistor T4-2 through the second contact hole 162 and the third contact hole 163. As a result, since the initialization voltage Vint is applied to the source electrode 176d-2 of the second initialization thin film transistor T4-2 and the first and second initialization thin film transistors T4-1 and T4-2 may be shown as one thin film transistor having the dual gate structure, it may be understood that the initialization voltage Vint is applied to the source electrode of the initialization thin film transistor T4.

The second connection part 174 connects the drain electrode 177c-1 of the first compensation thin film transistor T3-1 and the gate electrode 125a of the driving thin film transistor T1 through the sixth contact hole 166 and the seventh contact hole 167. As a result, the voltage of the drain electrode 177c-1 of the first compensation thin film transistor T3-1 is applied to the gate electrode 125a of the driving thin film transistor T1. A part of the gate electrode 125a of the driving thin film transistor T1 has an exposed region which is not overlapped with the expanded region of the second driving voltage line 172, and the exposed region is connected with the drain electrode 177c-1 of the first compensation thin film transistor T3-1 through the second connection part 174.

The third connection part 178 is formed on the eighth contact hole 168 to be connected with the drain electrode 177f of the emission control thin film transistor T6. A planarization layer 180 is positioned on the third connection part 178. A first upper contact hole 181 is included in the planarization layer 180 to expose the third connection part 178. A pixel electrode 191 is positioned on the planarization layer 180, and the pixel electrode 191 and the third connection part 178 are connected to each other through the first upper contact hole 181 of the planarization layer. As a result, the pixel electrode 191 is connected with the drain electrode 177f of the emission control thin film transistor T6. An organic emission layer 370 is positioned on the pixel electrode 191, and a common electrode 270 is positioned thereon. The pixel electrode 191, the organic emission layer 370, and the common electrode 270 configure an organic light emitting diode 70, and the pixel electrode 191 is an anode of the organic light emitting diode 70.

The driving thin film transistor T1 includes 125a, 131a, 176a, and 177a, the switching thin film transistor T2 is constituted by 125b, 131b, 176b, and 177b, the compensation thin film transistors T3-1 and T3-2 include 125c-1, 131c-1, 176c-1, and 177c-1, and 125c-2, 131c-2, 176c-2, and 177c-2, respectively, the initialization thin film transistors T4-1 and T4-2 include 125d-1, 131d-1, 176d-1, and 177d-1, and 125d-2, 131d-2, 176d-2, and 177d-2, respectively, the operation control thin film transistor T5 include 125e, 131e, 176e, and 177e, and the emission control thin film transistor T6 includes 125f, 131f, 176f, and 177f. Further, the storage capacitor Cst includes 125a and 175. In the semiconductor of each transistor, a channel region is formed at the portion which overlaps the gate electrode of each transistor.

FIGS. 6 to 11 illustrate the order of stages of an embodiment of a manufacturing method for an organic light emitting diode display device, which, for example, may be the device in FIG. 3. First, the organic light emitting diode display device in which only the semiconductor 131 is formed will be described with reference to FIGS. 6 and 7.

The buffer layer 111 protecting the insulation substrate 110 is formed on the insulation substrate 110. The buffer layer 111 may serve to not only protect the insulation substrate 110, but also prevent the impurity from flowing from the insulation substrate 110 to the semiconductor 131 when crystallizing the semiconductor 131.

After, amorphous silicon is entirely formed on the buffer layer 111, and a polycrystalline semiconductor layer is formed by crystallizing the amorphous silicon. Thereafter, the polycrystalline semiconductor layer is etched as the semiconductor 131 having the shape in FIG. 6 on the polycrystalline semiconductor layer using a first mask.

The semiconductor 131 includes vertical portions which are extended in a vertical direction at left and right sides based on the semiconductor 131a of the driving thin film transistor T1 having the reverse 'ᄅ' shape, and two ends of each vertical portion is bent. Further, a portion which is additionally extended to be bent in a '⊏' shape is on the right vertical portion. The semiconductor 131 is not doped. As a result, the semiconductor 131 is not divided into the semiconductor, the source electrode, and the drain electrode configuring each transistor.

Figure 8:
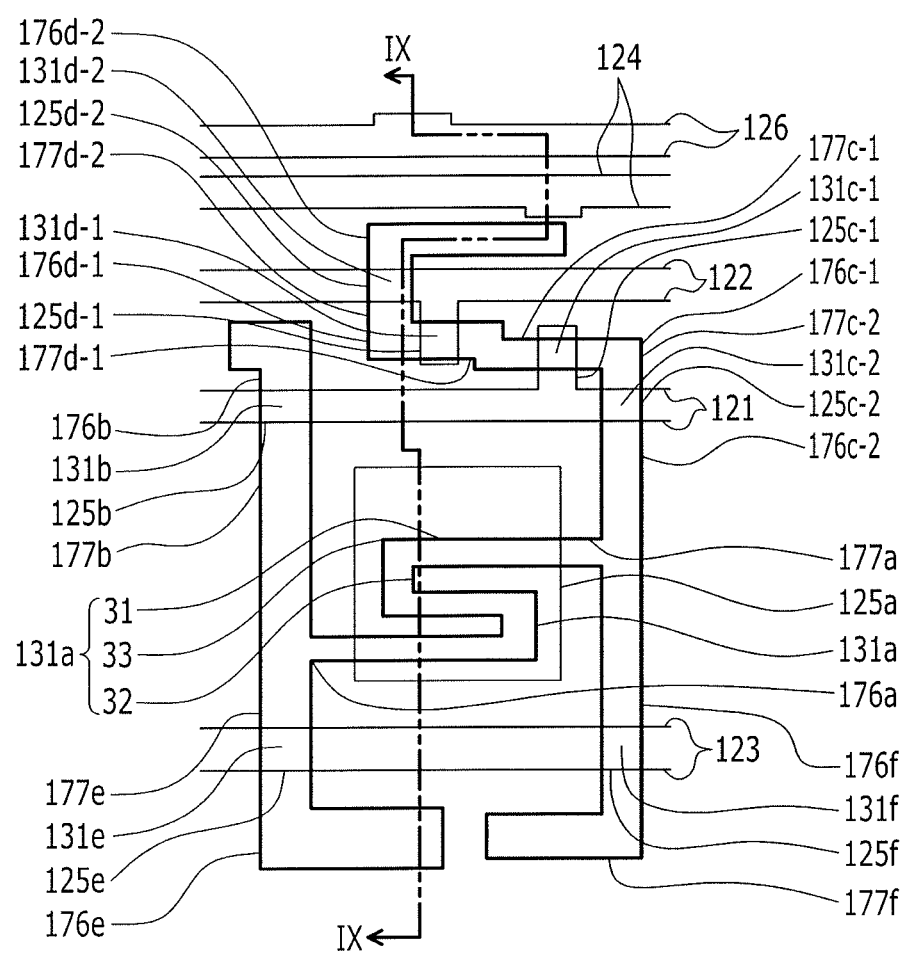
Figure 9:
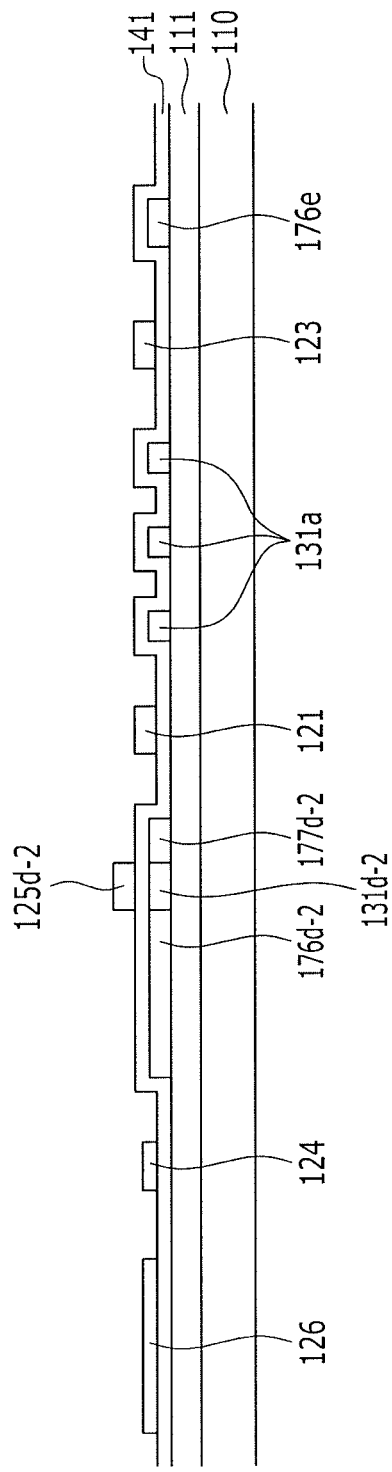

Thereafter, as illustrated in FIGS. 8 and 9, the gate insulating layer 141 is covered on the semiconductor 131, and a conductor for a gate is laminated on the gate insulating layer 141, and then etched by using a second mask. As a result, a scan line 121, a previous scan line 122, an emission control line 123, an initialization voltage line 124, a first driving voltage line 126, and a gate electrode 125a of the driving thin film transistor T1 are formed. The scan line 121, the previous scan line 122, the emission control line 123, the initialization voltage line 124, and the first driving voltage line 126 are parallel to each other. Further, on the scan line 121 and the previous scan line 122, protrusions are formed, respectively.

Thereafter, the semiconductor 131 is doped. The semiconductor 131 is doped in an exposed region, except for a portion covered by the scan line 121 having the protrusion, the previous scan line 122 having the protrusion, the emission control line 123, the initialization voltage line 124, the first driving voltage line 126, and the gate electrode 125a of the driving thin film transistor T1. As a result, the source electrode and the drain electrode of each transistor are formed. A semiconductor serving as a channel in each transistor is formed in a region which is covered by the semiconductor 131 and not doped. Thus, when the semiconductor 131 is doped, a separate mask is not required.

The semiconductor 131, when doped, may have the following structure. The semiconductor 131a of the driving thin film transistor T1 has a reverse '⊏' shape, and a source electrode 176a and a drain electrode 177a of the driving thin film transistor T1 are positioned at portions adjacent to the vertical portions positioned at the left and right sides, respectively. The semiconductor 131a of the driving thin film transistor T1 has the reverse 'ᄅ' shape in the exemplary embodiment, but may have various shapes, and it is sufficient to have a structure including one or more bent portions.

Further, the semiconductor 131a of the driving thin film transistor T1 includes a plurality of first extensions 31 in a first direction and a plurality of second extensions 32 in a second direction different from the first direction, and a bent portion 33 may have a structure connecting the first extensions 31 and the second extensions 32.

At the left vertical portion connected with the source electrode 176a of the driving thin film transistor T1, a semiconductor 131b of the switching thin film transistor T2 positioned above and a semiconductor 131e of the operation control thin film transistor T5 positioned below are formed. Between the semiconductor 131b of the switching thin film transistor T2 and the semiconductor 131e of the operation control thin film transistor T5, the drain electrode 177b of the switching thin film transistor T2 and the drain electrode 177e of the operation control thin film transistor T5 are positioned to be connected with the source electrode 176a of the driving thin film transistor T1.

The source electrode 176b of the switching thin film transistor T2 is positioned above the semiconductor 131b of the switching thin film transistor T2, and the source electrode 176e of the operation control thin film transistor T5 is positioned below the semiconductor 131e of the operation control thin film transistor T5.

At the right vertical portion connected with the drain electrode 177a of the driving thin film transistor T1, semiconductors 131c-1 and 131c-2 of the compensation thin film transistors T3-1 and T3-2 positioned above, and a semiconductor 131f of the emission control thin film transistor T6 positioned below are formed. Between the semiconductors 131c-1 and 131c-2 of the compensation thin film transistors T3-1 and T3-2 and the semiconductor 131f of the emission control thin film transistor T6, a source electrode 176c-2 of the second compensation thin film transistor T3-2 of the compensation thin film transistors T3-1 and T3-2 and a source electrode 176f of the emission control thin film transistor T6 are positioned to be connected with the drain electrode 177a of the driving thin film transistor T1. A structure of the compensation thin film transistors T3-1 and T3-2 will be described below in more detail.

The compensation thin film transistors T3-1 and T3-2 include a first compensation thin film transistor T3-1 and a second compensation thin film transistor T3-2, and the first compensation thin film transistor T3-1 is positioned based on a protrusion of the scan line 121, and the second compensation thin film transistor T3-2 is positioned based on a portion where the scan line 121 and the right vertical portion of the semiconductor 131 are overlapped with each other.

First, the source electrode 176c-2 of the second compensation thin film transistor T3-2 is connected with the source electrode 176f of the emission control thin film transistor T6 and the drain electrode 177a of the driving thin film transistor T1, a gate electrode 125c-2 is positioned at a portion of the scan line 121 with which the right vertical portion of the semiconductor 31 is overlapped, the semiconductor 131c-2 is positioned at a portion of the right vertical portion of the semiconductor 131 which overlaps the scan line, and a drain 177c-2 is positioned above the semiconductor 131c-2 of the right vertical portion of the semiconductor 131.

The source electrode 176c-1 of the first compensation thin film transistor T3-1 is connected with the drain 177c-2 of the second compensation thin film transistor T3-2, the gate electrode 125c-1 is positioned at the protrusion of the scan line 121, the semiconductor 131c-1 is positioned at a portion of the right vertical portion of the semiconductor 131 which overlaps the protrusion of the scan line 121, and the drain 177c-1 is positioned at an opposite side to the source electrode 176c-1 based on the semiconductor 131c-1. The first compensation thin film transistor T3-1 is positioned at a portion which is additionally extended in a '⊏' shape from the right vertical portion of the semiconductor 131 in the exemplary embodiment.

The drain electrode 177f of the emission control thin film transistor T6 is positioned below the semiconductor 131f of the emission control thin film transistor T6, and semiconductors 131d-1 and 131d-2 of initialization thin film transistors T4-1 and T4-2 are further formed at the '⊏'-shaped extension which is additionally extended above the semiconductor 131c-2 and the drain electrode 177c-1 of the second compensation thin film transistor T3-2. Between the semiconductor 131d-1 of the first initialization thin film transistor T4-1 and the drain electrode 177c-1 of the first compensation thin film transistor T3-1, the drain electrode 177d-1 of the first initialization thin film transistor T4-1 is positioned, and the source electrode 176d-2 of the second initialization thin film transistor T4-2 is positioned at an end of the '⊏'-shaped portion which is additionally extended. A structure of the initialization thin film transistors T4-1 and T4-2 will be described below in more detail.

The initialization thin film transistors T4-1 and T4-2 include a first initialization thin film transistor T4-1 and a second initialization thin film transistor T4-2, and the first initialization thin film transistor T4-1 is positioned based on a protrusion of the previous scan line 122, and the second initialization thin film transistor T4-2 is positioned based on a portion where the previous scan line 122 and the '⊏'-shaped portion of the semiconductor 131 are overlapped with each other.

First, the source electrode 176d-1 of the first initialization thin film transistor T4-1 is connected with the drain electrode 177c-1 of the first compensation thin film transistor T3-1, the gate electrode 125d-1 is positioned at the portion of the previous scan line 122 with which the '⊏'-shaped portion of the semiconductor 131 is overlapped, the semiconductor 131d-1 is positioned at a portion of the '⊏'-shaped portion of the semiconductor 131 which overlaps the protrusion of the previous scan line 122, and the drain 177d-1 is positioned at an opposite side to the source electrode 176d-1 based on the semiconductor 131d-1.

The source electrode 176d-2 of the second initialization thin film transistor T4-2 is connected with the drain 177d-1 of the first initialization thin film transistor T4-1, the gate electrode 125d-2 is positioned at the portion of the previous scan line 122 with which the '⊏'-shaped portion of the semiconductor 131 is overlapped, the semiconductor 131d-2 is positioned at a portion of the '⊏'-shaped portion of the semiconductor 131 which overlaps the previous scan line 122, and the drain 177d-2 is positioned at an end of the '⊏'-shaped portion of the semiconductor 131, as an opposite side to the source electrode 176d-2 based on the semiconductor 131d-2.

Figure 10:
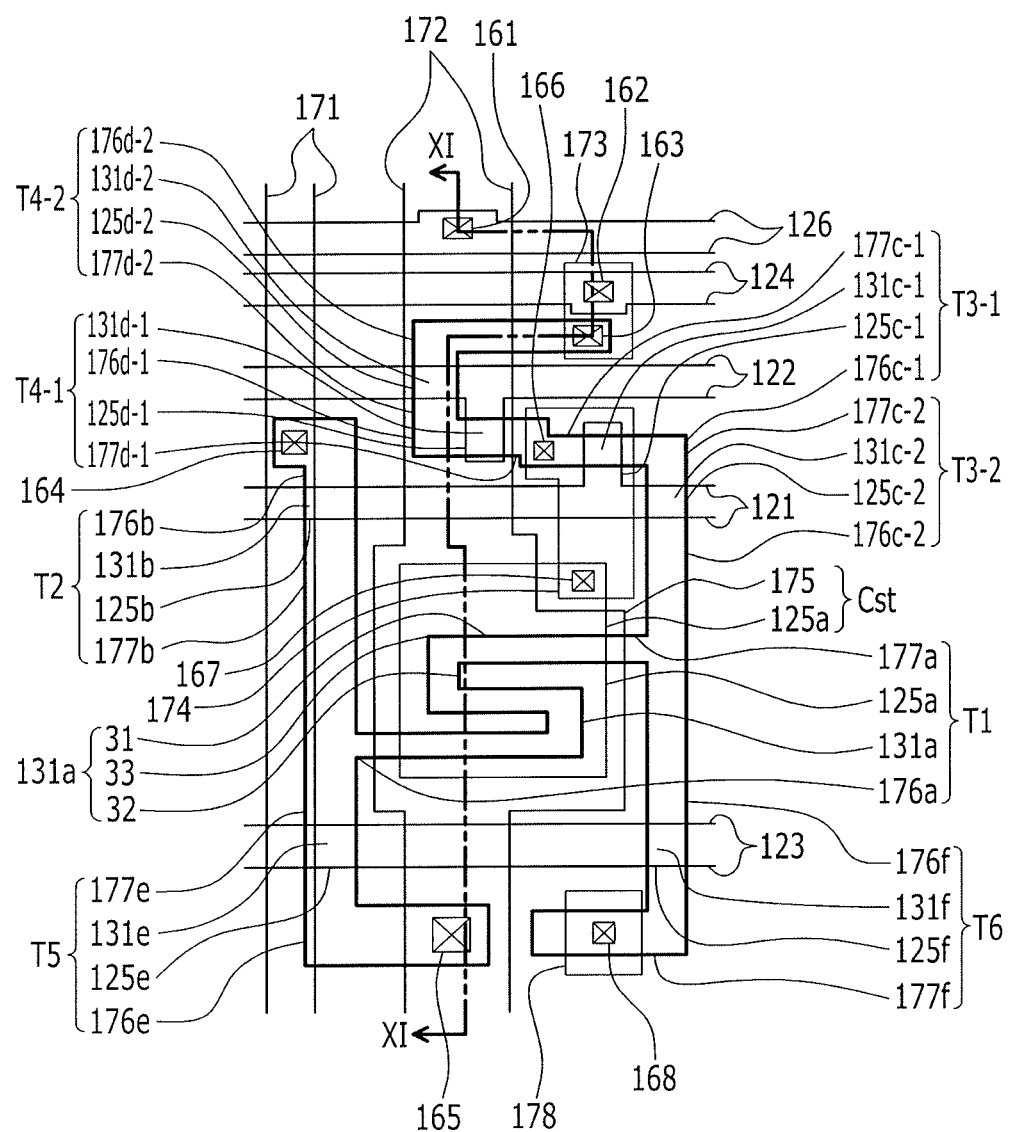
Figure 11:
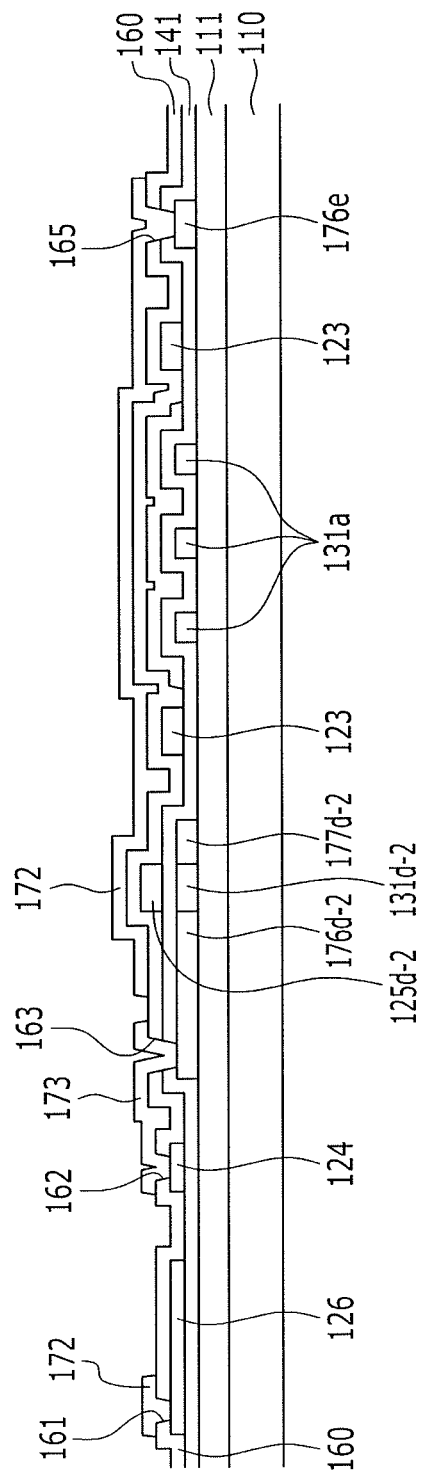

Thereafter, as illustrated in FIGS. 10 and 11, after the interlayer insulating layer 160 is covered, a plurality of contact holes 161, 162, 163, 164, 165, 166, 167, and 168 is formed in the interlayer insulating layer 160 by using a third mask. Thereafter, a conductor for data is laminated on the interlayer insulating layer 160 and then etched by using a fourth mask. As a result, a data line 171, a second driving voltage line 172 having an expanded region 175, a first connection part 173, a second connection part 174, and a third connection part 178 are formed.

The data line 171 passes through the fourth contact hole 164 to be extended in a vertical direction, and is connected with the source electrode 176b of the switching thin film transistor T2 through the fourth contact hole 164. As a result, a data voltage flowing in the data line 171 is transferred to the source electrode 176b of the switching thin film transistor T2.

The second driving voltage line 172 is extended in the vertical direction, and connected with the first driving voltage line 126 through the first contact hole 161. The first driving voltage line 126 transfers the driving voltage ELVDD in a horizontal direction, and the second driving voltage line 172 transfers driving voltage ELVDD in a vertical direction. The second driving voltage line 172 has the expanded region, and one expanded region is formed for each pixel. The expanded region of the second driving voltage line 172 configures the second electrode 175 of the storage capacitor Cst. The driving voltage ELVDD is applied to the second electrode 175 of the storage capacitor Cst. The second electrode 175 of the storage capacitor Cst overlaps the gate electrode 125a of the thin film transistor T1 and the semiconductor 131a of the driving thin film transistor T1 having the reverse 'ㄹ' shape. The storage capacitor Cst is constituted by the gate electrode 125a of the thin film transistor T1, the second electrode 175 of the storage capacitor Cst, and the interlayer insulating layer 160 therebetween.

The first connection part 173 connects the initialization voltage line 124 and the source electrode 176d-2 of the second initialization thin film transistor T4-2 through the second contact hole 162 and the third contact hole 163. As a result, since the initialization voltage Vint is applied to the source electrode 176d-2 of the second initialization thin film transistor T4-2 and the first and second initialization thin film transistors T4-1 and T4-2 may be shown as one thin film transistor having the dual gate structure, it may be understood that the initialization voltage Vint is applied to the source electrode of the initialization thin film transistor T4.

The second connection part 174 connects the drain electrode 177c-1 of the first compensation thin film transistor T3-1 and the gate electrode 125a of the thin film transistor T1 through the sixth contact hole 166 and the seventh contact hole 167. As a result, the voltage of the drain electrode 177c-1 of the first compensation thin film transistor T3-1 is applied to the gate electrode 125a of the driving thin film transistor T1. A part of the gate electrode 125a of the driving thin film transistor T1 has an exposed region which is not overlapped with the expanded region of the second driving voltage line 172, and the exposed region is connected with the drain electrode 177c-1 of the first compensation thin film transistor T3-1 through the second connection part 174.

The third connection part 178 is formed on the eighth contact hole 168 to be connected with the drain electrode 177f of the emission control thin film transistor T6.

Thereafter, referring back to FIG. 5, the planarization layer 180 covering the data line 171, the second driving voltage line 172 having the expanded region 175, the first connection part 173, the second connection part 174, and the third connection part 178 are laminated. Thereafter, the first upper contact hole 181 exposing the third connection part 178 is formed by using a fifth mask. Thereafter, on the planarization layer 180, the pixel electrode 191 is formed by using a sixth mask, and the pixel electrode 191 is electrically connected with the exposed third connection part 178 to be connected with the drain electrode 177f of the emission control thin film transistor T6.

Thereafter, a partition wall is formed on the pixel electrode 191 by using a seventh mask, and the organic emission layer 370 is formed between the partition walls. Thereafter, the common electrode 270 is formed on the organic emission layer 370. Since the common electrode 270 is formed over the entire region, a separate mask is not used. As a result, the pixel electrode 191, the organic emission layer 370, and the common electrode 270 configure an organic light emitting diode 70, and the pixel electrode 191 is an anode of the organic light emitting diode 70.

According to the above manufacturing method, since the expanded region of the second driving voltage line 172 configures the second electrode 175 of the storage capacitor Cst, the electrode of the storage capacitor Cst does not need to be formed on a separate layer. As a result, the number of masks used during the manufacturing process is reduced. When a unit price of the mask is considered, manufacturing costs are reduced and manufacturing time is shortened.

Figure 12:
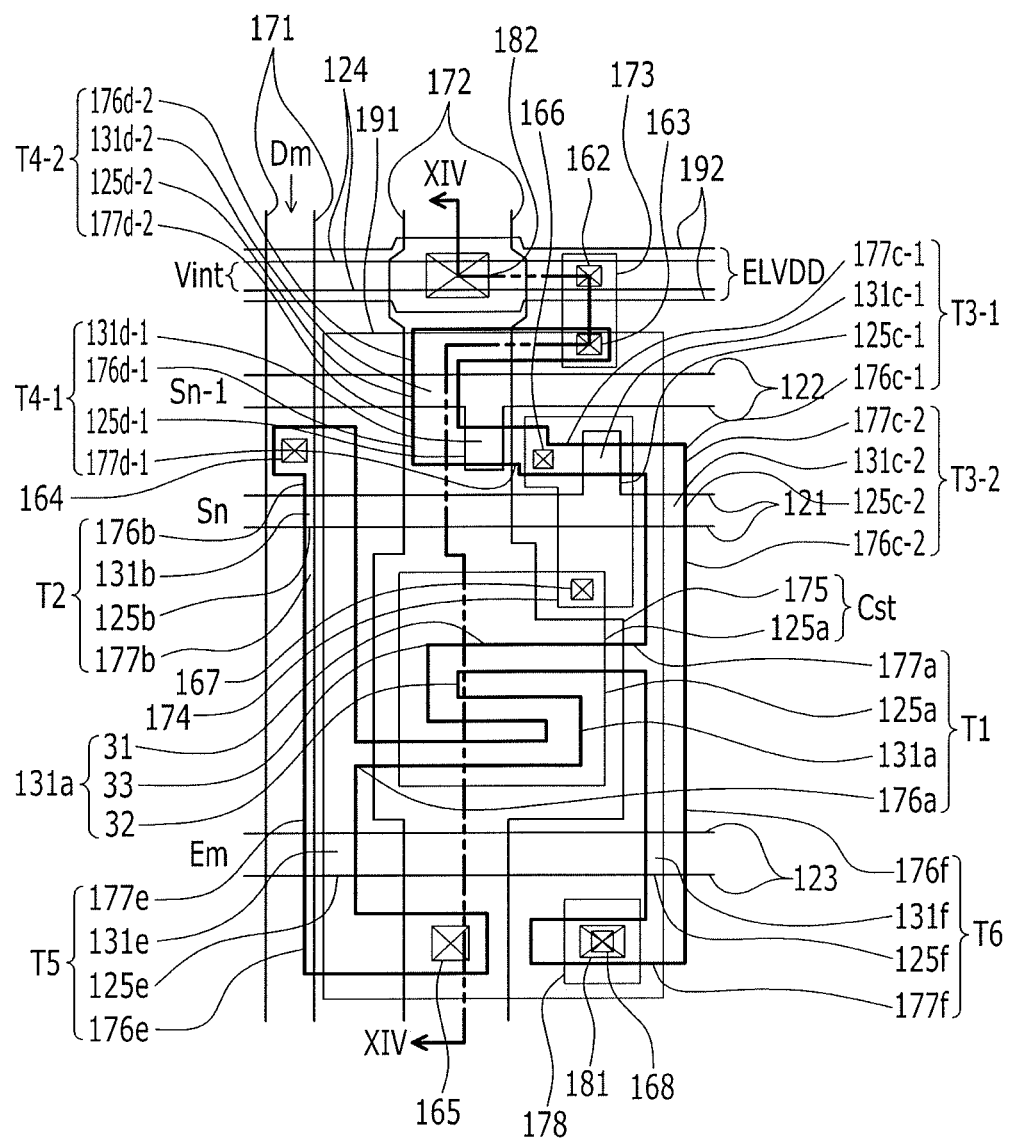
FIG. 12 illustrates another layout embodiment of a pixel.
Figure 13:
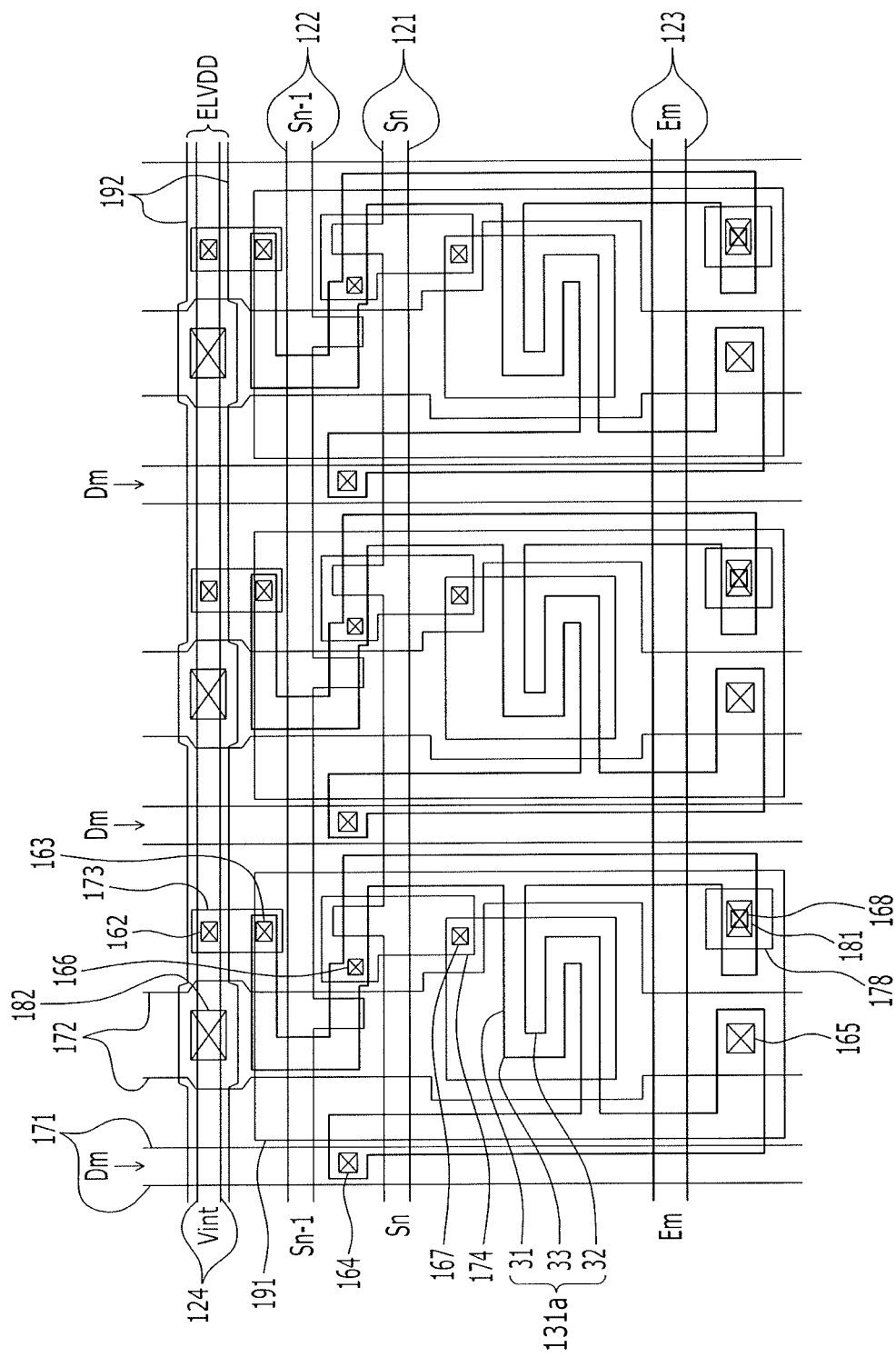
FIG. 13 illustrates another embodiment of three adjacent pixels.
Figure 14:
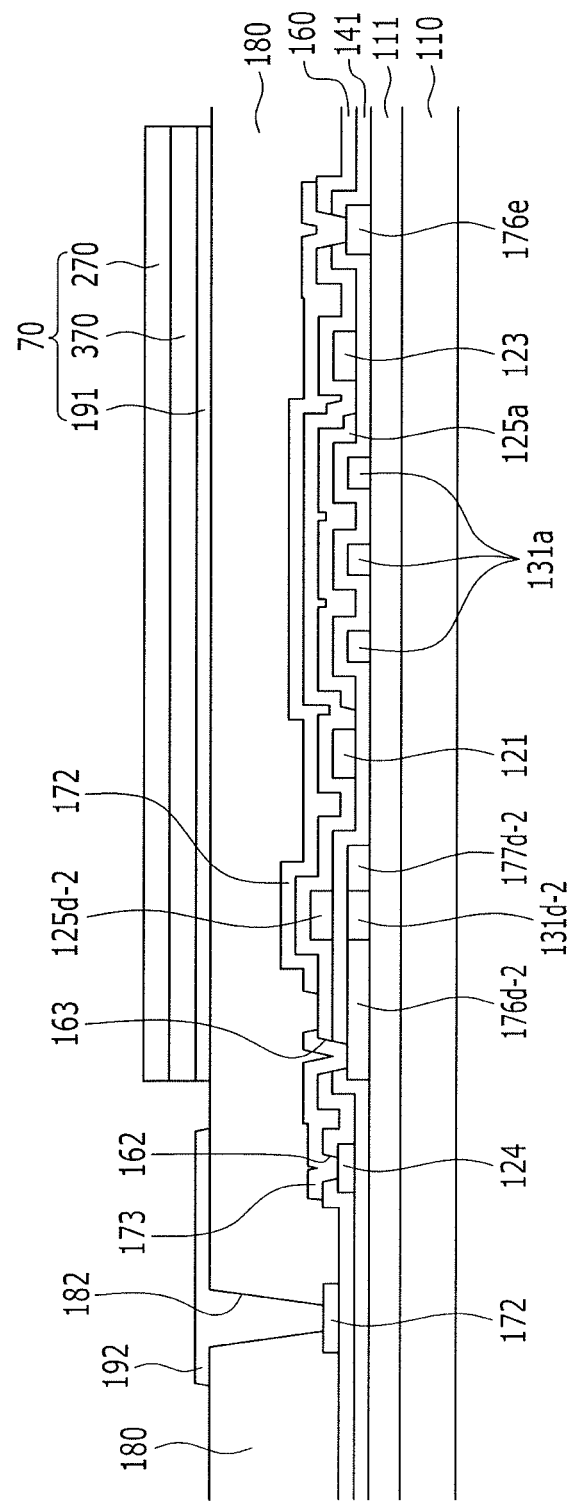
FIG. 14 illustrates a view along section line XIV-XIV in FIG. 12.

FIGS. 12 to 14 illustrate another layout embodiment of an organic light emitting diode display device. In FIGS. 12 to 14, the same circuit configuration as FIG. 1 is included, but unlike FIGS. 3 to 5 the first driving voltage line is not formed on the same layer as the scan line 121 but is formed on the same layer as the pixel electrode 191. The first driving voltage line 192 in FIG. 12 contacts the second driving voltage line 172 by the first contact hole, but the first contact hole is positioned in the planarization layer 180. Further, the first driving voltage line 192 (referred also to as a horizontal driving voltage line) overlaps the initialization voltage line 124 on the layout view.

Specifically, FIG. 12 illustrates a layout embodiment of a pixel of the organic light emitting diode display device, FIG. 13 illustrates a layout embodiment including three adjacent pixels in the organic light emitting diode display device, and FIG. 14 illustrates a cross-sectional view of the organic light emitting diode display device of FIG. 12 taken along line XIV-XIV.

Referring to FIG. 12, the pixel includes the scan line 121, the previous scan line 122, the emission control line 123, and the initialization voltage line 124 which apply the scan signal Sn, the previous scan signal Sn−1, the emission control signal Em, and the initialization voltage Vint, respectively and are formed in a row direction, as illustrated in FIG. 2, and includes a data line 171 which cross all of the scan line 121, the previous scan line 122, the emission control line 123, and the initialization voltage line 124 and apply a data signal Dm to the pixel.

The driving voltage lines 192/172 applying the driving voltage ELVDD are also included, and the driving voltage lines 192/172 are constituted by the first driving voltage line 192 parallel with the scan line 121 and positioned on the same layer as the pixel electrode 191, and the second driving voltage line 172 parallel with the data line 171. The first driving voltage line 192 and the second driving voltage line 172 are electrically connected with each other. The first driving voltage line 192 electrically connects two or more of the second driving voltage lines 172 in a horizontal direction such that the driving voltage ELVDD is transmitted in the horizontal direction.

The pixel includes a driving thin film transistor T1, a switching thin film transistor T2, compensation thin film transistors T3-1 and T3-2, initialization thin film transistors T4-1 and T4-2, an operation control thin film transistor T5, an emission control thin film transistor T6, a storage capacitor Cst, and an organic light emitting diode. Referring to FIG. 12, the compensation thin film transistors T3-1 and T3-2 and the initialization thin film transistors T4-1 and T4-2 have a dual gate structure, and hereinafter will be described as transistors are connected to each other.

Channels of the driving thin film transistor T1, the switching thin film transistor T2, the compensation thin film transistors T3-1 and T3-2, the initialization thin film transistors T4-1 and T4-2, the operation control thin film transistor T5, and the emission control thin film transistor T6 are formed within one connected semiconductor 131, and the semiconductor 131 is formed to be bent in various shapes. The semiconductor 131 according to FIG. 3 includes vertical portions which are extended in a vertical direction (a direction parallel with the data line 171) at left and right sides based on a semiconductor 131a of the driving thin film transistor T1, and two ends of each vertical portion are bent. Further, a portion which is additionally extended to be bent in a 'ㄷ' shape is included on the right vertical portion.

The semiconductor 131a of the driving thin film transistor T1 has a reverse '⊏' shape, most of the reverse '⊏' shape configures the semiconductor 131a of the driving thin film transistor T1, and a source electrode 176a and a drain electrode 177a of the driving thin film transistor T1 are positioned at portions adjacent to the vertical portions positioned at the left and right sides, respectively. The semiconductor 131a of the driving thin film transistor T1 has the reverse 'ㄹ' shape in the exemplary embodiment, but may have various shapes, and it is sufficient to have a structure including one or more bent portions. Further, the semiconductor 131a of the driving thin film transistor T1 includes a plurality of first extensions 31 extended in a first direction and a plurality of second extensions 32 extended in a second direction different from the first direction, and a bent portion 33 may have a structure connecting the first extensions 31 and the second extensions 32.

At the left vertical portion connected with the source electrode 176a of the driving thin film transistor T1, a semiconductor 131b of the switching thin film transistor T2 positioned above and a semiconductor 131e of the operation control thin film transistor T5 positioned below are formed. Between the semiconductor 131b of the switching thin film transistor T2 and the semiconductor 131e of the operation control thin film transistor T5, the drain electrode 177b of the switching thin film transistor T2 and the drain electrode 177e of the operation control thin film transistor T5 are positioned to be connected with the source electrode 176a of the driving thin film transistor T1.

The source electrode 176b of the switching thin film transistor T2 is positioned above the semiconductor 131b of the switching thin film transistor T2, and the source electrode 176e of the operation control thin film transistor T5 is positioned below the semiconductor 131e of the operation control thin film transistor T5.

At the right vertical portion connected with the drain electrode 177a of the driving thin film transistor T1, semiconductors 131c-1 and 131c-2 of the compensation thin film transistors T3-1 and T3-2 positioned above, and a semiconductor 131f of the emission control thin film transistor T6 positioned below are formed. Between the semiconductors 131c-1 and 131c-2 of the compensation thin film transistors T3-1 and T3-2 and the semiconductor 131f of the emission control thin film transistor T6, a source electrode 176c-2 of the second compensation thin film transistor T3-2 of the compensation thin film transistors T3-1 and T3-2 and a source electrode 176f of the emission control thin film transistor T6 are positioned to be connected with the drain electrode 177a of the driving thin film transistor T1. A structure of the compensation thin film transistors T3-1 and T3-2 will be described below in more detail.

The compensation thin film transistors T3-1 and T3-2 include a first compensation thin film transistor T3-1 and a second compensation thin film transistor T3-2, and the first compensation thin film transistor T3-1 is positioned based on a protrusion of the scan line 121, and the second compensation thin film transistor T3-2 is positioned based on a portion where the scan line 121 and the right vertical portion of the semiconductor 131 are overlapped with each other.

First, the source electrode 176c-2 of the second compensation thin film transistor T3-2 is connected with the source electrode 176f of the emission control thin film transistor T6 and the drain electrode 177a of the driving thin film transistor T1, a gate electrode 125c-2 is positioned at a portion of the scan line 121 with which the right vertical portion is overlapped, the semiconductor 131c-2 is positioned at a portion of the right vertical portion of the semiconductor 131 which overlaps the scan line, and a drain 177c-2 is positioned above the semiconductor 131c-2 of the right vertical portion of the semiconductor 131.

The source electrode 176c-1 of the first compensation thin film transistor T3-1 is connected with the drain 177c-2 of the second compensation thin film transistor T3-2, the gate electrode 125c-1 is positioned at the protrusion of the scan line 121, the semiconductor 131c-1 is positioned at a portion of the right vertical portion of the semiconductor 131 which overlaps the protrusion of the scan line 121, and the drain 177c-1 is positioned at an opposite side to the source electrode 176c-1 based on the semiconductor 131c-1. The first compensation thin film transistor T3-1 is positioned at a portion which is additionally extended in a '⊏' shape from the right vertical portion of the semiconductor 131.

The drain electrode 177f of the emission control thin film transistor T6 is positioned below the semiconductor 131f of the emission control thin film transistor T6, and semiconductors 131d-1 and 131d-2 of initialization thin film transistors T4-1 and T4-2 are further formed at the '⊏'-shaped additional extension which is additionally extended above the semiconductor 131c-2 and the drain electrode 177c-1 of the second compensation thin film transistor T3-2. Between the semiconductor 131d-1 of the first initialization thin film transistor T4-1 and the drain electrode 177c-1 of the first compensation thin film transistor T3-1, the drain electrode 177d-1 of the first initialization thin film transistor T4-1 is positioned, and the source electrode 176d-2 of the second initialization thin film transistor T4-2 is positioned at an end of the '⊏'-shaped portion which is additionally extended. A structure of the initialization thin film transistors T4-1 and T4-2 will be described below in more detail.

The initialization thin film transistors T4-1 and T4-2 include a first initialization thin film transistor T4-1 and a second initialization thin film transistor T4-2, and the first initialization thin film transistor T4-1 is positioned based on a protrusion of the previous scan line 122, and the second initialization thin film transistor T4-2 is positioned based on a portion where the previous scan line 122 and the '⊏'-shaped portion of the semiconductor 131 are overlapped with each other.

First, the source electrode 176d-1 of the first initialization thin film transistor T4-1 is connected with the drain electrode 177c-1 of the first compensation thin film transistor T3-1, the gate electrode 125d-1 is positioned at the portion of the previous scan line 122 with which the '⊏'-shaped portion of the semiconductor 131 is overlapped, the semiconductor 131d-1 is positioned at a portion of the '⊏'-shaped portion of the semiconductor 131 which overlaps the protrusion of the previous scan line 122, and the drain 177d-1 is positioned at an opposite side to the source electrode 176d-1 based on the semiconductor 131d-1.

The source electrode 176d-2 of the second initialization thin film transistor T4-2 is connected with the drain 177d-1 of the first initialization thin film transistor T4-1, the gate electrode 125d-2 is positioned at the portion of the previous scan line 122 with which the '⊏'-shaped portion of the semiconductor 131 is overlapped, the semiconductor 131d-2 is positioned at a portion of the '⊏'-shaped portion of the semiconductor 131 which overlaps the previous scan line 122, and the drain 177d-2 is positioned at an end of the '⊏'-shaped portion of the semiconductor 131, as an opposite side to the source electrode 176d-2 based on the semiconductor 131d-2.

The semiconductor 131 may have a different structure in other embodiments. The semiconductor 131 may include, for example, a polycrystalline semiconductor. The source electrode/drain electrodes formed in the semiconductor 131 may be formed by doping only the corresponding region. Further, in the semiconductor 131, a region between a source electrode and a drain electrode of different transistors is doped. Thus, the source electrode and the drain electrode may be electrically connected to each other.

The semiconductor 131 is formed on an insulation substrate 110, and a buffer layer 111 may be positioned between the insulation substrate 110 and the semiconductor 131. The buffer layer 111 may serve to improve a characteristic of the polycrystalline semiconductor by blocking impurities from the insulation substrate 110 during a crystallization process in order to form the polycrystalline semiconductor and to reduce stress applied to the insulation substrate 110.

A gate insulating layer 141 covering the semiconductor 131 is formed on the semiconductor 131. The gate insulating layer 141 may be formed by an inorganic insulating layer.

A scan line 121, a previous scan line 122, an emission control line 123, an initialization voltage line 124, a first driving voltage line 126, and a gate electrode 125a of the driving thin film transistor T1 which are formed in a row direction are formed on the gate insulating layer 141.

The scan line 121 and the previous scan line 122 have protrusions, respectively, and the protrusion of the scan line 121 protrudes toward the previous scan line 122, and the protrusion of the previous scan line 122 protrudes toward the scan line 121.

First, the protrusion of the scan line 121 protrudes in an upward direction of the scan line 121, overlaps the semiconductor 131c-1 of the first compensation thin film transistor T3-1, and configures the gate electrode 125c-1 of the first compensation thin film transistor T3-1. The source electrode 176c-1 and the drain electrode 177c-1 of the first compensation thin film transistor T3-1 are not overlapped with the gate electrode 125c-1 of the first compensation thin film transistor T3-1.

The protrusion of the previous scan line 122 protrudes in a downward direction of the previous scan line 122, overlaps the semiconductor 131d-1 of the first initialization thin film transistor T4-1, and configures the gate electrode 125d-1 of the first initialization thin film transistor T4-1. The source electrode 176d-1 and the drain electrode 177d-1 of the first initialization thin film transistor T4-1 are not overlapped with the gate electrode 125d-1 of the first initialization thin film transistor T4-1.

The emission control line 123 is positioned below the scan line 121, and the emission control line 123 overlaps the left vertical portion and the right vertical portion of the semiconductor 131, respectively. The emission control line 123 overlaps the semiconductor 131e of the operation control thin film transistor T5 of the left vertical portion of the semiconductor 131, but not overlapped with the source electrode 176e and the drain electrode 177e of the operation control thin film transistor T5. Further, the emission control line 123 overlaps the semiconductor 131f of the emission control thin film transistor T6 of the right vertical portion of the semiconductor 131, but not overlapped with the source electrode 176f and the drain electrode 177f of the emission control thin film transistor T6.

The initialization voltage line 124 is positioned above the previous scan line 122, and the initialization voltage line 124 has a partially expanded region. The expanded region of the initialization voltage line 124 is to be expanded in order to easily contact another wire. The initialization voltage line 124 overlaps the first driving voltage line 192 on the plan view. The initialization voltage line 124 is not overlapped with the semiconductor 131.

The gate electrode 125a of the driving thin film transistor T1 is formed in a quadrangular shape, and overlapped with the reverse 'ㄹ'-shaped portion of the semiconductor 131, that is, the semiconductor 131a of the driving thin film transistor T1. The source electrode 176a and the drain electrode 177a of the driving thin film transistor T1 are not overlapped with the gate electrode 125a of the driving thin film transistor T1.

An interlayer insulating layer 160 is covered on the scan line 121, the previous scan line 122, the emission control line 123, the initialization voltage line 124, the gate electrode 125a of the driving thin film transistor T1, and the exposed gate insulating layer 141. The interlayer insulating layer 160 may be formed by an inorganic insulating layer.

A plurality of contact holes 161, 162, 163, 164, 165, 166, 167, and 168 is formed in the interlayer insulating layer 160. The second contact hole 162 exposes the expanded region of the initialization voltage line 124, and the third contact hole 163 exposes the end (the source electrode 176d-2 of the second initialization thin film transistor T4-2) of the additionally extended 'ㄷ'-shaped portion of the semiconductor 131. The fourth contact hole 164 exposes the upper end (the source electrode 176b of the switching thin film transistor T2) of the left vertical portion of the semiconductor 131, the fifth contact hole 165 exposes the lower end (the source electrode 176e of the operation control thin film transistor T5) of the left vertical portion of the semiconductor 131, the sixth contact hole 166 exposes the drain electrode 177c-1 of the first compensation thin film transistor T3-1 which is a part of the 'ㄷ'-shaped portion which is additionally extended from the right vertical portion of the semiconductor 131. The seventh contact hole 167 exposes a partial region of the gate electrode 125a of the driving thin film transistor T1, and the eighth contact hole 168 exposes the lower end (the drain electrode 177f of the emission control thin film transistor T6) of the right vertical portion of the semiconductor 131.

A data line 171, a second driving voltage line 172 having an expanded region 175, a first connection part 173, a second connection part 174, and a third connection part 178 are formed on the interlayer insulating layer 160.

The data line 171 passes through the fourth contact hole 164 to be extended in a vertical direction, and is connected with the source electrode 176b of the switching thin film transistor T2 through the fourth contact hole 164. As a result, a data voltage flowing in the data line 171 is transferred to the source electrode 176b of the switching thin film transistor T2.

The second driving voltage line 172 is extended in a vertical direction, and the driving voltage ELVDD is transferred in the vertical direction. The second driving voltage line 172 has the expanded region, and one expanded region is formed for each pixel. The expanded region of the second driving voltage line 172 configures the second electrode 175 of the storage capacitor Cst. The driving voltage ELVDD is applied to the second electrode 175 of the storage capacitor Cst. The second electrode 175 of the storage capacitor Cst overlaps the gate electrode 125a of the thin film transistor T1 and the semiconductor 131a of the driving thin film transistor T1 having the reverse 'ㄹ' shape. The storage capacitor Cst is constituted by the gate electrode 125a of the thin film transistor T1, the second electrode 175 of the storage capacitor Cst, and the interlayer insulating layer 160 therebetween.

According to the above structure of the second driving voltage line 172, since the second driving voltage line 172 and the second electrode 175 of the storage capacitor Cst are formed together with the same material, the electrode of the storage capacitor Cst does not need to be formed on a separate layer. As a result, the number of masks used during manufacturing is decreased. When a unit price of the mask is considered, manufacturing costs are reduced and the manufacturing time is shortened.

The first connection part 173 connects the initialization voltage line 124 and the source electrode 176*d*-2 of the second initialization thin film transistor T4-2 through the second contact hole 162 and the third contact hole 163. As a result, since the initialization voltage Vint is applied to the source electrode 176*d*-2 of the second initialization thin film transistor T4-2 and the first and second initialization thin film transistors T4-1 and T4-2 may be shown as one thin film transistor having the dual gate structure, it may be understood that the initialization voltage Vint is applied to the source electrode of the initialization thin film transistor T4.

The second connection part 174 connects the drain electrode 177*c*-1 of the first compensation thin film transistor T3-1 and the gate electrode 125*a* of the thin film transistor T1 through the sixth contact hole 166 and the seventh contact hole 167. As a result, the voltage of the drain electrode 177*c*-1 of the first compensation thin film transistor T3-1 is applied to the gate electrode 125*a* of the driving thin film transistor T1. A part of the gate electrode 125*a* of the driving thin film transistor T1 has an exposed region which is not overlapped with the expanded region of the second driving voltage line 172, and the exposed region is connected with the drain electrode 177*c*-1 of the first compensation thin film transistor T3-1 through the second connection part 174.

The third connection part 178 is formed on the eighth contact hole 168 to be connected with the drain electrode 177*f* of the emission control thin film transistor T6. A planarization layer 180 is positioned on the third connection part 178. In the planarization layer 180, a first upper contact hole 181 exposing the third connection part 178 and a second upper contact hole 182 exposing a part of the first driving voltage line 192 exist, and the second driving voltage line 172 is exposed by the second upper contact hole 182.

The pixel electrode 191 and the first driving voltage line 192 are formed on the planarization layer 180. First, the pixel electrode 191 is connected with the third connection part 178 through the first upper contact hole 181 of the planarization layer 180. As a result, the pixel electrode 191 is connected with the drain electrode 177*f* of the emission control thin film transistor T6.

The first driving voltage line 192 is extended in a horizontal direction like the scan line 121, and has a partially expanded region to easily contact another wire. The first driving voltage line 192 is electrically connected with the second driving voltage line 172 by the second upper contact hole 182, and the first driving voltage line 192 transfers the driving voltage ELVDD in a horizontal direction. The first driving voltage line 192 overlaps the initialization voltage line 124 on the layout view in order to reduce an area of the pixel.

An organic emission layer 370 is positioned on the pixel electrode 191, and a common electrode 270 is positioned thereon. The pixel electrode 191, the organic emission layer 370, and the common electrode 270 configure an organic light emitting diode 70, and the pixel electrode 191 is an anode of the organic light emitting diode 70.

The driving thin film transistor T1 is constituted by 125*a*, 131*a*, 176*a*, and 177*a*, the switching thin film transistor T2 is constituted by 125*b*, 131*b*, 176*b*, and 177*b*, the compensation thin film transistors T3-1 and T3-2 are constituted by 125*c*-1, 131*c*-1, 176*c*-1, and 177*c*-1, and 125*c*-2, 131*c*-2, 176*c*-2, and 177*c*-2, respectively, the initialization thin film transistors T4-1 and T4-2 are constituted by 125*d*-1, 131*d*-1, 176*d*-1, and 177*d*-1, and 125*d*-2, 131*d*-2, 176*d*-2, and 177*d*-2, respectively, the operation control thin film transistor T5 is constituted by 125*e*, 131*e*, 176*e*, and 177*e*, and the emission control thin film transistor T6 is constituted by 125*f*, 131*f*, 176*f*, and 177*f*. Further, the storage capacitor Cst is constituted by 125*a* and 175.

Even in the exemplary embodiment of FIGS. 12 to 14, the organic light emitting diode display device may be manufactured based on the manufacturing method of the exemplary embodiment of FIGS. 3 to 5.

Figure 15:
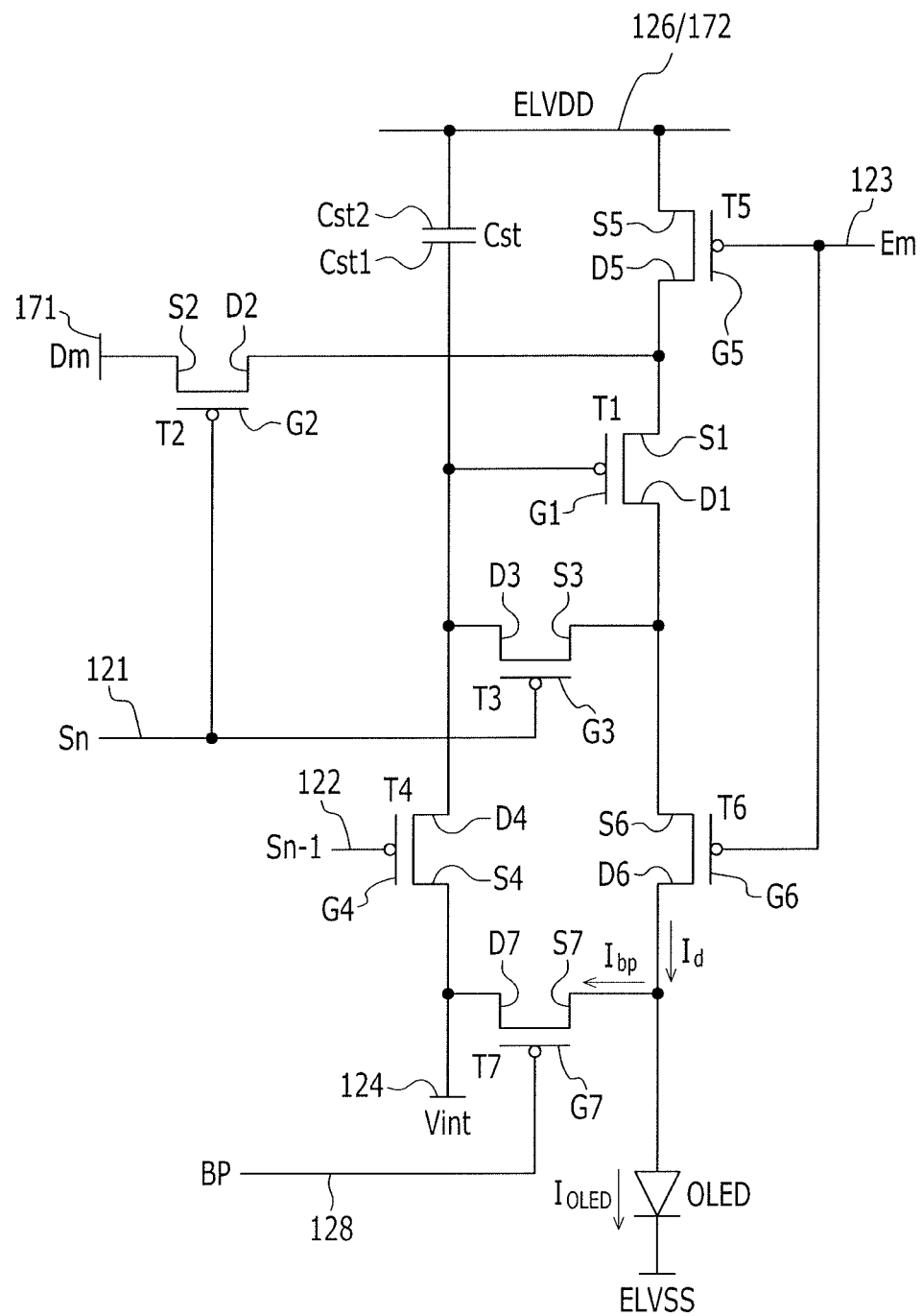
FIG. 15 illustrates another embodiment of a pixel.
Figure 16:
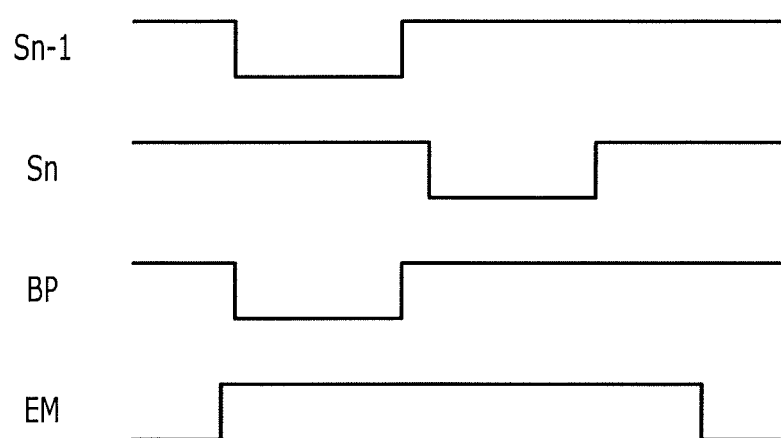
FIG. 16 illustrates an example of control signals for the pixel in FIG. 15.

FIGS. 15 and 16 illustrate another embodiment of an organic light emitting diode display device. Specifically, FIG. 15 illustrates another embodiment of a pixel of an organic light emitting diode display device, and FIG. 16 is a timing diagram illustrating an example of control signals for the pixel.

FIG. 15 illustrates an equivalent circuit diagram of the pixel based on FIG. 1, but unlike FIG. 1, a bypass thin film transistor T7 is included and part of a driving current 1*d* is discharged as a bypass current Ibp through the bypass thin film transistor T7 according to a bypass signal BP.

As illustrated in FIG. 15, the pixel includes a plurality of signal lines, a plurality of thin film transistors connected to the plurality of signal lines, a storage capacitor Cst, and an organic light emitting diode OLED. The thin film transistors include a driving thin film transistor T1, a switching thin film transistor T2, a compensation thin film transistor T3, an initialization thin film transistor T4, an operation control thin film transistor T5, an emission control thin film transistor T6, and a bypass thin film transistor T7.

The signal lines include a scan line 121 transferring a scan signal Sn, a previous scan line 122 transferring a previous scan signal Sn−1 to the initialization thin film transistor T4, an emission control line 123 transferring an emission control signal Em to the operation control thin film transistor T5 and the emission control thin film transistor T6, a data line 171 crossing the scan line 121 and transferring a data signal Dm, driving voltage lines 126/172 transferring a driving voltage ELVDD, an initialization voltage line 124 transferring an initialization voltage Vint initializing the driving thin film transistor T1, and a bypass control line 128 transferring a bypass signal BP to the bypass thin film transistor T7. The driving voltage lines 126/172 are constituted by a first driving voltage line 126 parallel with the scan line 121 and a second driving voltage line 172 parallel with the data line 171, and the first driving voltage line 126 and the second driving voltage line 172 are electrically connected to each other.

A gate electrode G1 of the driving thin film transistor T1 is connected with one end Cst1 of the storage capacitor Cst, a source electrode S1 of the driving thin film transistor T1 is connected with the driving voltage lines 126/172 via the operation control thin film transistor T5, a drain electrode D1 of the driving thin film transistor T1 is electrically connected with an anode of the organic light emitting diode OLED via the emission control thin film transistor T6. The driving thin film transistor T1 receives the data signal Dm according to a switching operation of the switching thin film transistor T2 to supply a driving current to the organic light emitting diode OLED.

A gate electrode G2 of the switching thin film transistor T2 is connected with the scan line 121, a source electrode S2 of the switching thin film transistor T2 is connected with the data line 171, and a drain electrode D2 of the switching thin film transistor T2 is connected with the source electrode S1 of the driving thin film transistor T1 and simultaneously, connected with the driving voltage lines 126/172 via the operation control thin film transistor T5. The switching thin film transistor T2 is turned on according to the scan signal Sn received through the scan line 121 to perform a switching operation transferring the data signal Dm transferred to the data line 171 to the source electrode of the driving thin film transistor T1.

A gate electrode G3 of the compensation thin film transistor T3 is connected with the scan line 121, a source electrode S3 of the compensation thin film transistor T3 is connected with the drain electrode D1 of the driving thin film transistor T1 and simultaneously, connected with an anode of the organic light emitting diode OLED via the emission control transistor T6, and a drain electrode D3 of the compensation thin film transistor T3 is connected with one end Cst1 of the storage capacitor Cst, the drain electrode D4 of the initialization thin film transistor T4, and the gate electrode G1 of the driving thin film transistor T1 together. The compensation thin film transistor T3 is turned on according to the scan signal Sn received through the scan line 121 to connect the gate electrode G1 and the drain electrode D1 of the driving thin film transistor T1 and diode-connect the driving thin film transistor T1.

A gate electrode G4 of the initialization thin film transistor T4 is connected with a previous scan line 122, a source electrode S4 of the initialization thin film transistor T4 is connected with the initialization voltage line 124, and a drain electrode D4 of the initialization thin film transistor T4 is simultaneously connected with one end Cst1 of the storage capacitor Cst, the drain electrode D3 of the compensation thin film transistor T3, and the gate electrode G1 of the driving thin film transistor T1. The initialization thin film transistor T4 is turned on according to the previous scan signal Sn−1 received through the previous scan line 122 to transfer the initialization voltage Vint to the gate electrode G1 of the driving thin film transistor T1 and then perform an initialization operation initializing a voltage of the gate electrode G1 of driving thin film transistor T1.

A gate electrode G5 of the operation control thin film transistor T5 is connected with the emission control line 123, a source electrode S5 of the operation control thin film transistor T5 is connected with the driving voltage lines 126/172, and a drain electrode D5 of the operation control thin film transistor T5 is connected with the source electrode S1 of the driving thin film transistor T1 and the drain electrode D2 of the switching thin film transistor T2.

A gate electrode G6 of the emission control thin film transistor T6 is connected with the emission control line 123, a source electrode S6 of the emission control thin film transistor T6 is connected with the drain electrode D1 of the driving thin film transistor T1 and the source electrode S3 of the compensation thin film transistor T3, and a drain electrode D6 of the emission control thin film transistor T6 is electrically connected with an anode of the organic light emitting diode OLED. The operation control thin film transistor T5 and emission control thin film transistor T6 are simultaneously turned on according to the emission control signal Em received through the emission control line 123, and the driving voltage ELVDD is transferred to the organic light emitting diode OLED and thus a driving current flows in the organic light emitting diode OLED.

The bypass thin film transistor T7 receives the bypass signal BP from the bypass control line 128. The bypass signal BP is a voltage having a predetermined level which may always turn off the bypass thin film transistor T7, the bypass thin film transistor T7 receives a voltage having a transistor off level from the gate electrode G7, and thus the bypass thin film transistor T7 is always turned off, and a part of the driving current 1$d$ flows out through the bypass thin film transistor T7 as a bypass current Ibp in the off state.

The other end Cst2 of the storage capacitor Cst is connected with the driving voltage lines 126/172, and a cathode of the organic light emitting diode OLED is connected with the common voltage ELVSS. As a result, the organic light emitting diode OLED receives the driving current from the driving thin film transistor T1 to emit light, thereby displaying an image.

Referring to FIG. 16, first, in an initializing period, the previous scan signal Sn−1 having a low level is supplied through the previous scan line 122. In this case, the emission control signal Em is already applied at the low level through the emission control line 123. Then, the initialization thin film transistor T4 is turned on based on the previous scan signal Sn−1 having the low level, the initialization voltage Vint is supplied from the initialization voltage line 124 to the gate electrode of the driving thin film transistor T1 through the initialization thin film transistor T4, and the driving thin film transistor T1 is initialized by the initialization voltage Vint.

Thereafter, in a data programming period, the scan signal Sn having the low level is supplied through the scan line 121. Then, the switching thin film transistor T2 and the compensation thin film transistor T3 are turned on based on the scan signal Sn having the low level. In this case, the driving thin film transistor T1 is diode-connected by the turned-on compensation thin film transistor T3 and biased in a forward direction.

Then, a compensation voltage Dm+Vth (Vth is a negative (−) value) reduced from the data signal Dm supplied from the data line 171 by a threshold voltage Vth of the driving thin film transistor T1 is applied to the gate electrode of the driving thin film transistor T1. The driving voltage ELVDD and the compensation voltage Dm+Vth are applied to both ends of the storage capacitor Cst, and a charge corresponding to a voltage difference between both ends is stored in the storage capacitor Cst.

Thereafter, in the emission period, the emission control signal Em supplied from the emission control line 123 is changed from the high level to the low level. Then, for the emission period, the operation control thin film transistor T5 and the emission control thin film transistor T6 are turned on by the emission control signal Em of the low level.

Then, a driving current is generated according to a voltage difference between the voltage of the gate electrode of the driving thin film transistor T1 and the driving voltage ELVDD, and a driving current IOLED is supplied to the organic light emitting diode OLED through the emission control thin film transistor T6. For the emission period, the gate-source electrode voltage Vgs of the driving thin film transistor T1 is maintained at '(Dm+Vth)−ELVDD' by the storage capacitor Cst, and according to a current-voltage relationship of the driving thin film transistor T1, the driving current 1$d$ is proportional to the square '(Dm−ELVDD)2' of a value obtained by subtracting the threshold voltage from the source-gate electrode voltage. Accordingly, the driving current IOLED is determined regardless of the threshold voltage Vth of the driving thin film transistor T1.

The bypass thin film transistor T7 receives the bypass signal BP from the bypass control line 128. The bypass signal BP is a voltage having a predetermined level which may always turn off the bypass thin film transistor T7, the bypass thin film transistor T7 receives a voltage having a transistor off level from the gate electrode G7, and thus the bypass thin film transistor T7 is always turned off, and a part of the driving current 1d flows out through the bypass thin film transistor T7 as a bypass current Ibp in the off state.

Even in the case where a minimum current of the driving thin film transistor for displaying a black image flows as the driving current, when the organic light emitting diode OLED emits light, the black image is not displayed well. Accordingly, the bypass thin film transistor T7 may distribute a part of the minimum current of the driving thin film transistor T1 as the bypass current Ibp to another current path other than the current path of the organic light emitting diode side. The minimum current of the driving thin film transistor T1 corresponds to a current under a condition in which the driving thin film transistor is turned off, because the gate-source voltage Vgs of the driving thin film transistor is smaller than the threshold voltage Vth. The minimum driving current (for example, current of 10 pA or less) under the condition in which the driving thin film transistor is turned off is transferred to the organic light emitting diode to be expressed as an image at black luminance.

When the minimum driving current expressing the black image flows, an influence on a bypass transfer of the bypass current Ibp is large. However, when a large driving current expressing an image such as a normal image or a white image flows, there may be little influence on the bypass current Ibp. Accordingly, when the driving current displaying a black image flows, the emission current Ioled of the organic light emitting diode which is reduced by the current amount of the bypass current Ibp which flows out from the driving current 1d through the bypass thin film transistor T7 has a minimum current amount as a level which may exactly express the black image.

Therefore, a black luminance image is exactly implemented by using the bypass thin film transistor, thereby improving a contrast ratio.

In FIG. 16, since as the bypass signal BP, the same signal as the previous scan signal Sn−1 is supplied, the previous scan line 122 instead of the bypass control line 128 may be connected to the bypass thin film transistor T7. In this case, the bypass control line 128 may be omitted.

Figure 17:
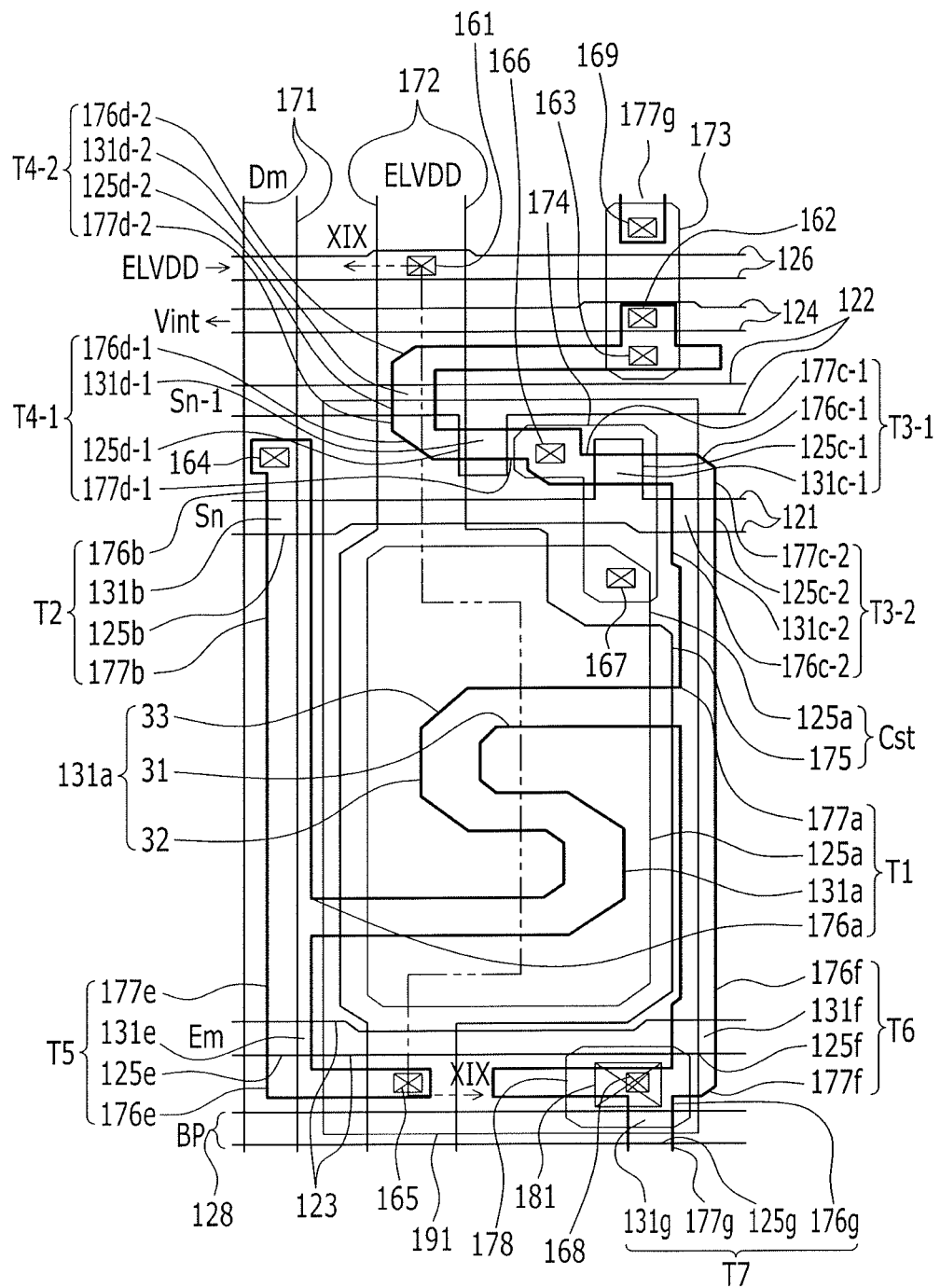
FIG. 17 illustrates another layout embodiment of a pixel.
Figure 18:
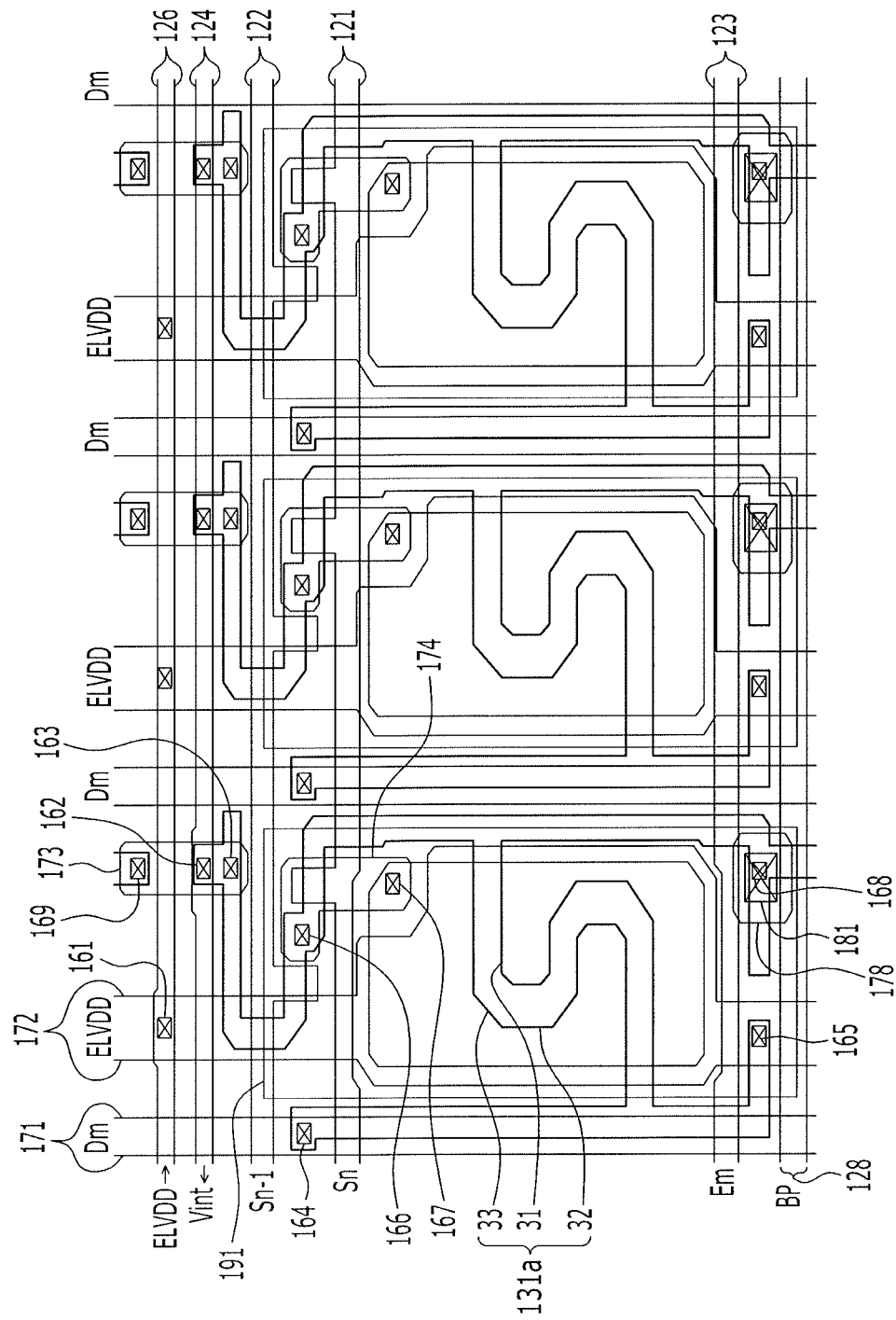
FIG. 18 illustrates another layout embodiment of three adjacent pixels.
Figure 19:
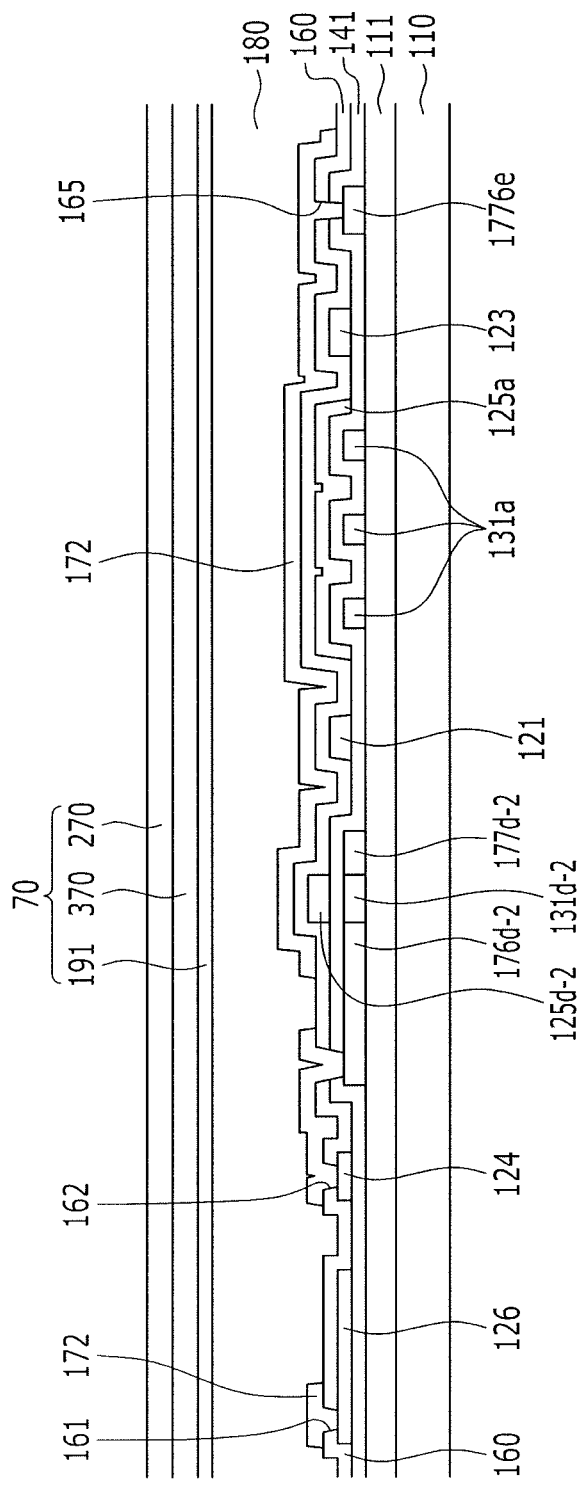
FIG. 19 illustrates a view along section line XIX-XIX in FIG. 17.

FIGS. 17 to 19 illustrate a detailed structure of another embodiment of an organic light emitting diode display device. 15. Specifically, FIG. 17 illustrates another layout embodiment of a pixel, FIG. 18 is another layout embodiment of three adjacent pixels, and FIG. 19 illustrates a cross-sectional view of the organic light emitting diode display device of FIG. 17 taken along line XIX-XIX.

As illustrated in FIG. 16, the pixel includes a scan line 121, a previous scan line 122, an emission control line 123, a bypass control line 128, and an initialization voltage line 124 which apply a scan signal Sn, a previous scan signal Sn−1, an emission control signal Em, a bypass signal BP, and an initialization voltage Vint, respectively, and are formed in a row direction, and includes a data line 171 which crosses all of the scan line 121, the previous scan line 122, the emission control line 123, the bypass control line 128, and the initialization voltage line 124 and applies a data signal Dm to the pixel.

The pixel also includes the driving voltage lines 126/172 for applying the driving voltage ELVDD. The driving voltage lines 126/172 are constituted by the first driving voltage line 126 parallel with the scan line 121 and the second driving voltage line 172 parallel with the data line 171. The first driving voltage line 126 and the second driving voltage line 172 are electrically connected with each other.

The pixel also includes a driving thin film transistor T1, a switching thin film transistor T2, compensation thin film transistors T3-1 and T3-2, initialization thin film transistors T4-1 and T4-2, an operation control thin film transistor T5, an emission control thin film transistor T6, a bypass thin film transistor T7, a storage capacitor Cst, and an organic light emitting diode OLED are formed. Referring to the exemplary embodiment of FIG. 17, the compensation thin film transistors T3-1 and T3-2 and the initialization thin film transistors T4-1 and T4-2 have a dual gate structure, and hereinafter will be described as transistors connected to each other.

Channels of the driving thin film transistor T1, the switching thin film transistor T2, the compensation thin film transistors T3-1 and T3-2, the initialization thin film transistors T4-1 and T4-2, the operation control thin film transistor T5, and the emission control thin film transistor T6 are formed within one connected semiconductor 131, and the semiconductor 131 is formed to be bent in various shapes. The semiconductor 131 according to the exemplary embodiment of FIG. 17 includes vertical portions which are extended in a vertical direction (a direction parallel with the data line 171) at left and right sides based on a semiconductor 131a of the driving thin film transistor T1, and two ends of each vertical portion are bent. Further, a portion which is additionally extended to be bent in a '⊏' shape is included above the right vertical portion, and a portion which is additionally extended downwards is included below the right vertical portion.

The semiconductor 131a of the driving thin film transistor T1 has a reverse '⊏' shape, most of the reverse '⊏' shape configures the semiconductor 131a of the driving thin film transistor T1, and a source electrode 176a and a drain electrode 177a of the driving thin film transistor T1 are positioned at portions adjacent to the vertical portions positioned at the left and right sides, respectively. The semiconductor 131a of the driving thin film transistor T1 has the reverse '⇄' shape in the exemplary embodiment. In another embodiment, the semiconductor 131a may have a different shape and/or one or more bent portions. Further, the semiconductor 131a of the driving thin film transistor T1 includes a plurality of first extensions 31 extended in a first direction and a plurality of second extensions 32 extended in a second direction different from the first direction, and a bent portion 33 may have a structure connecting the first extensions 31 and the second extensions 32.

At the left vertical portion connected with the source electrode 176a of the driving thin film transistor T1, a semiconductor 131b of the switching thin film transistor T2 positioned above and a semiconductor 131e of the operation control thin film transistor T5 positioned below are formed. Between the semiconductor 131b of the switching thin film transistor T2 and the semiconductor 131e of the operation control thin film transistor T5, the drain electrode 177b of the switching thin film transistor T2 and the drain electrode 177e of the operation control thin film transistor T5 are positioned to be connected with the source electrode 176a of the driving thin film transistor T1.

The source electrode 176b of the switching thin film transistor T2 is positioned above the semiconductor 131b of the switching thin film transistor T2, and the source electrode 176e of the operation control thin film transistor T5 is positioned below the semiconductor 131e of the operation control thin film transistor T5.

At the right vertical portion connected with the drain electrode 177a of the driving thin film transistor T1, semiconductors 131c-1 and 131c-2 of the compensation thin film transistors T3-1 and T3-2 positioned above, and a semiconductor 131f of the emission control thin film transistor T6 positioned below are formed. Between the semiconductors 131c-1 and 131c-2 of the compensation thin film transistors T3-1 and T3-2 and the semiconductor 131f of the emission control thin film transistor T6, a source electrode 176c-2 of the second compensation thin film transistor T3-2 of the compensation thin film transistors T3-1 and T3-2 and a source electrode 176f of the emission control thin film transistor T6 are positioned to be connected with the drain electrode 177a of the driving thin film transistor T1. A structure of the compensation thin film transistors T3-1 and T3-2 will be described below in more detail.

The compensation thin film transistors T3-1 and T3-2 include a first compensation thin film transistor T3-1 and a second compensation thin film transistor T3-2, and the first compensation thin film transistor T3-1 is positioned based on a protrusion of the scan line 121, and the second compensation thin film transistor T3-2 is positioned based on a portion where the scan line 121 and the right vertical portion of the semiconductor 131 are overlapped with each other. First, the source electrode 176c-2 of the second compensation thin film transistor T3-2 is connected with the source electrode 176f of the emission control thin film transistor T6 and the drain electrode 177a of the driving thin film transistor T1, a gate electrode 125c-2 is positioned at a portion of the scan line 121 with which the right vertical portion is overlapped, the semiconductor 131c-2 is positioned at a portion of the right vertical portion of the semiconductor 131 which overlaps the scan line 121, and a drain 177c-2 is positioned above the semiconductor 131c-2 of the right vertical portion of the semiconductor 131.

Meanwhile, the source electrode 176c-1 of the first compensation thin film transistor T3-1 is connected with the drain 177c-2 of the second compensation thin film transistor T3-2, the gate electrode 125c-1 is positioned at the protrusion of the scan line 121, the semiconductor 131c-1 is positioned at a portion of the right vertical portion of the semiconductor 131 which overlaps the protrusion of the scan line 121, and the drain 177c-1 is positioned at an opposite side to the source electrode 176c-1 based on the semiconductor 131c-1. The first compensation thin film transistor T3-1 is positioned at a portion which is additionally extended in a '□' shape from the right vertical portion of the semiconductor 131.

The drain electrode 177f of the emission control thin film transistor T6 is positioned below the semiconductor 131f of the emission control thin film transistor T6, and semiconductors 131d-1 and 131d-2 of initialization thin film transistors T4-1 and T4-2 are further formed at the '□'-shaped additional extension which is additionally extended above the semiconductor 131c-2 and the drain electrode 177c-1 of the second compensation thin film transistor T3-2. Between the semiconductor 131d-1 of the first initialization thin film transistor T4-1 and the drain electrode 177c-1 of the first compensation thin film transistor T3-1, the drain electrode 177d-1 of the first initialization thin film transistor T4-1 is positioned, and the source electrode 176d-2 of the second initialization thin film transistor T4-2 is positioned at an end of the '□'-shaped portion which is additionally extended. A structure of the initialization thin film transistors T4-1 and T4-2 will be described below in more detail.

The initialization thin film transistors T4-1 and T4-2 include a first initialization thin film transistor T4-1 and a second initialization thin film transistor T4-2, and the first initialization thin film transistor T4-1 is positioned based on a protrusion of the scan line 122, and the second initialization thin film transistor T4-2 is positioned based on a portion where the scan line 122 and the '□'-shaped portion of the semiconductor 131 are overlapped with each other.

First, the source electrode 176d-1 of the first initialization thin film transistor T4-1 is connected with the drain electrode 177c-1 of the first compensation thin film transistor T3-1, the gate electrode 125d-1 is positioned at the portion of the previous scan line 122 with which the '□'-shaped portion of the semiconductor 131 is overlapped, the semiconductor 131d-1 is positioned at a portion of the '□'-shaped portion of the semiconductor 131 which overlaps the protrusion of the previous scan line 122, and the drain 177d-1 is positioned at an opposite side to the source electrode 176d-1 based on the semiconductor 131d-1.

The source electrode 176d-2 of the second initialization thin film transistor T4-2 is connected with the drain 177d-1 of the first initialization thin film transistor T4-1, the gate electrode 125d-2 is positioned at the portion of the previous scan line 122 with which the '□'-shaped portion of the semiconductor 131 is overlapped, the semiconductor 131d-2 is positioned at a portion of the '□'-shaped portion of the semiconductor 131 which overlaps the previous scan line 122, and the drain 177d-2 is positioned at an end of the '□'-shaped portion of the semiconductor 131, as an opposite side to the source electrode 176d-2 based on the semiconductor 131d-2.

Further, a portion which is additionally extended downwards is positioned below the drain electrode 177f of the emission control thin film transistor T6. A source electrode 176g of the bypass thin film transistor T7 is positioned at a side adjacent to the drain electrode 177f of the emission control thin film transistor T6, and next, a semiconductor 131g of the bypass thin film transistor T7 and a drain electrode 177g of the bypass thin film transistor T7 are sequentially positioned.

The semiconductor 131 may have a different structure in another embodiment. The semiconductor 131 may include, for example, a polycrystalline semiconductor. The source electrode/drain electrodes formed in the semiconductor 131 may be formed by doping only the corresponding region. Further, in the semiconductor 131, an area between a source electrode and a drain electrode of different transistors is doped and thus the source electrode and the drain electrode may be electrically connected to each other.

The semiconductor 131 is formed on an insulation substrate 110, and a buffer layer 111 may be positioned between the insulation substrate 110 and the semiconductor 131. The buffer layer 111 may serve to improve a characteristic of the polycrystalline semiconductor by blocking impurities from the insulation substrate 110 during a crystallization process in order to form the polycrystalline semiconductor and reduce stress applied to the insulation substrate 110.

A gate insulating layer 141 covering the semiconductor 131 is formed on the semiconductor 131. The gate insulating layer 141 may be formed by an inorganic insulating layer.

A scan line 121, a previous scan line 122, an emission control line 123, an initialization voltage line 124, a first driving voltage line 126, a bypass control line 128, and a gate electrode 125a of the driving thin film transistor T1 which are formed in a row direction are formed on the gate insulating layer 141.

The scan line 121 and the previous scan line 122 have protrusions, respectively, and the protrusion of the scan line 121 protrudes toward the previous scan line 122, and the protrusion of the previous scan line 122 protrudes toward the scan line 121.

First, the protrusion of the scan line 121 protrudes in an upward direction of the scan line 121, overlaps the semiconductor 131c-1 of the first compensation thin film transistor T3-1, and configures the gate electrode 125c-1 of the first compensation thin film transistor T3-1. The source electrode 176c-1 and the drain electrode 177c-1 of the first compensation thin film transistor T3-1 are not overlapped with the gate electrode 125c-1 of the first compensation thin film transistor T3-1.

The protrusion of the previous scan line 122 protrudes in a downward direction of the previous scan line 122, overlaps the semiconductor 131d-1 of the first initialization thin film transistor T4-1, and configures the gate electrode 125d-1 of the first initialization thin film transistor T4-1. The source electrode 176d-1 and the drain electrode 177d-1 of the first initialization thin film transistor T4-1 are not overlapped with the gate electrode 125d-1 of the first initialization thin film transistor T4-1.

The emission control line 123 is positioned below the scan line 121, and the emission control line 123 overlaps the left vertical portion and the right vertical portion, respectively. The emission control line 123 overlaps the semiconductor 131e of the operation control thin film transistor T5 of the left vertical portion of the semiconductor 131, but not overlapped with the source electrode 176e and the drain electrode 177e of the operation control thin film transistor T5. Further, the emission control line 123 overlaps the semiconductor 131f of the emission control thin film transistor T6 of the right vertical portion of the semiconductor 131, but not overlapped with the source electrode 176f and the drain electrode 177f of the emission control thin film transistor T6.

The initialization voltage line 124 is positioned above the previous scan line 122, and the initialization voltage line 124 has a partially expanded area. The expanded area of the initialization voltage line 124 is expanded in order to easily contact another wire.

The first driving voltage line 126 is positioned above the initialization voltage line 124, and the first driving voltage line 126 also has a partially expanded area to easily contact another wire.

The initialization voltage line 124 and the first driving voltage line 126 are not overlapped with the semiconductor 131.

The bypass control line 128 is extended in a horizontal direction at the bottom of the pixel and overlapped with the additional extension below the right vertical portion of the semiconductor 131, and a semiconductor 131g of the bypass thin film transistor T7 is positioned at the overlapped additional extension.

The gate electrode 125a of the driving thin film transistor T1 is formed in a quadrangular shape, and overlapped with the reverse 'ᄅ'-shaped portion of the semiconductor 131, that is, the semiconductor 131a of the driving thin film transistor T1. The source electrode 176a and the drain electrode 177a of the driving thin film transistor T1 are not overlapped with the gate electrode 125a of the driving thin film transistor T1.

An interlayer insulating layer 160 is covered on the scan line 121, the previous scan line 122, the emission control line 123, the initialization voltage line 124, the first driving voltage line 126, the bypass control line 128, the gate electrode 125a of the driving thin film transistor T1, and the exposed gate insulating layer 141. The interlayer insulating layer 160 may be formed by an inorganic insulating layer.

A plurality of contact holes 161, 162, 163, 164, 165, 166, 167, 168, and 169 is formed in the interlayer insulating layer 160. The first contact hole 161 exposes the expanded area of the first driving voltage line 126, the second contact hole 162 exposes the expanded area of the initialization voltage line 124, and the third contact hole 163 exposes the end (the source electrode 176d-2 of the second initialization thin film transistor T4-2) of the additionally extended 'ᄃ'-shaped portion of the semiconductor 131. The fourth contact hole 164 exposes the upper end (the source electrode 176b of the switching thin film transistor T2) of the left vertical portion of the semiconductor 131, the fifth contact hole 165 exposes the lower end (the source electrode 176e of the operation control thin film transistor T5) of the left vertical portion of the semiconductor 131, the sixth contact hole 166 exposes the drain electrode 177c-1 of the first compensation thin film transistor T3-1 which is a part of the 'ᄃ'-shaped portion which is additionally extended from the right vertical portion of the semiconductor 131. The seventh contact hole 167 exposes a partial area of the gate electrode 125a of the driving thin film transistor T1, and the eighth contact hole 168 exposes the lower end (the source electrode 176f of the emission control thin film transistor T6) of the right vertical portion of the semiconductor 131. Further, the ninth contact hole 169 exposes the end (the drain electrode 177g of the bypass thin film transistor T7) of the additional extension below the right vertical portion of the semiconductor 131.

A data line 171, a second driving voltage line 172 having an expanded area 175, a first connection part 173, a second connection part 174, and a third connection part 178 are formed on the interlayer insulating layer 160.

The data line 171 passes through the fourth contact hole 164 to be extended in a vertical direction, and is connected with the source electrode 176b of the switching thin film transistor T2 through the fourth contact hole 164. As a result, a data voltage flowing in the data line 171 is transferred to the source electrode 176b of the switching thin film transistor T2.

The second driving voltage line 172 is extended in the vertical direction, and connected with the first driving voltage line 126 through the first contact hole 161. The first driving voltage line 126 transfers the driving voltage ELVDD in a horizontal direction, and the second driving voltage line 172 transfers driving voltage ELVDD in a vertical direction. The second driving voltage line 172 has the expanded region, and one expanded region is formed for each pixel. The expanded region of the second driving voltage line 172 configures the second electrode 175 of the storage capacitor Cst. The driving voltage ELVDD is applied to the second electrode 175 of the storage capacitor Cst. The second electrode 175 of the storage capacitor Cst overlaps the gate electrode 125a of the thin film transistor T1 and the semiconductor 131a of the driving thin film transistor T1 having the reverse 'ᄅ' shape. The storage capacitor Cst is constituted by the gate electrode 125a of the thin film transistor T1, the second electrode 175 of the storage capacitor Cst, and the interlayer insulating layer 160 therebetween.

According to the above structure of the second driving voltage line 172, since the second driving voltage line 172 and the second electrode 175 of the storage capacitor Cst are formed together with the same material, the electrode of the storage capacitor Cst does not need to be formed on a separate layer. As a result, the number of masks used during manufacturing is decreased. When a unit price of the mask is considered, manufacturing costs are reduced and the manufacturing time is shortened.

The first connection part 173 connects the initialization voltage line 124, the source electrode 176d-2 of the second initialization thin film transistor T4-2, and the drain electrode 177g of the bypass thin film transistor T7 through the second contact hole 162, the third contact hole 163, and the ninth contact hole 169. As a result, the initialization voltage Vint is applied to the source electrode 176d-2 of the second initialization thin film transistor T4-2 and the drain electrode 177g of the bypass thin film transistor T7. Here, since the first and second initialization thin film transistors T4-1 and T4-2 may be shown as one thin film transistor having a dual gate structure, it may be understood that the initialization voltage Vint is applied to the source electrode of the initialization thin film transistor T4.

The second connection part 174 connects the drain electrode 177c-1 of the first compensation thin film transistor T3-1 and the gate electrode 125a of the thin film transistor T1 through the sixth contact hole 166 and the seventh contact hole 167. As a result, the voltage of the drain electrode 177c-1 of the first compensation thin film transistor T3-1 is applied to the gate electrode 125a of the driving thin film transistor T1. A part of the gate electrode 125a of the driving thin film transistor T1 has an exposed region which is not overlapped with the expanded region of the second driving voltage line 172, and the exposed region is connected with the drain electrode 177c-1 of the first compensation thin film transistor T3-1 through the second connection part 174.

The third connection part 178 is formed on the eighth contact hole 168 to be connected with the source electrode 176f of the emission control thin film transistor T6. A planarization layer 180 is positioned on the third connection part 178. A first upper contact hole 181 is included in the planarization layer 180 to expose the third connection part 178. A pixel electrode 191 is positioned on the planarization layer 180, and the pixel electrode 191 and the connection part 178 are connected to each other through the first upper contact hole 181 of the planarization layer. As a result, the pixel electrode 191 is connected with the source electrode 176f of the emission control thin film transistor T6. An organic emission layer 370 is positioned on the pixel electrode 191, and a common electrode 270 is positioned thereon. The pixel electrode 191, the organic emission layer 370, and the common electrode 270 configure an organic light emitting diode 70, and the pixel electrode 191 is an anode of the organic light emitting diode 70.

The driving thin film transistor T1 is constituted by 125a, 131a, 176a, and 177a, the switching thin film transistor T2 is constituted by 125b, 131b, 176b, and 177b, the compensation thin film transistors T3-1 and T3-2 are constituted by 125c-1, 131c-1, 176c-1, and 177c-1, and 125c-2, 131c-2, 176c-2, and 177c-2, respectively, the initialization thin film transistors T4-1 and T4-2 are constituted by 125d-1, 131d-1, 176d-1, and 177d-1, and 125d-2, 131d-2, 176d-2, and 177d-2, respectively, the operation control thin film transistor T5 is constituted by 125e, 131e, 176e, and 177e, the emission control thin film transistor T6 is constituted by 125f, 131f, 176f, and 177f, and the bypass thin film transistor T7 is constituted by 125g, 131g, 176g, and 177g. Further, the storage capacitor Cst is constituted by 125a and 175.

Even in the exemplary embodiment of FIGS. 17 to 19, the organic light emitting diode display device may be manufactured based on the manufacturing method of the exemplary embodiment of FIGS. 3 to 5.

Figure 20:
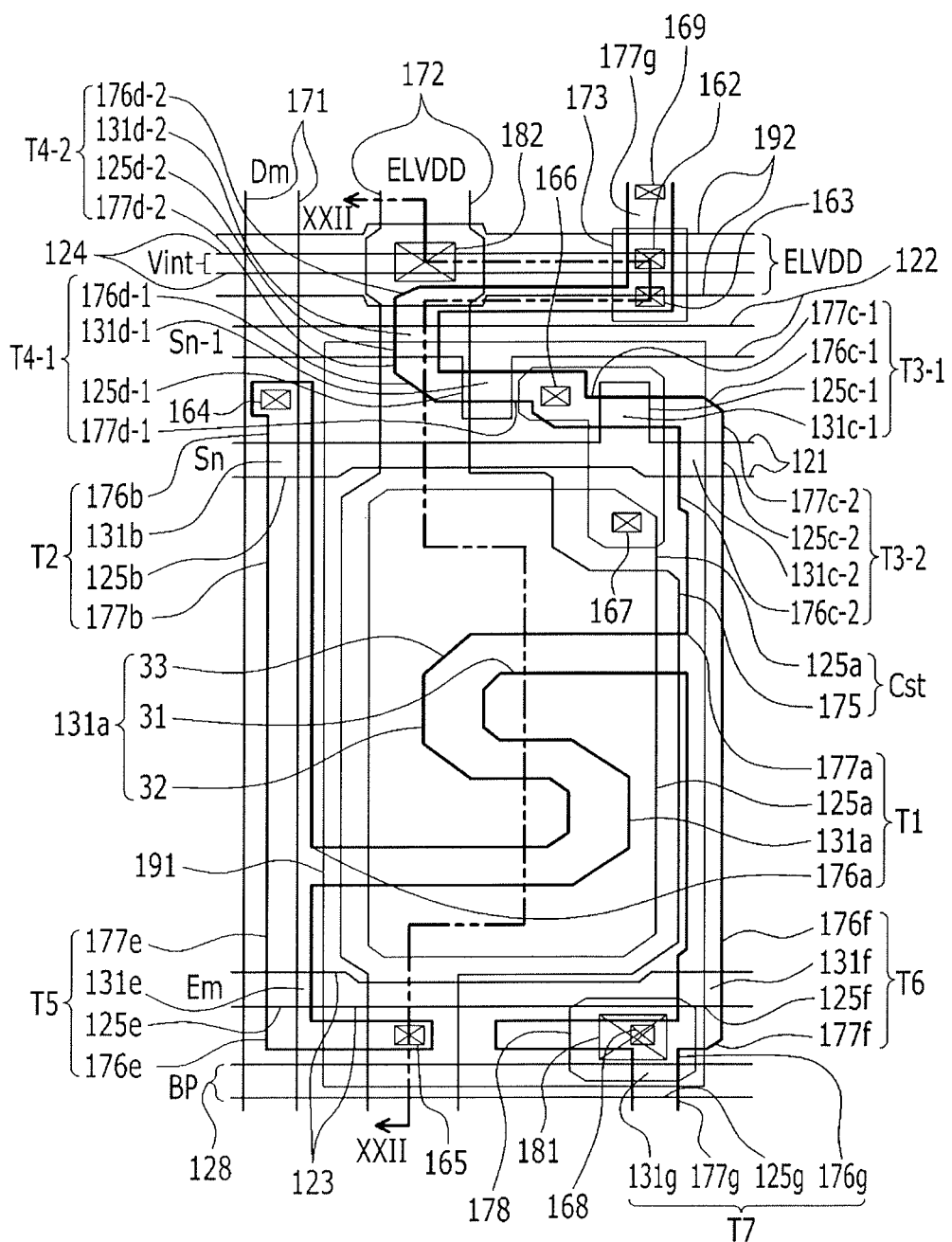
FIG. 20 illustrates another layout embodiment of a pixel.
Figure 21:
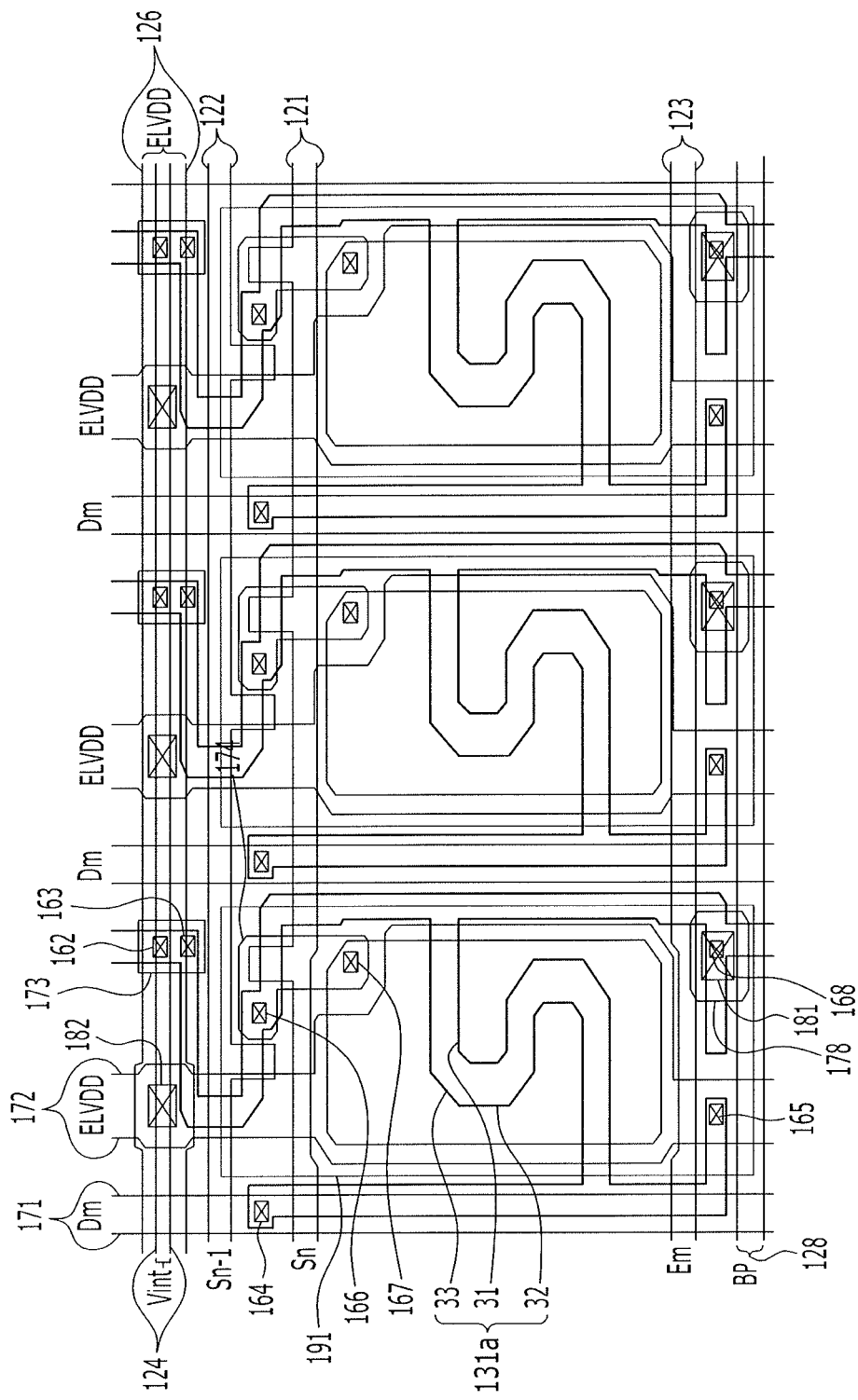
FIG. 21 illustrates another layout embodiment of three adjacent pixels.
Figure 22:
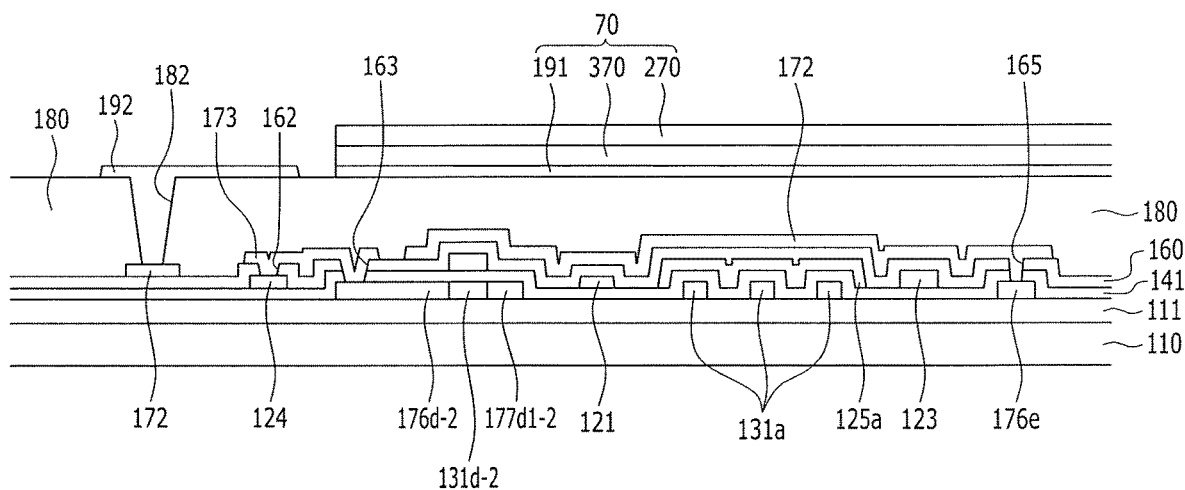
FIG. 22 illustrates a view along section line XXII-XXII in FIG. 20.

FIGS. 20 to 22 illustrating another embodiment of an organic light emitting diode display device. In FIGS. 20 to 22, the same circuit configuration as FIG. 15 is included. However, unlike FIGS. 17 to 19, there is a difference in that the first driving voltage line is not formed on the same layer as the scan line 121, but formed on the same layer as the pixel electrode 191. The first driving voltage line 192 in the exemplary embodiment of FIG. 20 contacts the second driving voltage line 172 by the first contact hole, but the first contact hole is positioned in the planarization layer 180. Further, the first driving voltage line 192 overlaps the initialization voltage line 124 on the layout view.

FIG. 20 illustrates another layout embodiment of a pixel, FIG. 21 illustrates another layout embodiment of three adjacent pixels, and FIG. 22 illustrates a cross-sectional view of the organic light emitting diode display device of FIG. 20 taken along line XXII-XXII.

The pixel in FIG. 20 includes a scan line 121, a previous scan line 122, an emission control line 123, a bypass control line 128, and an initialization voltage line 124 which apply a scan signal Sn, a previous scan signal Sn−1, an emission control signal Em, a bypass signal BP, and an initialization voltage Vint, respectively and are formed in a row direction, and includes a data line 171 which crosses all of the scan line 121, the previous scan line 122, the emission control line 123, the bypass control line 128, and the initialization voltage line 124 and applies a data signal Dm to the pixel.

The pixel also includes the driving voltage lines 192/172 applying the driving voltage ELVDD. The driving voltage lines 192/172 are constituted by the first driving voltage line 192 parallel with the scan line 121 and positioned on the same layer as the pixel electrode 191, and the second driving voltage line 172 parallel with the data line 171. The first driving voltage line 192 and the second driving voltage line 172 are electrically connected with each other.

The pixel also includes a driving thin film transistor T1, a switching thin film transistor T2, compensation thin film transistors T3-1 and T3-2, initialization thin film transistors T4-1 and T4-2, an operation control thin film transistor T5, an emission control thin film transistor T6, a bypass thin film transistor T7, a storage capacitor Cst, and an organic light emitting diode OLED are formed. Referring to the exemplary embodiment of FIG. 20, the compensation thin film transistors T3-1 and T3-2 and the initialization thin film transistors T4-1 and T4-2 have a dual gate structure, and hereinafter, will be described as transistors connected to each other.

Channels of the driving thin film transistor T1, the switching thin film transistor T2, the compensation thin film transistors T3-1 and T3-2, the initialization thin film transistors T4-1 and T4-2, the operation control thin film transistor T5, and the emission control thin film transistor T6 are formed within one connected semiconductor 131, and the semiconductor 131 is formed to be bent in various shapes. The semiconductor 131 according to the exemplary embodiment of FIG. 17 includes vertical portions which are extended in a vertical direction (a direction parallel with the data line 171) at left and right sides based on a semiconductor 131a of the driving thin film transistor T1, and two ends of each vertical portion are bent. Further, a portion which is additionally extended to be bent in a '⊏' shape is included above the right vertical portion, and a portion which is additionally extended downwards is included below the right vertical portion.

The semiconductor 131a of the driving thin film transistor T1 has a reverse shape, most of the reverse '⊏' shape configures the semiconductor 131a of the driving thin film transistor T1, and a source electrode 176a and a drain electrode 177a of the driving thin film transistor T1 are positioned at portions adjacent to the vertical portions positioned at the left and right sides, respectively. The semiconductor 131a of the driving thin film transistor T1 has the reverse 'ㄹ' shape in the exemplary embodiment, but may have various shapes, and it is better to have a structure including one or more bent portions. Further, the semiconductor 131a of the driving thin film transistor T1 includes a plurality of first extensions 31 extended in a first direction and a plurality of second extensions 32 extended in a second direction different from the first direction, and a bent portion 33 may have a structure connecting the first extensions 31 and the second extensions 32.

At the left vertical portion connected with the source electrode 176a of the driving thin film transistor T1, a semiconductor 131b of the switching thin film transistor T2 positioned above and a semiconductor 131e of the operation control thin film transistor T5 positioned below are formed. Between the semiconductor 131b of the switching thin film transistor T2 and the semiconductor 131e of the operation control thin film transistor T5, the drain electrode 177b of the switching thin film transistor T2 and the drain electrode 177e of the operation control thin film transistor T5 are positioned to be connected with the source electrode 176a of the driving thin film transistor T1.

The source electrode 176b of the switching thin film transistor T2 is positioned above the semiconductor 131b of the switching thin film transistor T2, and the source electrode 176e of the operation control thin film transistor T5 is positioned below the semiconductor 131e of the operation control thin film transistor T5.

At the right vertical portion connected with the drain electrode 177a of the driving thin film transistor T1, semiconductors 131c-1 and 131c-2 of the compensation thin film transistors T3-1 and T3-2 positioned above, and a semiconductor 131f of the emission control thin film transistor T6 positioned below are formed. Between the semiconductors 131c-1 and 131c-2 of the compensation thin film transistors T3-1 and T3-2 and the semiconductor 131f of the emission control thin film transistor T6, a source electrode 176c-2 of the second compensation thin film transistor T3-2 of the compensation thin film transistors T3-1 and T3-2 and a source electrode 176f of the emission control thin film transistor T6 are positioned to be connected with the drain electrode 177a of the driving thin film transistor T1. A structure of the compensation thin film transistors T3-1 and T3-2 will be described below in more detail.

The compensation thin film transistors T3-1 and T3-2 include a first compensation thin film transistor T3-1 and a second compensation thin film transistor T3-2, and the first compensation thin film transistor T3-1 is positioned based on a protrusion of the scan line 121, and the second compensation thin film transistor T3-2 is positioned based on a portion where the scan line 121 and the right vertical portion of the semiconductor 131 are overlapped with each other.

First, the source electrode 176c-2 of the second compensation thin film transistor T3-2 is connected with the source electrode 176f of the emission control thin film transistor T6 and the drain electrode 177a of the driving thin film transistor T1, a gate electrode 125c-2 is positioned at a portion of the scan line 121 with which the right vertical portion of the semiconductor 131 is overlapped, the semiconductor 131c-2 is positioned at a portion of the right vertical portion of the semiconductor 131 which overlaps the scan line, and a drain 177c-2 is positioned above the semiconductor 131c-2 of the right vertical portion of the semiconductor 131.

The source electrode 176c-1 of the first compensation thin film transistor T3-1 is connected with the drain 177c-2 of the second compensation thin film transistor T3-2, the gate electrode 125c-1 is positioned at the protrusion of the scan line 121, the semiconductor 131c-1 is positioned at a portion of the right vertical portion of the semiconductor 131 which overlaps the protrusion of the scan line 121, and the drain 177c-1 is positioned at an opposite side to the source electrode 176c-1 based on the semiconductor 131c-1. The first compensation thin film transistor T3-1 is positioned at a portion which is additionally extended in a 'ㄷ' shape from the right vertical portion of the semiconductor 131.

The drain electrode 177f of the emission control thin film transistor T6 is positioned below the semiconductor 131f of the emission control thin film transistor T6, and semiconductors 131d-1 and 131d-2 of initialization thin film transistors T4-1 and T4-2 are further formed at the "ㄷ"-shaped additional extension which is additionally extended above the semiconductor 131c-2 and the drain electrode 177c-1 of the second compensation thin film transistor T3-2. Between the semiconductor 131d-1 of the first initialization thin film transistor T4-1 and the drain electrode 177c-1 of the first compensation thin film transistor T3-1, the drain electrode 177d-1 of the first initialization thin film transistor T4-1 is positioned, and the source electrode 176d-2 of the second initialization thin film transistor T4-2 is positioned at an end of the 'ㄷ'-shaped portion which is additionally extended. A structure of the initialization thin film transistors T4-1 and T4-2 will be described below in more detail.

The initialization thin film transistors T4-1 and T4-2 include a first initialization thin film transistor T4-1 and a second initialization thin film transistor T4-2, and the first initialization thin film transistor T4-1 is positioned based on a protrusion of the previous scan line 122, and the second initialization thin film transistor T4-2 is positioned based on a portion where the previous scan line 122 and the 'ㄷ'-shaped portion of the semiconductor 131 are overlapped with each other.

First, the source electrode 176d-1 of the first initialization thin film transistor T4-1 is connected with the drain electrode 177c-1 of the first compensation thin film transistor T3-1, the gate electrode 125d-1 is positioned at the portion of the previous scan line 122 with which the 'ㄷ'-shaped portion of the semiconductor 131 is overlapped, the semiconductor 131d-1 is positioned at a portion of the 'ㄷ'-shaped portion of the semiconductor 131 which overlaps the protrusion of the previous scan line 122, and the drain 177d-1 is positioned at an opposite side to the source electrode 176d-1 based on the semiconductor 131d-1.

The source electrode 176d-2 of the second initialization thin film transistor T4-2 is connected with the drain 177d-1 of the first initialization thin film transistor T4-1, the gate electrode 125d-2 is positioned at the portion of the previous scan line 122 with which the 'ㄷ'-shaped portion of the semiconductor 131 is overlapped, the semiconductor 131d-2 is positioned at a portion of the 'ㄷ'-shaped portion of the semiconductor 131 which overlaps the previous scan line 122, and the drain 177d-2 is positioned at an end of the 'ㄷ'-shaped portion of the semiconductor 131, as an opposite side to the source electrode 176d-2 based on the semiconductor 131d-2.

Further, a portion which is additionally extended downwards is positioned below the drain electrode 177f of the emission control thin film transistor T6. A source electrode 176g of the bypass thin film transistor T7 is positioned at a side adjacent to the drain electrode 177*f* of the emission control thin film transistor T6, and next, a semiconductor 131*g* of the bypass thin film transistor T7 and a drain electrode 177*g* of the bypass thin film transistor T7 are sequentially positioned.

The semiconductor 131 may have a different structure in another embodiment. The semiconductor 131 may include, for example, a polycrystalline semiconductor. The source electrode/drain electrodes formed in the semiconductor 131 may be formed by doping only the corresponding region. Further, in the semiconductor 131, an area between a source electrode and a drain electrode of different transistors is doped and thus the source electrode and the drain electrode may be electrically connected to each other.

The semiconductor 131 is formed on an insulation substrate 110, and a buffer layer 111 may be positioned between the insulation substrate 110 and the semiconductor 131. The buffer layer 111 may serve to improve a characteristic of the polycrystalline semiconductor by blocking impurities from the insulation substrate 110 during a crystallization process in order to form the polycrystalline semiconductor and to reduce stress applied to the insulation substrate 110.

A gate insulating layer 141 covering the semiconductor 131 is formed on the semiconductor 131. The gate insulating layer 141 may be formed by an inorganic insulating layer.

A scan line 121, a previous scan line 122, an emission control line 123, an initialization voltage line 124, a bypass control line 128, and a gate electrode 125*a* of the driving thin film transistor T1 which are formed in a row direction are formed on the gate insulating layer 141. The scan line 121 and the previous scan line 122 have protrusions, respectively, and the protrusion of the scan line 121 protrudes toward the previous scan line 122, and the protrusion of the previous scan line 122 protrudes toward the scan line 121.

First, the protrusion of the scan line 121 protrudes in an upward direction of the scan line 121, overlaps the semiconductor 131*c*-1 of the first compensation thin film transistor T3-1, and configures the gate electrode 125*c*-1 of the first compensation thin film transistor T3-1. The source electrode 176*c*-1 and the drain electrode 177*c*-1 of the first compensation thin film transistor T3-1 are not overlapped with the gate electrode 125*c*-1 of the first compensation thin film transistor T3-1.

The protrusion of the previous scan line 122 protrudes in a downward direction of the previous scan line 122, overlaps the semiconductor 131*d*-1 of the first initialization thin film transistor T4-1, and configures the gate electrode 125*d*-1 of the first initialization thin film transistor T4-1. The source electrode 176*d*-1 and the drain electrode 177*d*-1 of the first initialization thin film transistor T4-1 are not overlapped with the gate electrode 125*d*-1 of the first initialization thin film transistor T4-1.

The emission control line 123 is positioned below the scan line 121, and the emission control line 123 overlaps the left vertical portion and the right vertical portion of the semiconductor 131, respectively. The emission control line 123 overlaps the semiconductor 131*e* of the operation control thin film transistor T5 of the left vertical portion of the semiconductor 131, but not overlapped with the source electrode 176*e* and the drain electrode 177*e* of the operation control thin film transistor T5. Further, the emission control line 123 overlaps the semiconductor 131*f* of the emission control thin film transistor T6 of the right vertical portion of the semiconductor 131, but not overlapped with the source electrode 176*f* and the drain electrode 177*f* of the emission control thin film transistor T6.

The initialization voltage line 124 is positioned above the previous scan line 122, and the initialization voltage line 124 has a partially expanded area. The expanded area of the initialization voltage line 124 is to be expanded in order to easily contact another wire. The initialization voltage line 124 is not overlapped with the semiconductor 131.

The bypass control line 128 is extended in a horizontal direction at the bottom of the pixel and overlapped with the additional extension below the right vertical portion of the semiconductor 131, and a semiconductor 131*g* of the bypass thin film transistor T7 is positioned at the overlapped additional extension.

The gate electrode 125*a* of the driving thin film transistor T1 is formed in a quadrangular shape, and overlapped with the reverse '⊒'-shaped portion of the semiconductor 131, that is, the semiconductor 131*a* of the driving thin film transistor T1. The source electrode 176*a* and the drain electrode 177*a* of the driving thin film transistor T1 are not overlapped with the gate electrode 125*a* of the driving thin film transistor T1.

An interlayer insulating layer 160 is covered on the scan line 121, the previous scan line 122, the emission control line 123, the initialization voltage line 124, the bypass control line 128, the gate electrode 125*a* of the driving thin film transistor T1, and the exposed gate insulating layer 141. The interlayer insulating layer 160 may be formed by an inorganic insulating layer.

A plurality of contact holes 161, 162, 163, 164, 165, 166, 167, 168, and 169 is formed in the interlayer insulating layer 160. The second contact hole 162 exposes the expanded region of the initialization voltage line 124, and the third contact hole 163 exposes the end (the source electrode 176*d*-2 of the second initialization thin film transistor T4-2) of the additionally extended '⊏'-shaped portion of the semiconductor 131. The fourth contact hole 164 exposes the upper end (the source electrode 176*b* of the switching thin film transistor T2) of the left vertical portion of the semiconductor 131, the fifth contact hole 165 exposes the lower end (the source electrode 176*e* of the operation control thin film transistor T5) of the left vertical portion of the semiconductor 131, the sixth contact hole 166 exposes the drain electrode 177*c*-1 of the first compensation thin film transistor T3-1 which is a part of the '⊏'-shaped portion which is additionally extended from the right vertical portion of the semiconductor 131. The seventh contact hole 167 exposes a partial area of the gate electrode 125*a* of the driving thin film transistor T1, and the eighth contact hole 168 exposes the lower end (the source electrode 176*f* of the emission control thin film transistor T6) of the right vertical portion of the semiconductor 131. Further, the ninth contact hole 169 exposes the end (the drain electrode 177*g* of the bypass thin film transistor T7) of the additional extension below the right vertical portion of the semiconductor 131.

A data line 171, a second driving voltage line 172 having an expanded area 175, a first connection part 173, a second connection part 174, and a third connection part 178 are formed on the interlayer insulating layer 160.

The data line 171 passes through the fourth contact hole 164 to be extended in a vertical direction, and is connected with the source electrode 176*b* of the switching thin film transistor T2 through the fourth contact hole 164. As a result, a data voltage flowing in the data line 171 is transferred to the source electrode 176*b* of the switching thin film transistor T2.

The second driving voltage line 172 is extended in a vertical direction, and the driving voltage ELVDD is transferred in the vertical direction. The second driving voltage line 172 has the expanded region, and one expanded region is formed for each pixel. The expanded region of the second driving voltage line 172 configures the second electrode 175 of the storage capacitor Cst. The driving voltage ELVDD is applied to the second electrode 175 of the storage capacitor Cst. The second electrode 175 of the storage capacitor Cst overlaps the gate electrode 125a of the thin film transistor T1 and the semiconductor 131a of the driving thin film transistor T1 having the reverse 'ㄹ' shape. The storage capacitor Cst is constituted by the gate electrode 125a of the thin film transistor T1, the second electrode 175 of the storage capacitor Cst, and the interlayer insulating layer 160 therebetween.

According to the above structure of the second driving voltage line 172, since the second driving voltage line 172 and the second electrode 175 of the storage capacitor Cst are formed together with the same material, the electrode of the storage capacitor Cst does not need to be formed on a separate layer, and as a result, the number of masks used during the manufacturing process is decreased. When a unit price of the mask is considered, the manufacturing cost is reduced, and the manufacturing time is shortened.

The first connection part 173 connects the initialization voltage line 124, the source electrode 176d-2 of the second initialization thin film transistor T4-2, and the drain electrode 177g of the bypass thin film transistor T7 through the second contact hole 162, the third contact hole 163, and the ninth contact hole 169. As a result, the initialization voltage Vint is applied to the source electrode 176d-2 of the second initialization thin film transistor T4-2 and the drain electrode 177g of the bypass thin film transistor T7. Here, since the first and second initialization thin film transistors T4-1 and T4-2 may be shown as one thin film transistor having a dual gate structure, it may be understood that the initialization voltage Vint is applied to the source electrode of the initialization thin film transistor T4.

The second connection part 174 connects the drain electrode 177c-1 of the first compensation thin film transistor T3-1 and the gate electrode 125a of the thin film transistor T1 through the sixth contact hole 166 and the seventh contact hole 167. As a result, the voltage of the drain electrode 177c-1 of the first compensation thin film transistor T3-1 is applied to the gate electrode 125a of the driving thin film transistor T1. A part of the gate electrode 125a of the driving thin film transistor T1 has an exposed region which is not overlapped with the expanded region of the second driving voltage line 172, and the exposed region is connected with the drain electrode 177c-1 of the first compensation thin film transistor T3-1 through the second connection part 174.

The third connection part 178 is formed on the eighth contact hole 168 to be connected with the source electrode 176f of the emission control thin film transistor T6. A planarization layer 180 is positioned on the third connection part 178. In the planarization layer 180, a first upper contact hole 181 exposing the third connection part 178 and a second upper contact hole 182 exposing a part of the first driving voltage line 192 exist, and the second driving voltage line 172 is exposed by the second upper contact hole 182.

The pixel electrode 191 and the first driving voltage line 192 are formed on the planarization layer 180. First, the pixel electrode 191 is connected with the third connection part 178 through the first upper contact hole 181 of the planarization layer 180. As a result, the pixel electrode 191 is connected with the drain electrode 177f of the emission control thin film transistor T6.

The first driving voltage line 192 is extended in a horizontal direction like the scan line 121, and has a partially expanded region to easily contact another wire. The first driving voltage line 192 is electrically connected with the second driving voltage line 172 by the second upper contact hole 182, and the first driving voltage line 192 transfers the driving voltage ELVDD in a horizontal direction. The first driving voltage line 192 overlaps the initialization voltage line 124 on the layout view in order to reduce an area of the pixel.

An organic emission layer 370 is positioned on the pixel electrode 191, and a common electrode 270 is positioned thereon. The pixel electrode 191, the organic emission layer 370, and the common electrode 270 configure an organic light emitting diode 70, and the pixel electrode 191 is an anode of the organic light emitting diode 70.

The driving thin film transistor T1 is constituted by 125a, 131a, 176a, and 177a, the switching thin film transistor T2 is constituted by 125b, 131b, 176b, and 177b, the compensation thin film transistors T3-1 and T3-2 are constituted by 125c-1, 131c-1, 176c-1, and 177c-1, and 125c-2, 131c-2, 176c-2, and 177c-2, respectively, the initialization thin film transistors T4-1 and T4-2 are constituted by 125d-1, 131d-1, 176d-1, and 177d-1, and 125d-2, 131d-2, 176d-2, and 177d-2, respectively, the operation control thin film transistor T5 is constituted by 125e, 131e, 176e, and 177e, the emission control thin film transistor T6 is constituted by 125f, 131f, 176f, and 177f, and the bypass thin film transistor T7 is constituted by 125g, 131g, 176g, and 177g. Further, the storage capacitor Cst is constituted by 125a and 175.

Even in the exemplary embodiment of FIGS. 20 to 22, the organic light emitting diode display device may be manufactured based on the manufacturing method of the exemplary embodiment of FIGS. 3 to 5.

Figure 23:
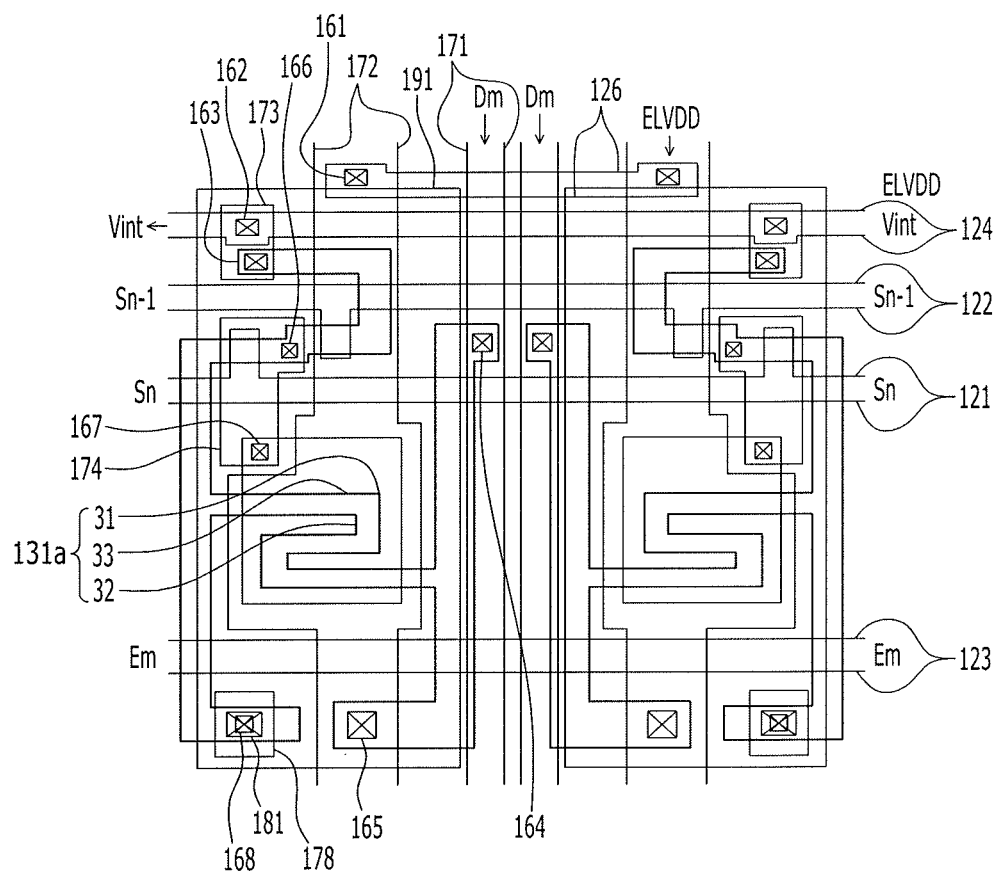
FIGS. 23 to 28 illustrate a layout embodiment of two adjacent pixels.

FIGS. 23 to 28 illustrate layout embodiments of two adjacent pixels in an organic light emitting diode display. Specifically, FIG. 23 illustrates two adjacent pixels as a modified example of the pixel in FIG. 3.

Two data lines 171 connected with the two adjacent pixels are adjacent to each other, and two pixels have a line symmetry structure based on any line (hereinafter, referred to as a symmetrical reference line) positioned between the two adjacent data lines 171.

A pixel (hereinafter, referred to as a first pixel) positioned at the left side of the two pixels illustrated in FIG. 23 has the same structure as FIG. 3, but there is a difference in that the first driving voltage line 126 is extended only in one direction based on the second driving voltage line 172. A pixel (a pixel positioned at the right side of FIG. 23, hereinafter, referred to as a second pixel) positioned in the extending direction of the first driving voltage line 126 has symmetry with the first pixel based on the symmetrical reference line.

According to the pixel illustrated in FIG. 23, the driving voltage ELVDD is applied to the second driving voltage line 172 and the first driving voltage line 126, and is commonly applied to two pixel columns including the two adjacent pixels (the first pixel and the second pixel). In FIG. 3, because of the structure in which the first driving voltage line 126 is connected with all of the adjacent pixels, there is a difference in that the driving voltage ELVDD is commonly applied to all of the pixels positioned in one row. In the exemplary embodiment of FIG. 23, a line connecting the second driving voltage line 172 is additionally positioned at the outside of the display area so as to commonly apply the driving voltage ELVDD to the adjacent second driving voltage lines 172.

Figure 24:
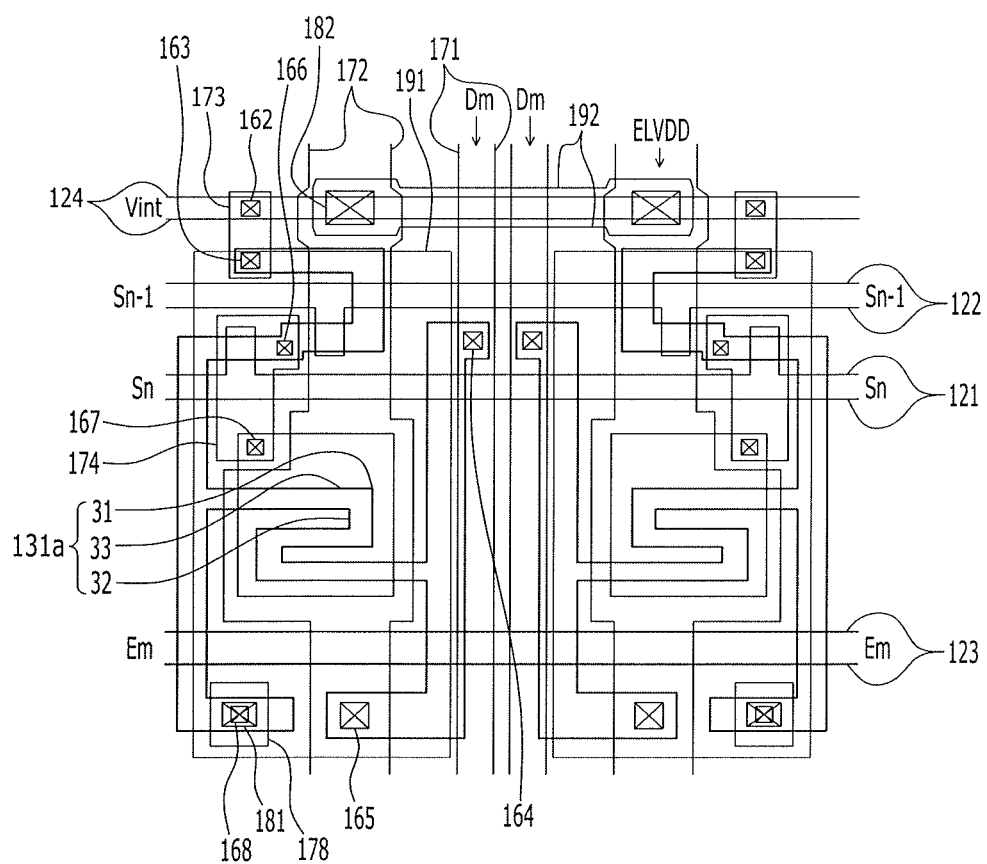

The exemplary embodiment in FIG. 24 includes two adjacent pixels as a modified example of the pixel of the organic light emitting diode display illustrated in FIG. 12. Even in FIG. 24, like FIG. 23, two data lines 171 connected with the two adjacent pixels are adjacent to each other, and two pixels have a line symmetry structure based on any line (hereinafter, referred to as a symmetrical reference line) positioned between the two adjacent data lines 171.

A pixel (hereinafter, referred to as a first pixel) positioned at the left side of the two pixels illustrated in FIG. 24 has the same structure as FIG. 12, but there is a difference in that the first driving voltage line 192 is extended only in one direction based on the second driving voltage line 172. A pixel (a pixel positioned at the right side of FIG. 24, hereinafter, referred to as a second pixel) positioned in the extending direction of the first driving voltage line 192 has symmetry with the first pixel based on the symmetrical reference line.

According to the pixel illustrated in FIG. 24, the driving voltage ELVDD is applied to the second driving voltage line 172 and the first driving voltage line 192, and is commonly applied to two pixel columns including the two adjacent pixels (the first pixel and the second pixel). In FIG. 12, because of the structure in which the first driving voltage line 192 is connected with all of the adjacent pixels, there is a difference in that the driving voltage ELVDD is commonly applied to all of the pixels positioned in one row. In the exemplary embodiment of FIG. 24, a line connecting the second driving voltage line 172 is additionally positioned at the outside of the display area so as to commonly apply the driving voltage ELVDD to the adjacent second driving voltage lines 172.

In the exemplary embodiment of FIG. 24, unlike the exemplary embodiment of FIG. 23, the first driving voltage line 192 is formed of the same material as the pixel electrode 191.

Figure 25:
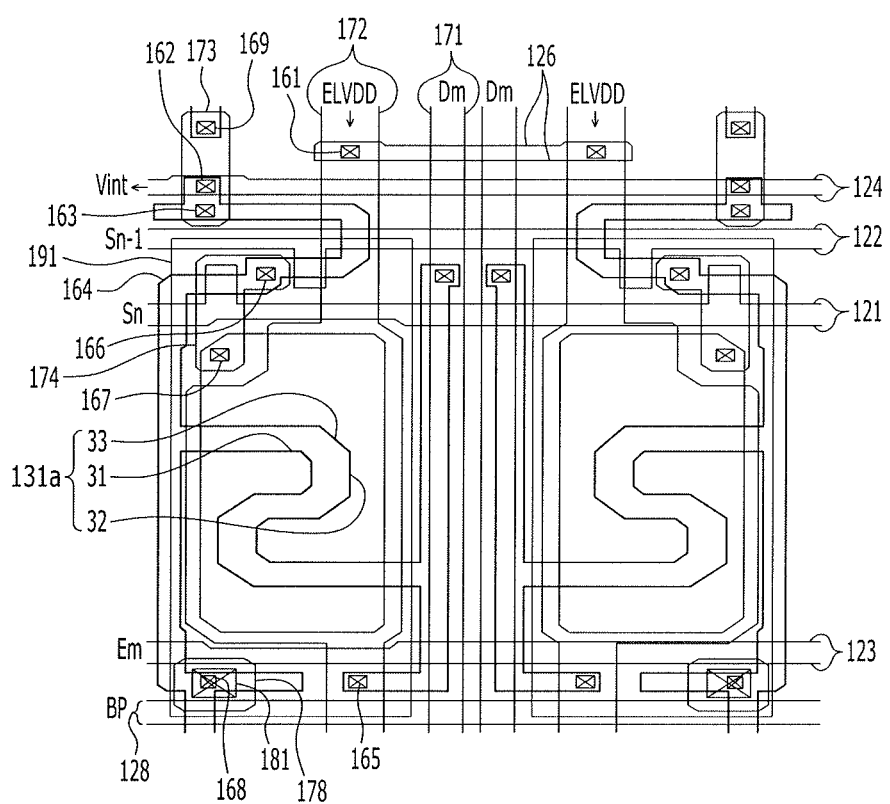

FIG. 25 illustrates an additional embodiment of two adjacent pixels as a modified example of the pixel in FIG. 17. Two data lines 171 connected with the two adjacent pixels are adjacent to each other, and the two pixels have a line symmetry structure based on any line (hereinafter, referred to as a symmetrical reference line) positioned between the two adjacent data lines 171.

A pixel (hereinafter, referred to as a first pixel) positioned at the left side of the two pixels illustrated in FIG. 25 has the same structure as FIG. 17, but there is a difference in that the first driving voltage line 126 is extended only in one direction based on the second driving voltage line 172. A pixel (a pixel positioned at the right side of FIG. 25, hereinafter, referred to as a second pixel) positioned in the extending direction of the first driving voltage line 126 has symmetry with the first pixel based on the symmetrical reference line.

According to the pixel illustrated in FIG. 25, the driving voltage ELVDD is applied to the second driving voltage line 172 and the first driving voltage line 126, and is commonly applied to two pixel columns including the two adjacent pixels (the first pixel and the second pixel). In FIG. 17, because of the structure in which the first driving voltage line 126 is connected with all of the adjacent pixels, there is a difference in that the driving voltage ELVDD is commonly applied to all of the pixels positioned in one row. In the exemplary embodiment of FIG. 25, a line connecting the second driving voltage line 172 is additionally positioned at the outside of the display area so as to commonly apply the driving voltage ELVDD to the adjacent second driving voltage lines 172.

Figure 26:
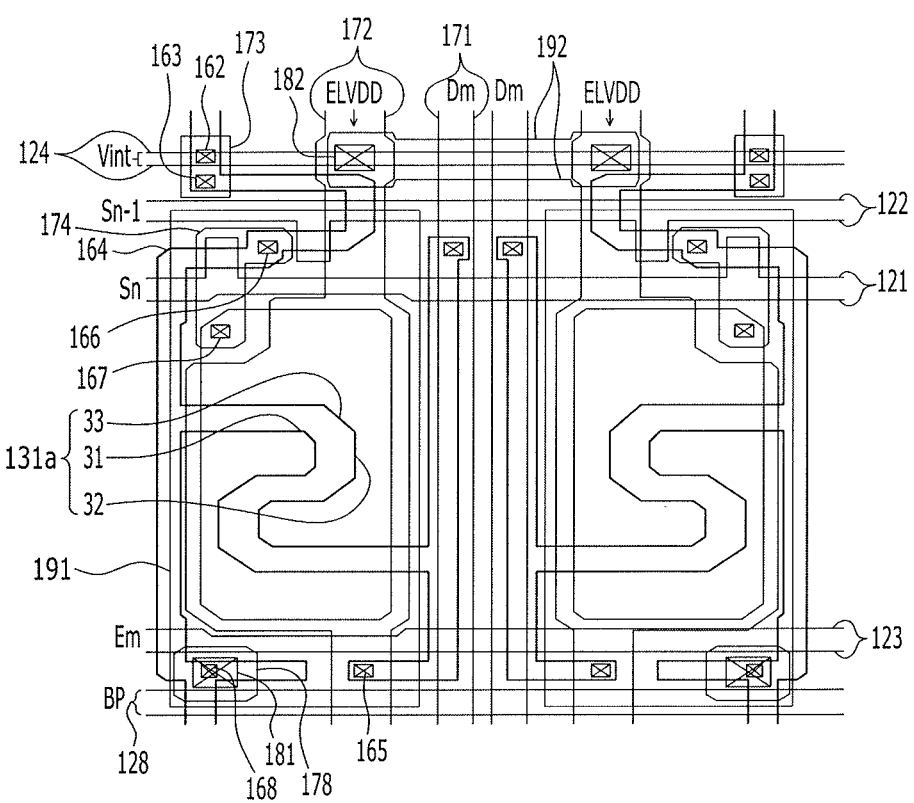

FIG. 26 illustrates another embodiment of two adjacent pixels as a modified example of the organic light emitting diode display in FIG. 20. Even in FIG. 26, like FIG. 25, two data lines 171 connected with the two adjacent pixels are adjacent to each other, and the two pixels have a line symmetry structure based on any line (hereinafter, referred to as a symmetrical reference line) positioned between the two adjacent data lines 171.

A pixel (hereinafter, referred to as a first pixel) positioned at the left side of the two pixels illustrated in FIG. 26 has the same structure as FIG. 20, but there is a difference in that the first driving voltage line 192 is extended only in one direction based on the second driving voltage line 172. A pixel (a pixel positioned at the right side of FIG. 26, hereinafter, referred to as a second pixel) positioned in the extending direction of the first driving voltage line 192 has symmetry with the first pixel based on the symmetrical reference line.

According to the pixel illustrated in FIG. 26, the driving voltage ELVDD is applied to the second driving voltage line 172 and the first driving voltage line 192, and is commonly applied to two pixel columns including the two adjacent pixels (the first pixel and the second pixel). In FIG. 20, because of the structure in which the first driving voltage line 192 is connected with all of the adjacent pixels, there is a difference in that the driving voltage ELVDD is commonly applied to all of the pixels positioned in one row. In the exemplary embodiment of FIG. 26, a line connecting the second driving voltage line 172 is additionally positioned at the outside of the display area so as to commonly apply the driving voltage ELVDD to the adjacent second driving voltage lines 172.

In the exemplary embodiment of FIG. 26, unlike the exemplary embodiment of FIG. 25, the first driving voltage line 192 is formed of the same material as the pixel electrode 191.

Figure 27:
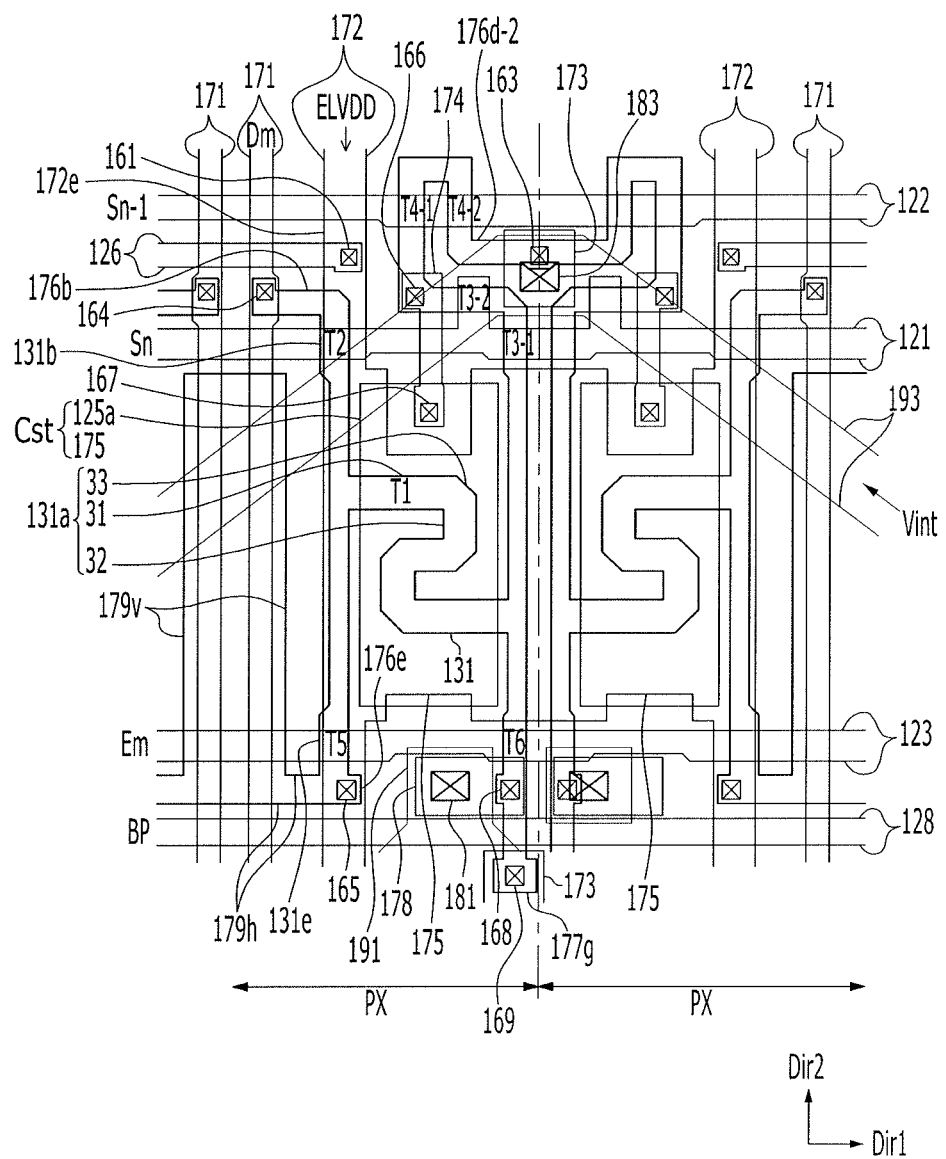
Figure 28:
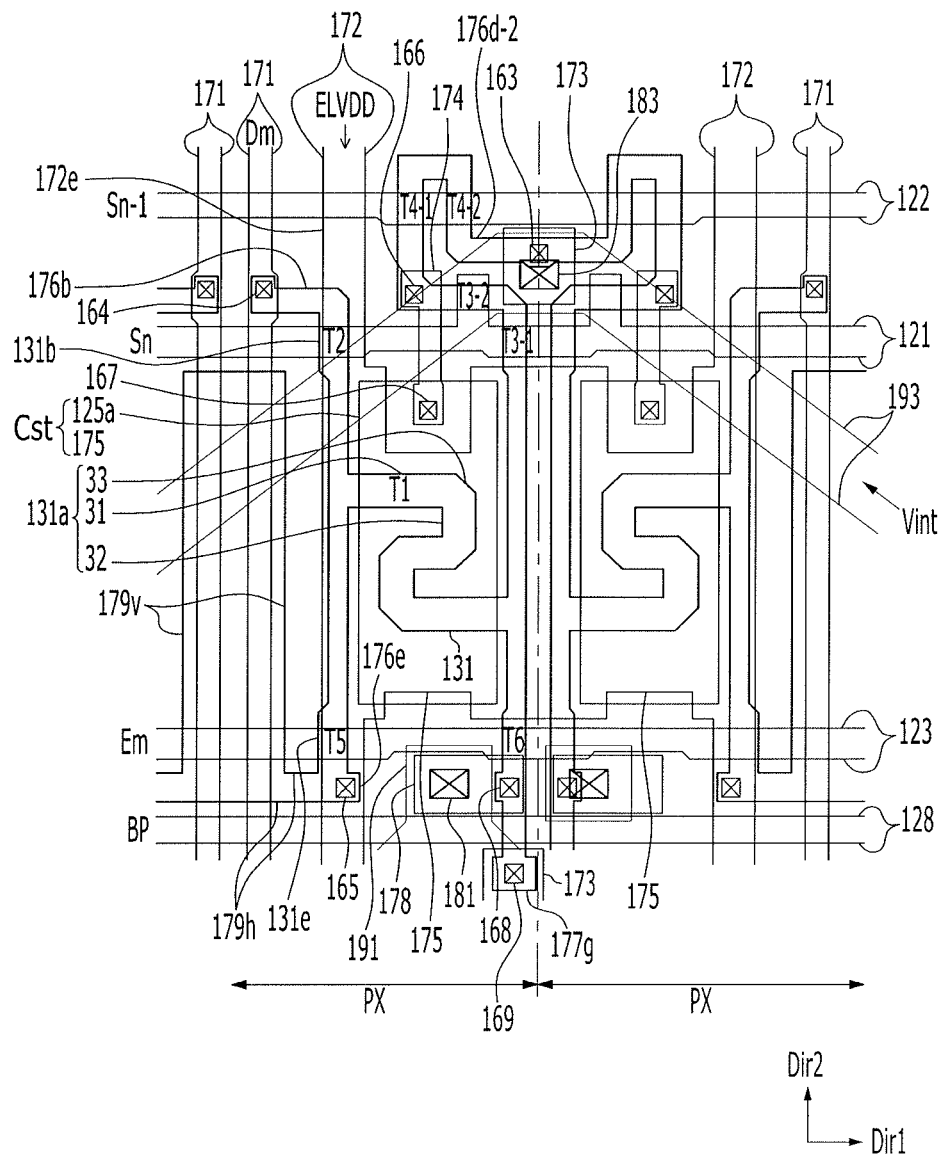

FIG. 27 and FIG. 28 respectively illustrate two pixels PX that are adjacent to each other according to an exemplary variation of the pixel of the organic light emitting diode display shown in FIG. 3. Specifically, unlike the two adjacent pixels PX shown in FIG. 23, FIG. 27 and FIG. 28 illustrate two adjacent pixels PX located between two separated data lines 171.

Each of the pixels in FIG. 27 and FIG. 28 has the same structure of the organic light emitting diode display shown in FIG. 15. The two adjacent pixels PX have an axis-symmetric structure with respect to a line (referred to as a symmetric reference line) between the two pixels PX.

A pixel of an organic light emitting diode display according to the present exemplary embodiment includes a scan line 121, a previous scan line 122, an emission control line 123, and a bypass control line 128 respectively receiving a scan signal Sn, a previous scan signal S(n−1), an emission control signal Em, and a bypass signal BP formed along a first direction Dir1, which is a horizontal direction in a plane view of FIG. 27 and FIG. 28. A data line 171 crossing the scan line 121, the previous scan line 122, the emission control line 123, and the bypass control line 128 and applies a data signal Dm to a pixel.

In the organic light emitting diode display according to the present exemplary embodiment, the initialization voltage line 124 of the previous exemplary embodiment is omitted, and an initialization voltage line 193 having a structure that is different from that of the above-described initialization voltage line 124 is further included. The initialization voltage line 193 is provided in the same layer as the pixel electrode 191 of the previously described exemplary embodiments, and is separated from the pixel electrode 191. The initialization voltage line 193, for example, may substantially extend in the first direction Dir1 and may be periodically bent.

The organic light emitting diode display according to the present exemplary embodiment also includes driving voltage lines 126/172/179*h* applying a driving voltage ELVDD. The driving voltage lines 126/172/179*h* include a first driving voltage line 126, a second driving voltage line 172, and a third driving voltage line 179*h*.

The first driving voltage line 126 is substantially parallel with the scan line 121. As shown in FIG. 27 and FIG. 28, the first driving voltage line 126 may connect two adjacent second driving voltage lines 172 to each other. In one embodiment, the first driving voltage line 126 may be extended in a horizontal direction throughout a plurality of pixels.

The third driving voltage line 179*h* extends in the first direction Dir1 and may electrically connect two adjacent second driving voltage lines 172. The first driving voltage line 126 and the second driving voltage line 172 are electrically connected with each other. The third driving voltage line 179*h* is electrically connected with the second driving voltage line 172 through a fifth contact hole 165 of the interlayer insulating layer 160.

The third driving voltage line 179*h* may further include an expanded portion 179*v* expanded or protruded in a second direction Dir2. The expanded portion 179*v* is substantially provided between two neighboring pixels PX and overlaps at least one of two neighboring data lines 171, interposing an insulating layer therebetween, and may extend along the data line 171. FIG. 27 and FIG. 28 exemplarily illustrate that the expanded portion 179*h* of the third driving voltage line 179*h* overlaps all of the two adjacent data lines 171. The expanded portion 179*v* extends along the second direction Dir2 in a plane view and thus crosses the emission control line 123, and may reach close to a portion where the source electrode 176*b* of the switching thin film transistor T2 is located.

The expanded portion 179*v* may further include at least one cut-out located in a portion, except for the portion overlapping the data line 171. For example, the expanded portion 179*v* may include a cut-out provided between two adjacent data lines 171.

When the expanded portion 179*v* having conductivity overlaps the data line 171, the data line 171 is shielded and thus a voltage of an electric element such as the pixel electrode 191, the driving thin film transistor T1, and the like in the periphery area may be prevented from being influenced due to signal variation of the data signal Dm transmitted by the data line 171.

In a cross-sectional view, the second driving voltage line 172 may be provided in a layer that is different from a layer where the first driving voltage line 126 is located and a layer where the third driving voltage line 179*h* is located. The second driving voltage line 172 and the first driving voltage line 126 may be provided in the same layer as in the exemplary embodiments illustrated in FIG. 3 to FIG. 5, FIG. 17 to FIG. 19, or FIG. 23. Although the first driving voltage line 126 and the third driving voltage line 179*h* are respectively located in different layers, the third driving voltage line 179*h* may be provided in the same layer as the semiconductors 131 of the above-described exemplary embodiments.

One of the first driving voltage line 126 and the third driving voltage line 179*h* connecting two neighboring second driving voltage lines 172 may be omitted. FIG. 28 illustrates an exemplary embodiment in which a first driving voltage line 126 is omitted and the third driving voltage line 179*h* connects the second driving voltage lines 172 with each other in a first direction Dir1.

Referring to FIG. 27 and FIG. 28, together with FIG. 15, one pixel PX includes a driving thin film transistor T1, a switching thin film transistor T2, compensation thin film transistors T3-1 and T3-2, initialization thin film transistors T4-1 and T4-2, an operation control thin film transistor T5, an emission control thin film transistor T6, a bypass thin film transistor T7, a storage capacitor Cst, and an organic light emitting diode. The structure of the thin film transistors according to the present exemplary embodiment may be the same as or similar to the previously described exemplary embodiments (e.g., the exemplary embodiment shown in FIG. 17).

A semiconductor 131 in a pixel PX includes a pair of vertical portions that face each other, interposing a semiconductor 131*a* of the driving thin film transistor T1 therebetween. The semiconductor 131*a* of the driving thin film transistor T1 overlaps a gate electrode 125*a*. The semiconductor 131*a* may include, for example, a first extension 31, a second extension 32, and a bent portion 33.

Most of the left vertical portion of the semiconductor 131 located in the left-side pixel in FIG. 27 and FIG. 28 do not overlap the data line 171, and mostly extends in the second direction Dir2. Further, most of the left vertical portion of the semiconductor 131 overlaps the second driving voltage line 172.

A source electrode 176*b* of the switching thin film transistor T2, connected with an upper portion of a semiconductor 131*b* of the switching thin film transistor T2 which overlaps the scan line 121, is bent toward the left and is electrically connected with the data line through a fourth contact hole 164 of the interlayer insulating layer 160.

A source electrode 176*e* of the operation control thin film transistor T5 is provided below a semiconductor 131*e* of the operation control thin film transistor T5 overlapping the emission control line 123. The source electrode 176*e* is electrically connected with the second driving voltage line 172 through a fifth contact hole 165 of the interlayer insulating layer.

The source electrode 176*e* of the operation control thin film transistor T5 is directly connected with the third driving voltage line 197*h* in the same layer. For example, the third driving voltage line 179*h* is electrically connected with the second driving voltage line 172 through the fifth contact hole 165 of the interlayer insulating layer 160.

Semiconductors of the compensation thin film transistors T3-1 and T3-2 overlapping the scan line 121 and semiconductors of the initialization thin film transistors T4-1 and T4-2 overlapping the previous scan line 122 are sequentially formed along an extension direction of the semiconductor 131 at an upper side of the right vertical portion of the semiconductor 131 located in the left side pixel PX shown in FIG. 27.

A semiconductor of the emission control thin film transistor T6 overlapping the emission control line 123 and a semiconductor of the bypass thin film transistor T7 overlapping the bypass control line 128 are sequentially provided along the extension direction of the semiconductor 131 at a lower side of the right vertical portion of the semiconductor 131 located in the left side pixel PX shown in FIG. 27.

Source electrodes 176*d*-2 of the second initialization thin film transistors T4-2 of two adjacent pixels PX are connected with each other in the same layer. A first connection part 173 overlapping a boundary between the two adjacent pixels PX are electrically connected with the source electrodes 176d-2 of the second initialization thin film transistors T4-2 through a third contact hole 163 of the interlayer insulating layer. The first connection part 173 is connected with the initialization voltage line 193 through a third upper contact hole 183 of a planarization layer layered on the first connection part 173 and transmits the initialization voltage Vint to the source electrodes 176d-2.

A drain electrode 177g of the bypass thin film transistor T7 is connected with the first connection part 173 through a ninth contact hole 169 of the interlayer insulating layer and thus may receive the initialization voltage Vint.

The second driving voltage line 172 includes a first portion 172e that does not overlap the gate electrode 125a of the driving thin film transistor T1 and an expanded region 175 including a part connected with the first portion 172e and overlapping the gate electrode 125a of the driving thin film transistor T1. The second driving voltage line 172 extended throughout the plurality of pixels PX arranged in the second direction Dir2 may include the first portions 172e and the expanded regions 175 that are alternately arranged in the second direction Dir2.

In the left side pixel PX illustrated in FIG. 27 and FIG. 2, the right edge of the second driving voltage line 172 is bent to the right side at an interface between the first portion 172e and the expanded region 175. Accordingly, the right side of the expanded region 175 overlaps the gate electrode 125a. A left edge of the second driving voltage line 172 may be straight or may be bent at the interface between the first portion 172e and the expanded region 175. For example, the width of the expanded region 175 in the first direction Dir1 is greater than the width of the first portion 172e in the first direction Dir1 so as to assure an overlap area of the second driving voltage line 172 and the gate electrode 125a of the driving thin film transistor T1.

Referring to FIG. 27 and FIG. 28, the expanded regions 175 in the two neighboring pixels RX are connected with each other in the same layer. Thus, two adjacent second driving voltage lines 172 may be connected with each other through the first driving voltage line 126 or the third driving voltage line 179h, or may be connected through the expanded regions 175 that are connected with each other between the two adjacent pixels PX. Therefore, the plurality of second driving voltage lines 172 may be connected to each other throughout the plurality of pixels in the first direction Dir1.

Two adjacent second driving voltage lines 172 may be connected with each other through the expanded regions 175 that are connected with each other even in a part where the first driving voltage line 126 or the third driving voltage line 179h is not formed between the two adjacent pixels PX. Accordingly, a uniform driving voltage ELVDD may be transmitted to the entire pixels PX arranged along the first and second directions Dir1 and Dir2.

The expanded region 175 and the gate electrode 125a of the driving thin film transistor T1 form the storage capacitor Cst, with the interlayer insulating layer 160 therebetween. Since the expanded region 175 has a wide width that overlaps the gate electrode 125a, the storage capacitor Cst may have sufficient capacitance compared to the case where the expanded region 175 is not included. The effect of the sufficient capacitance may be, for example, the same as previously described.

According to the present exemplary embodiment, only one type of interlayer insulating layer 160 may be provided between the expanded region 175 of the second driving voltage line 172 and the gate electrode 125a of the driving thin film transistor T1. Also, no additional conductive layer may be provided between a layer where the expanded region 175 is located and a layer where the gate electrode 125a of the driving thin film transistor T1 is located.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
   a substrate;
   a semiconductor layer on the substrate, the semiconductor layer comprising a first semiconductor portion;
   a first insulating layer on the semiconductor layer;
   a first gate electrode on the first insulating layer and overlapping the first semiconductor portion;
   a scan line disposed on the first insulating layer and extending in a first direction;
   a second insulating layer on the first gate electrode and the scan line;
   a data line on the second insulating layer; and
   a first driving voltage line on the second insulating layer, wherein
   the first driving voltage line includes a first portion extending in a second direction crossing the first direction, and a second portion expanding from the first portion in the first direction, and
   the first portion overlaps the scan line, and the second portion overlaps the first gate electrode in a plan view to form a storage capacitor.

2. The display device as claimed in claim 1, wherein the first portion and the second portion are in a same layer as each other.

3. The display device as claimed in claim 1, wherein the first semiconductor portion has one or more bent portions in the plan view.

4. The display device as claimed in claim 1, further comprising:
   a second driving voltage line in a different layer from the first driving voltage line and electrically connected to the first driving voltage line,
   wherein the second driving voltage line includes a portion substantially extending in the first direction.

5. The display device as claimed in claim 4, wherein the second driving voltage line is in a different layer from the data line.

6. The display device as claimed in claim 4, wherein the second driving voltage line electrically connects two or more adjacent ones of the first driving voltage line to each other.

7. The display device as claimed in claim 6, wherein the second driving voltage line is in a same layer as the first gate electrode and includes a same material as the first gate electrode.

8. The display device as claimed in claim 1, wherein
   the first gate electrode has a portion not overlapping the second portion of the first driving voltage line, and the second insulating layer includes a contact hole on the portion of the first gate electrode not overlapping the second portion.

9. The display device as claimed in claim 8, further comprising:
a connector electrically connected to the first gate electrode through the contact hole,
wherein the connector is in a same layer as the first driving voltage line.

10. The display device as claimed in claim 8, wherein the first gate electrode has a first side, a second side, and a third side connected to each other, the second side extending in the first direction, and the first side and the third side extending in the second direction, and
the second portion overlaps the first side and the third side, and does not overlap a middle portion of the second side.

11. The display device as claimed in claim 1, wherein the data line is in a same layer as the first driving voltage line.

12. The display device as claimed in claim 1, wherein the scan line is in a same layer as the first gate electrode.

13. The display device as claimed in claim 1, wherein the semiconductor layer further comprises a vertical semiconductor extending in the second direction, the vertical semiconductor not overlapping the first gate electrode in the plan view, and
the second portion overlaps a gap between the first gate electrode and the vertical semiconductor.

14. The display device as claimed in claim 1, wherein only the second insulating layer is between the second portion of the first driving voltage line and the first gate electrode.

15. The display device as claimed in claim 1, wherein any other conductive layer is not between the second portion of the first driving voltage line and the first gate electrode.

16. The display device as claimed in claim 1, wherein
the semiconductor layer further comprises a second semiconductor portion, and
the scan line comprises a second gate electrode overlapping the second semiconductor portion.

17. The display device as claimed in claim 16, further comprising:
a driving thin film transistor including the first semiconductor portion, the first gate electrode, a first source electrode, and a first drain electrode;
a switching thin film transistor including the second semiconductor portion, the second gate electrode, a second source electrode connected to the data line, and a second drain electrode connected to the first source electrode; and
an organic light emitting diode electrically connected to the first drain electrode of the driving thin film transistor.

18. The display device as claimed in claim 17, further comprising:
a third insulating layer on the second insulating layer, the data line, and the first driving voltage line,
wherein the organic light emitting diode includes:
a pixel electrode on the third insulating layer;
an organic emission layer on the pixel electrode; and
a common electrode on the organic emission layer.

* * * * *